US012738214B2

(12) United States Patent
Liu et al.

(10) Patent No.: US 12,738,214 B2
(45) **Date of Patent: *Sep. 15, 2026**

(54) DISPLAY SUBSTRATE, PREPARATION METHOD THEREOF, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Changchang Liu, Beijing (CN); Zhu Wang, Beijing (CN); Hui Lu, Beijing (CN); Dan Guo, Beijing (CN); Yanyang Shang, Beijing (CN); Zhenglong Yan, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 19/031,266

(22) Filed: Jan. 17, 2025

(65) Prior Publication Data

US 2025/0174188 A1 May 29, 2025

Related U.S. Application Data

(63) Continuation of application No. 18/016,870, filed as application No. PCT/CN2022/077314 on Feb. 22, 2022, now Pat. No. 12,223,891.

(51) Int. Cl.
*G09G 3/3225* (2016.01)
*H10K 59/12* (2023.01)
(Continued)

(52) U.S. Cl.
CPC ....... *G09G 3/3225* (2013.01); *H10K 59/1201* (2023.02); *H10K 59/131* (2023.02);
(Continued)

(58) Field of Classification Search
CPC ......... G09G 3/3225; G09G 2300/0408; G09G 2300/0426; G09G 2310/08;
(Continued)

(56) References Cited

U.S. PATENT DOCUMENTS 12,223,891 B2 * 2/2025 Liu .................... H10K 59/1201
2021/0193022 A1 * 6/2021 Xuan .................. G09G 3/3233
2022/0358879 A1 * 11/2022 Wang .................. G09G 3/3233

FOREIGN PATENT DOCUMENTS

CN 113964142 A * 1/2022 ............ H10D 86/60

* cited by examiner

*Primary Examiner* — Temesghen Ghebretinsae
*Assistant Examiner* — Ivelisse Martinez Quiles

(57) ABSTRACT

A display substrate includes a display region and a bonding region located on one side of the display region, the display region at least includes a first wiring region and a second wiring region, the first wiring region is provided with at least one first wiring and at least one light emitting device, the second wiring region is provided with at least one second wiring and at least one light emitting device, and the at least one light emitting device in the first region and the at least one light emitting device in the second region both include an anode; the at least one first wiring and the at least one second wiring are arranged on a same layer; the display substrate comprises a pixel drive circuit which is a Low Temperature Polycrystalline Oxide (LTPO) circuit.

20 Claims, 26 Drawing Sheets

(51) Int. Cl.
*H10K 59/131* (2023.01)
*H10K 71/60* (2023.01)

(52) U.S. Cl.
CPC ..... *H10K 71/60* (2023.02); *G09G 2300/0408* (2013.01); *G09G 2300/0426* (2013.01); *G09G 2310/08* (2013.01); *G09G 2320/0233* (2013.01)

(58) Field of Classification Search
CPC ....... G09G 2320/0233; H10K 59/1201; H10K 59/131; H10K 71/60; H10K 59/1315
See application file for complete search history.

80
82
72-2
72
72-1
82
80
73
73
72-2
72
72-1
80

DISPLAY SUBSTRATE, PREPARATION METHOD THEREOF, AND DISPLAY APPARATUS

CROSS-REFERENCE TO RELATED APPLICATIONS

This application is a continuation of U.S. patent application Ser. No. 18/016,870 filed on Jan. 19, 2023, which is a U.S. National Phase Application under 35 U.S.C. § 371 of International Application No. PCT/CN2022/077314 filed on Feb. 22, 2022 and entitled "Display Substrate, Preparation Method Thereof, and Display Apparatus". The above-identified applications are incorporated herein by reference in their entireties.

TECHNICAL FIELD

The present disclosure relates to, but is not limited to, the field of display technologies, and particularly to a display substrate, a preparation method for the display substrate, and a display apparatus.

BACKGROUND

An Organic Light Emitting Diode (OLED for short) and a Quantum-dot Light Emitting Diode (QLED for short) are active light emitting display apparatuses and have advantages such as self-luminescence, a wide viewing angle, a high contrast ratio, low power consumption, extremely high response speed, lightness and thinness, flexibility, and low costs. With constant development of display technologies, a flexible display apparatus that uses an OLED or a QLED as a light emitting device and performs signal control by a Thin Film Transistor (TFT for short) has become a mainstream product in the field of display at present.

SUMMARY

The following is a summary of subject matters described herein in detail. The summary is not intended to limit the protection scope of claims.

In one aspect, the present disclosure provides a display substrate, which includes a display region and a bonding region located on one side of the display region, the display region at least includes a first wiring region and a second wiring region, wherein the first wiring region is provided with at least one first wiring and at least one light emitting device, the second wiring region is provided with at least one second wiring and at least one light emitting device, and the light emitting device at least includes an anode; a first terminal of the first wiring is connected with a bonding lead line of the bonding region, a second terminal of the first wiring is connected with a first terminal of the second wiring after extending along a second direction, and a second terminal of the second wiring is connected with the data signal line of the display region after extending along a first direction, wherein the first direction crosses the second direction; the first wiring region further includes at least one first compensation line extending along the first direction, an orthographic projection of the at least one anode in the plane of the display substrate overlaps at least partially with an orthographic projection of the first compensation line in the plane of the display substrate, and/or, the second wiring region further includes at least one second compensation line extending along the second direction, and an orthographic projection of the at least one anode in the plane of the display substrate overlaps at least partially with an orthographic projection of the second compensation line in the plane of the display substrate.

In an exemplary embodiment, an orthographic projection of at least one anode in the plane of the display substrate at least partially overlaps an orthographic projection of the first wiring in the plane of the display substrate.

In an exemplary embodiment, in the first wiring region, an orthographic projection of at least one anode in the plane of the display substrate overlaps at least partially with an orthographic projection of A1 first wirings in the plane of the display substrate, in the second wiring region, an orthographic projection of at least one anode in the plane of the display substrate overlaps at least partially with an orthographic projection of A2 second compensation lines in the plane of the display substrate, wherein A1=A2.

In an exemplary embodiment, the second wiring region further includes at least one dummy line extending along the first direction and located between adjacent second wirings, an orthographic projection of the at least one anode in the plane of the display substrate overlaps at least partially with an orthographic projection of the dummy line in the plane of the display substrate.

In an exemplary embodiment, in the first wiring region, an orthographic projection of at least one anode in the plane of the display substrate overlaps at least partially with an orthographic projection of B1 first compensation lines in the plane of the display substrate, in the second wiring region, an orthographic projection of at least one anode in the plane of the display substrate overlaps at least partially with an orthographic projection of B2 second dummy lines in the plane of the display substrate, wherein B1=B2.

In an exemplary embodiment, a first terminal of the first compensation line is connected to the first wiring, and a second terminal of the first compensation line extends along the first direction in a direction away from the first wiring.

In an exemplary embodiment, a first terminal of the second compensation line is connected to the dummy line, and a second terminal of the second compensation line extends in the second direction in a direction away from the dummy line.

In an exemplary embodiment, potentials of the first wiring and the second compensation line are different.

In an exemplary embodiment, the second wiring includes a wiring main body part and an adapter part, a first terminal of the wiring main body part is connected to the second terminal of the first wiring, the wiring main body part extends along the first direction, a first terminal of the adapter part is connected to the wiring main body part, and a second terminal of the adapter part is connected to the data signal line through a lead via hole.

In an exemplary embodiment, the adapter part is located between adjacent second compensation lines.

In an exemplary embodiment, an orthographic projection of the at least one anode in the plane of the display substrate does not overlap with an orthographic projection of the lead via hole in the plane of the display substrate.

In an exemplary embodiment, at least one anode is connected to an anode connection electrode through an anode via hole, the anode connection electrode is located on one side of the wiring main body part in the second direction, and the adapter part is located on one side of the wiring main body part in the opposite direction of the second direction.

In an exemplary embodiment, the anode via hole is located on one side of the wiring main body part in the second direction, and the lead via hole is located on one side of the wiring main body part in the opposite direction of the second direction.

In an exemplary embodiment, at least one anode includes an anode body part and an anode connection part connected to each other, the anode connection part is connected to the anode connection electrode through the anode via hole; in the second direction, the second compensation line has an extension length, and the anode body part has an anode extension length that is greater than or equal to 0.5*anode extension length.

In an exemplary embodiment, the display region further includes a first power supply line, and at least one dummy line is connected to the first power supply line through a power supply via hole.

In an exemplary embodiment, an orthographic projection of the at least one anode in the plane of the display substrate does not overlap with an orthographic projection of the power supply via hole in the plane of the display substrate.

In an exemplary embodiment, in a plane perpendicular to the display substrate, the display substrate includes a drive circuit layer disposed on a substrate and an emitting structure layer disposed on one side of the drive circuit layer away from the substrate; the drive circuit layer includes multiple conductive layers, and the data signal lines are disposed in different conductive layers from the first wiring and the second wiring, and the second wiring is connected to the data signal line through a via hole.

In an exemplary embodiment, the first wiring, the second wiring, the first compensation line, and the second compensation line are arranged on the same layer.

In an exemplary embodiment, the multiple conductive layers include at least a first conductive layer, a second conductive layer, a third conductive layer, a fourth conductive layer, a fifth conductive layer, and a sixth conductive layer; the data signal line is disposed in the fifth conductive layer, and the first wiring, the second wiring, the first compensation line and the second compensation line are disposed in the sixth conductive layer.

In an exemplary embodiment, the display substrate further includes a bezel region located on the other side of the display region, the bezel region includes at least a first bezel region, a circuit region, and a second bezel region arranged in sequence in a direction away from the display region; the first bezel region is provided with a first low-voltage power supply line or a high-voltage power supply lead line, the circuit region is provided with a gate drive circuit, the second bezel region is provided with a second low-voltage power supply line, and the first low-voltage power supply line is connected with the second low-voltage power supply line.

In an exemplary embodiment, in a plane perpendicular to the display substrate, the display substrate includes a drive circuit layer disposed on a substrate and an emitting structure layer disposed on a side of the drive circuit layer away from the substrate; the drive circuit layer includes at least a second planarization layer, a first low-voltage power supply line disposed on a side of the second planarization layer away from the substrate, and a third planarization layer disposed on a side of the first low-voltage power supply line away from the substrate, in the first bezel region, the third planarization layer is provided with a first via hole exposing the first low-voltage power supply line; the emitting structure layer at least includes a cathode connection electrode, a pixel define layer and a cathode, the cathode connection electrode is connected with the first low-voltage power supply line through the first via hole, the pixel define layer is provided with a second via hole exposing the cathode connection electrode, and the cathode is connected with the cathode connection electrode through the second via hole.

In an exemplary embodiment, in a plane perpendicular to the display substrate, the display substrate includes a drive circuit layer disposed on a substrate and an emitting structure layer disposed on a side of the drive circuit layer away from the substrate; the drive circuit layer includes at least a second planarization layer, a high-voltage power supply lead line arranged on a side of the second planarization layer away from the substrate, and a third planarization layer arranged on a side of the high-voltage power supply lead line away from the substrate, the high-voltage power supply lead line is connected with a dummy line of the display region; in the second bezel region, the third planarization layer is provided with a first via hole exposing the second low-voltage power supply line; the emitting structure layer at least includes a cathode connection electrode, a pixel define layer and a cathode, the cathode connection electrode is connected with the second low-voltage power supply line through the first via hole, the pixel define layer is provided with a second via hole exposing the cathode connection electrode, and the cathode is connected with the cathode connection electrode through the second via hole.

In another aspect, the present disclosure further provides a display apparatus, including the aforementioned display substrate.

In another aspect, the present disclosure further provides a method for preparing a display substrate, the display substrate includes a display region and a bonding region located on one side of the display region, the display region at least includes a first wiring region and a second wiring region, wherein the first wiring region is provided with at least one first wiring and at least one light emitting device, the second wiring region is provided with at least one second wiring and at least one light emitting device, and the light emitting device at least includes an anode; a first terminal of the first wiring is connected with a bonding lead line of the bonding region, a second terminal of the first wiring is connected with a first terminal of the second wiring after extending along a second direction, and a second terminal of the second wiring is connected with the data signal line of the display region after extending along a first direction, wherein the first direction crosses the second direction; the preparation method includes:

forming at least one first compensation line extending along the first direction in the first wiring region, and/or, forming at least one second compensation line extending along the second direction in the second wiring region; and forming the anode in the first wiring region and the second wiring region, an orthographic projection of at least one anode in the plane of the display substrate at least partially overlaps with an orthographic projection of the first compensation line in the plane of the display substrate, and/or, an orthographic projection of at least one anode in the plane of the display substrate at least partially overlaps with an orthographic projection of the second compensation line in the plane of the display substrate.

Other aspects may be understood upon reading and understanding the drawings and the detailed description.

BRIEF DESCRIPTION OF THE DRAWINGS

The accompanying drawings are used for providing understanding of technical solutions of the present disclosure, and form a part of the specification. They are used for explaining the technical solutions of the present disclosure together with the embodiments of the present disclosure, but do not form a limitation on the technical solutions of the present disclosure.

DETAILED DESCRIPTION

Figure 1:
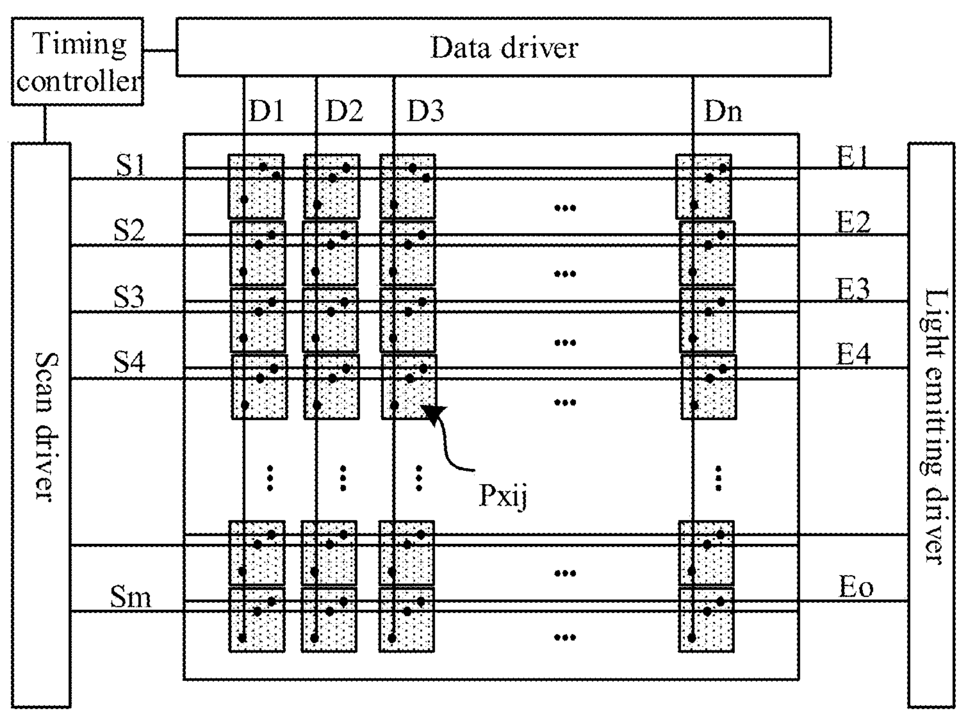
FIG. 1 is a schematic diagram of a structure of a display apparatus.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

Scales of the drawings in the present disclosure may be used as a reference in the actual process, but are not limited thereto. For example, the width-length ratio of the channel, the thickness and spacing of each film layer, and the width and spacing of each signal line may be adjusted according to the actual needs. The number of pixels in the display substrate and the number of sub-pixels in each pixel are not limited to the number shown in the drawings. The drawings described in the present disclosure are schematic structure diagrams only, and one implementation of the present disclosure is not limited to the shapes, numerical values or the like shown in the drawings.

Ordinal numerals such as “first”, “second”, and “third” in the specification are set to avoid confusion of constituent elements, but not to set a limit in quantity.

In the specification, for convenience, wordings indicating orientation or positional relationships, such as “middle”, “upper”, “lower”, “front”, “back”, “vertical”, “horizontal”, “top”, “bottom”, “inside”, and “outside”, are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. For example, a connection may be a fixed connection, or a detachable connection, or an integrated connection. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, a transistor refers to a component which includes at least three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be a drain electrode, and a second electrode may be a source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "thin film" and a "layer" are interchangeable. For example, a "conductive layer" may be replaced with a "conductive thin film" sometimes. Similarly, an "insulation thin film" may be replaced with an "insulation layer" sometimes.

Triangle, rectangle, trapezoid, pentagon and hexagon in this specification are not strictly defined, and they may be approximate triangle, rectangle, trapezoid, pentagon or hexagon, etc. There may be some small deformation caused by tolerance, and there may be guide angle, arc edge and deformation, etc. In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver and a pixel array. The timing controller is connected to the data driver, the scan driver and the light emitting driver, respectively, the data driver is connected to multiple data signal lines (D1 to Dn) respectively, the scan driver is connected to multiple scan signal lines (S1 to Sm) respectively, and the light emitting driver is connected to multiple emitting signal lines (E1 to Eo) respectively. The pixel array may include multiple sub-pixels Pxij, i and j may be natural numbers, at least one sub-pixel Pxij may include a circuit unit and a light emitting device connected to the circuit unit, and the circuit unit may include at least one scan signal line, at least one data signal line, at least one emitting signal line and a pixel drive circuit. In an exemplary embodiment, the timing controller may provide a gray tone value and a control signal, which are suitable for a specification of the data driver, to the data driver, provide a clock signal, a scan start signal, etc., which are suitable for a specification of the scan driver, to the scan driver, and provide a clock signal, a transmit stop signal, etc., which are suitable for a specification of the light emitting driver, to the light emitting driver. The data driver may generate data voltages to be provided to data signal lines D1, D2, D3, . . . , and Dn using the gray scale value and the control signal received from the timing controller. For example, the data driver may sample the gray tone value by using the clock signal and apply a data voltage corresponding to the gray tone value to the data signal lines D1 to Dn by taking a pixel row as a unit, wherein n may be a natural number. The scan driver may generate scan signals to be provided to scan signal lines S1, S2, S3, . . . , and Sm by receiving a clock signal, a scanning start signal, and the like from the timing controller. For example, the scan driver may provide a scan signal with an on-level pulse to the scan signal lines S1 to Sm sequentially. For example, the scan driver may be constructed in a form of a shift register and may generate a scan signal in a manner in which the scan start signal provided in a form of an on-level pulse is transmitted to a next-stage circuit sequentially under the control of the clock signal, wherein m may be a natural number. The emitting driver may generate transmission signals to be provided to emitting lines E1, E2, E3, . . . , and Eo by receiving the clock signal, the transmission stop signal, and the like from the timing controller. For example, the light emitting driver may provide a transmit signal with an off-level pulse to the emitting signal lines E1 to Eo sequentially. For example, the light emitting driver may be constructed in a form of a shift register and may generate a transmit signal in a manner in which the transmit stop signal provided in a form of an off-level pulse is transmitted to a next-stage circuit sequentially under the control of the clock signal, wherein o may be a natural number.

Figure 2:
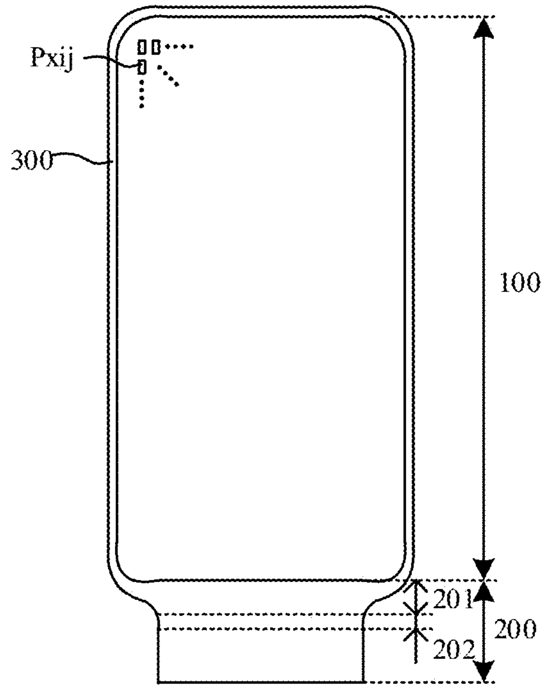
FIG. 2 is a schematic diagram of a structure of a display substrate.

FIG. 2 is a schematic diagram of a structure of a display substrate. As shown in FIG. 2, the display substrate may include a display region 100, a bonding region 200 on a side of the display region 100, and a bezel region 300 on other sides of the display region 100. In an exemplary embodiment, the display region 100 may be a planarization region including multiple sub-pixels Pxij that form a pixel array, the multiple sub-pixels Pxij are configured to display a moving picture or a still image, and the display region 100 may be referred to as an active region (AA). In an exemplary embodiment, the display substrate may be a flexible substrate, and accordingly the display substrate can be deformed, for example, can be crimped, bent, folded, or curled.

Figure 3:
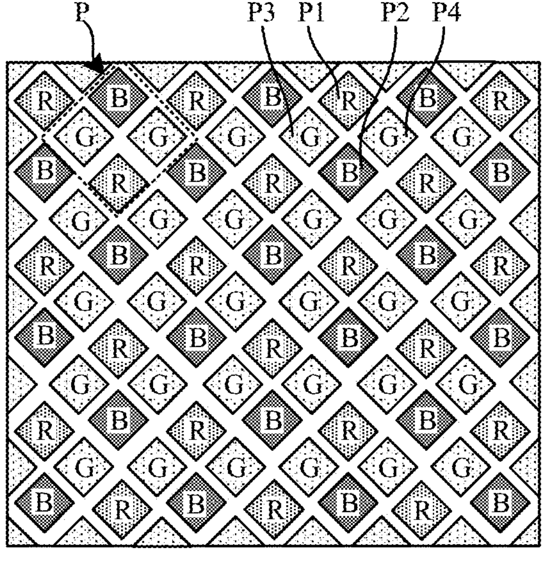
FIG. 3 is a schematic diagram of a planar structure of a display region in a display substrate.

FIG. 3 is a schematic diagram of a planar structure of a display region in a display substrate. As shown in FIG. 3, the display substrate may include multiple pixel units P arranged in a matrix. At least one pixel unit P may include a first sub-pixel P1 emitting light of a first color, a second sub-pixel P2 emitting light of a second color, and a third sub-pixel P3 and a fourth sub-pixel P4 emitting light of a third color. Each sub-pixel may include a circuit unit and a light emitting device, and the circuit unit may include at least a pixel drive circuit. The pixel drive circuits are respectively connected to a scan signal line, a light-emitting control line, and a data signal line, and the pixel drive circuit is configured to receive a data voltage transmitted by the data signal line and output a corresponding current to the light emitting device under the control of the scan signal line and the emitting signal line. The light emitting device in each sub-pixel is connected to a pixel drive circuit of a sub-pixel where the light emitting device is located, and is configured to emit light with a corresponding brightness in response to a current output by the pixel drive circuit of the sub-pixel where the light emitting device is located.

In an exemplary embodiment mode, the first sub-pixel P1 may be a red sub-pixel (R) emitting red light, the second sub-pixel P2 may be a blue sub-pixel (B) emitting blue light, and the third sub-pixel P3 and the fourth sub-pixel P4 may be green sub-pixels (G) emitting green light. In an exemplary embodiment, the shape of the sub-pixels can be rectangular, diamond, pentagonal or hexagonal, and the four sub-pixels can be arranged in a diamond shape to form an RGBG pixel arrangement. In other exemplary embodiments, the four sub-pixels may be arranged side by side horizontally, side by side vertically, or square-shaped manner, which is not limited in the present disclosure.

In an exemplary embodiment, the pixel unit may include three sub-pixels, the three sub-pixels may be arranged in manner of horizontal juxtaposition, vertical juxtaposition or triangle, which is not limited in the present disclosure.

Figure 4:
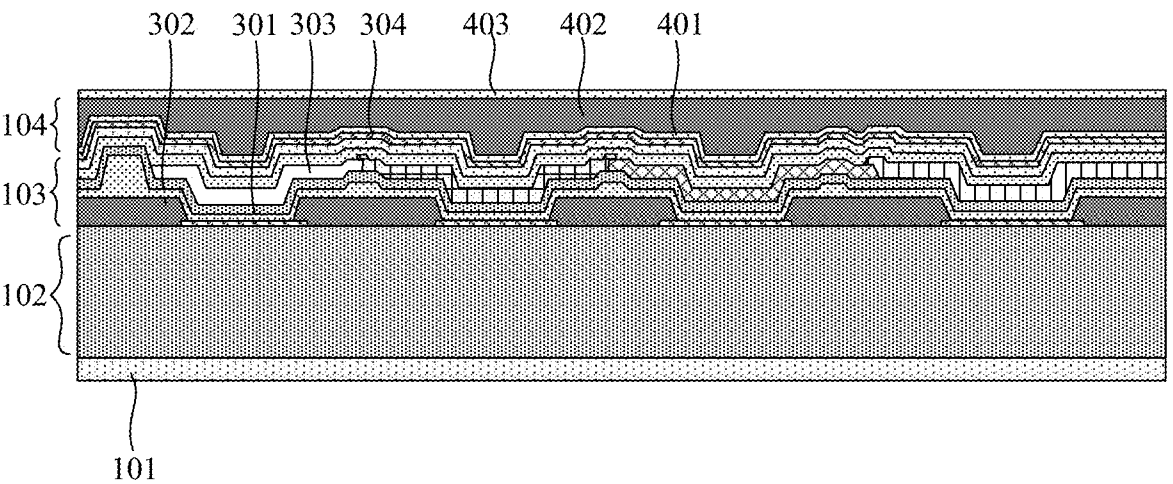
FIG. 4 is a schematic diagram of a sectional structure of a display region in a display substrate.

FIG. 4 is a schematic diagram of a sectional structure of a display region in a display substrate, illustrating a structure of four sub-pixels of the display region. As shown in FIG. 4, in a plane perpendicular to the display substrate, the display substrate may include a drive circuit layer 102 disposed on a substrate 101, an emitting structure layer 103 disposed at one side of the drive circuit layer 102 away from the substrate 101, and an encapsulation structure layer 104 disposed at one side of the emitting structure layer 103 away from the substrate 101. In some possible implementations, the display substrate may include other film layers, such as a touch structure layer, which is not limited here in the present disclosure.

In an exemplary embodiment, the substrate 101 may be a flexible substrate, or a rigid substrate. The drive circuit layer 102 of each sub-pixel may include a pixel drive circuit composed of multiple transistors and storage capacitors. The emitting structure layer 103 of each sub-pixel may include a light emitting device composed of multiple film layers, and the multiple film layers may include at least an anode 301, a pixel define layer 302, an organic emitting layer 303 and a cathode 304. The anode 301 is connected to the pixel drive circuit, the organic emitting layer 303 is connected to the anode 301, the cathode 304 is connected to the organic emitting layer 303, and the organic emitting layer 303 emits light of a corresponding color under driving of the anode 301 and the cathode 304. The encapsulation structure layer 104 may include a first encapsulation layer 401, a second encapsulation layer 402, and a third encapsulation layer 403 which are stacked, wherein the first encapsulation layer 401 and the third encapsulation layer 403 may be made of an inorganic material, the second encapsulation layer 402 may be made of an organic material, and the second encapsulation layer 402 is disposed between the first encapsulation layer 401 and the third encapsulation layer 403, forming an inorganic material/organic material/inorganic material stack structure, thus ensuring that external water vapor cannot enter the emitting structure layer 103.

In an exemplary embodiment, the organic emitting layer may include an emitting layer (EML), and any one or more of following layers: a hole injection layer (HIL), a hole transport layer (HTL), an electron block layer (EBL), a hole block layer (HBL), an electron transport layer (ETL), and an electron injection layer (EIL). In an exemplary embodiment, one or more layers of the hole injection layer, the hole transport layer, the electron block layer, the hole block layer, the electron transport layer and the electron injection layer of all sub-pixels may be a common layer connected together. The emitting layers of adjacent sub-pixels may have a small amount of overlap, or may be isolated from each other.

Figure 5:
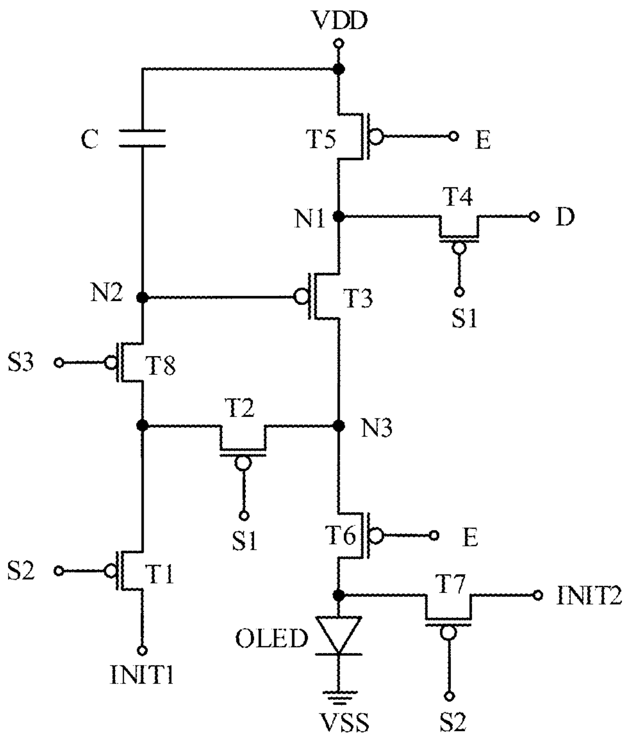
FIG. 5 is a schematic diagram of an equivalent circuit of a pixel drive circuit.

FIG. 5 is a schematic diagram of an equivalent circuit of a pixel drive circuit. In an exemplary embodiment, the pixel drive circuit may have a structure of 3T1C, 4T1C, 5T1C, 5T2C, 6T1C, 7T1C or 8T1C. As shown in FIG. 5, the pixel drive circuit may include eight transistors (a first transistor T1 to an eighth transistor T8), one storage capacitor C, and the pixel drive circuit is respectively connected with eight signal lines (a data signal line D, a first scan signal line S1, a first scan signal line S2, an emitting signal line E, a first initial signal line INIT1, a second initial signal line INIT1, a first power supply line VDD, and a second power supply line VSS).

In an exemplary embodiment, the pixel drive circuit may include a first node N1, a second node N2, and a third node N3. Herein, the first node N1 is respectively connected with a first electrode of the third transistor T3, a second electrode of the fourth transistor T4, and a second electrode of the fifth transistor T5, the second node N2 is respectively connected with a second electrode of the eighth transistor T8, a control electrode of the third transistor T3, and a second terminal of the storage capacitor C, and the third node N3 is respectively connected with a second electrode of the second transistor T2, a second electrode of the third transistor T3, and a first electrode of the sixth transistor T6.

In an exemplary embodiment, a first terminal of the storage capacitor C is connected with the first power supply line VDD, and a second terminal of the storage capacitor C is connected with the second node N2, i.e., the second terminal of the storage capacitor C is connected with the control electrode of the third transistor T3.

In an exemplary embodiment, a control electrode of the first transistor T1 is connected to the second scan signal line S2, a first electrode of the first transistor T1 is connected to the first initial signal line INIT1, and a second electrode of the first transistor T1 is connected to a first electrode of the eighth transistor T8. A control electrode of the eighth transistor T8 is connected to the third scan signal line S3, the first electrode of the eighth transistor T8 is connected to the second electrode of the first transistor T1, and a second electrode of the eighth transistor T8 is connected to the second node N2. When an on-level scan signal is applied to the second scan signal line S2 and the third scan signal line S3, the first transistor T1 and the eighth transistor T8 transmit a first initialization voltage to the second terminal of the storage capacitor C, thereby achieving initialization of the storage capacitor C.

In an exemplary embodiment, the control electrode of the second transistor T2 is connected to the first scan signal line S1, the first electrode of the second transistor T2 is connected to the first electrode of the eighth transistor T8, and the second electrode of the second transistor T2 is connected to the third node N3. When an on-level scan signal is applied to the first scan signal line S1, the second transistor T2 enables the control electrode of the third transistor T3 to be connected with a second electrode of the third transistor T3.

In an exemplary embodiment, the control electrode of the third transistor T3 is connected with the second node N2, that is, the control electrode of the third transistor T3 is connected with the second terminal of the storage capacitor C, a first electrode of the third transistor T3 is connected with the first node N1, and a second electrode of the third transistor T3 is connected with the third node N3. The third transistor T3 may be referred to as a drive transistor, and the third transistor T3 determines an amount of a drive current flowing between the first power supply line VDD and the light emitting device according to a potential difference between the control electrode and the first electrode of the third transistor T3.

In an exemplary embodiment, a control electrode of the fourth transistor T4 is connected with the first scan signal line S1, a first electrode of the fourth transistor T4 is connected with the data signal line D, and a second electrode of the fourth transistor T4 is connected with the first node N1. When an on-level scan signal is applied to the first scan signal line S1 and the third scan signal line S3, the fourth transistor T4 inputs the data voltage of the data signal line D to the first node N1.

In an exemplary embodiment, a control electrode of the fifth transistor T5 is connected with the emitting signal line E, a first electrode of the fifth transistor T5 is connected with the first power supply line VDD, and a second electrode of the fifth transistor T5 is connected with the first node N1. A control electrode of the sixth transistor T6 is connected with the emitting signal line E, a first electrode of the sixth transistor T6 is connected with the third node N3, and a second electrode of the sixth transistor T6 is connected with a first electrode of a light emitting device. When an on-level emitting signal is applied to the emitting signal line E, the fifth transistor T5 and the sixth transistor T6 enable the light emitting device to emit light by forming a drive current path between the first power supply line VDD and the light emitting device.

In an exemplary embodiment, a control electrode of the seventh transistor T7 is connected with the second scan signal line S2, a first electrode of the seventh transistor T7 is connected with the second initial signal line INIT2, and a second electrode of the seventh transistor T7 is connected with the first electrode of the light emitting device. When an on-level scan signal is applied to the second scan signal line S2, the seventh transistor T7 transmits a second initial voltage to the first electrode of the light emitting device so as to initialize a charge amount accumulated in the first electrode of the light emitting device or release a charge amount accumulated in the first electrode of the light emitting device.

In an exemplary embodiment, the light emitting device may be an OLED including a first electrode (anode), an organic emitting layer, and a second electrode (cathode), which are stacked, or may be a QLED including a first electrode (anode), a quantum dot emitting layer, and a second electrode (cathode), which are stacked.

In an exemplary embodiment, a second electrode of the light emitting device is connected with the second power supply line VSS, a signal of the second power supply line VSS is a low-level signal, and a signal of the first power supply line VDD is a high-level signal continuously provided.

In an exemplary embodiment, the first transistor T1 to the eighth transistor T8 may be P-type transistors or N-type transistors. Use of a same type of transistors in a pixel drive circuit may simplify a process flow, reduce process difficulties of a display panel, and improve a product yield. In some possible implementations, the first transistor T1 to the eighth transistor T8 may include P-type transistors and N-type transistors.

In an exemplary embodiment, the first transistor T1 to the eighth transistor T8 may use low temperature polysilicon transistors, or may use oxide transistors, or may use low temperature polysilicon transistors and metal oxide transistors. The active layer of the low temperature polysilicon transistor is made of low temperature polysilicon (referred to as LTPS), and the active layer of the metal oxide transistor is made of metal oxide semiconductor. The low temperature polysilicon transistor has advantages such as high migration rate and fast charging. The oxide transistor has advantages such as low drain current. The low temperature polysilicon transistor and the metal oxide are integrated on one display substrate to form a Low Temperature Polycrystalline Oxide (LTPO for short) display substrate, so that advantages of the low temperature polysilicon thin film transistor and the oxide thin film transistor can be utilized, low-frequency drive can be achieved, power consumption can be reduced, and display quality can be improved.

Figure 6:
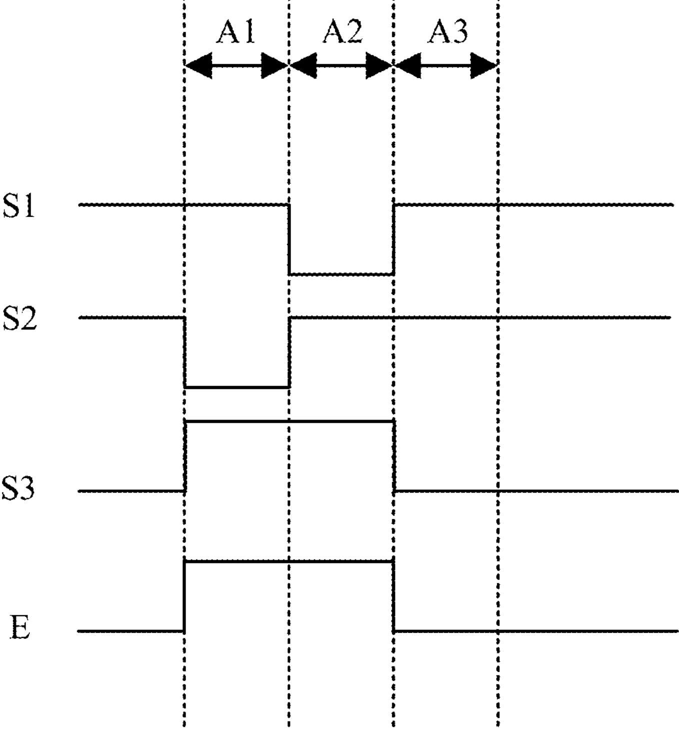
FIG. 6 is a working timing diagram of a pixel drive circuit.

FIG. 6 is a working timing diagram of a pixel drive circuit. The exemplary embodiment of the present disclosure will be described below through the working process of the pixel drive circuit illustrated in FIG. 5. The pixel drive circuit in FIG. 5 includes eight transistors (the first transistor T1 to the eighth transistor T8) and one storage capacitor C, the first transistor T1 to the seventh transistor T7 are all P-type transistors, and the eighth transistor T8 is an N-type transistor. In an exemplary embodiment, taking an OLED as example, the working process of the pixel drive circuit may include the following stages.

In a first stage A1, referred to as a reset stage, a signal of the second scan signal line S2 is a low-level signal, and signals of the first scan signal line S1, the third scan signal line S3 and the emitting signal line E are high-level signals. The signal of the second scan signal line S2 is a low-level signal to turn on the first transistor T1, and the signal of the third scan signal line S3 is a high-level signal to turn on the eighth transistor T8. The signal of the first initial signal line INIT1 is provided to the second node N2 through the first transistor T1 and the eighth transistor T8 to initialize (reset) the storage capacitor C and clear the original charges in the storage capacitor. The signal of the second scan signal line S2 is the low-level signal, so that the seventh transistor T7 is turned on, so that a signal of the second initial signal line INIT2 is provided to a first electrode of the OLED to initialize (reset) the first electrode of the OLED and clear its internal pre-stored voltage, thereby completing initialization and ensuring that the OLED does not emit light. The signals of the first scan signal line S1 and the emitting signal line E are high-level signals, so that the second transistor T2, the fourth transistor T4, the fifth transistor T5, the sixth transistor T6, and the seventh transistor T7 are turned off. An OLED does not emit light in this stage.

In a second stage A2, referred to as a data writing stage or a threshold compensation stage, the signal of the first scan signal line S1 is a low-level signal, signals of the second scan signal line S2, the third scan signal line S3, and the emitting signal line E are high-level signals, and the data signal line D outputs a data voltage. In this stage, a second terminal of the storage capacitor C is at a low level, so the third transistor T3 is turned on. The signal of the first scan signal line S1 is a low-level signal to turn on the second transistor T2, the fourth transistor T4 and the seventh transistor T7, and the signal of the third scan signal line S3 is a high-level signal to turn on the eighth transistor T8. The second transistor T2, the fourth transistor T4, and the eighth transistor T8 are turned on, so that the data voltage output by the data signal line D is provided to the second node N2 through the first node N1, the turned-on third transistor T3, the third node N3, the turned-on second transistor T2, and the turned-on eighth transistor T8, and the storage capacitor C is charged with a difference between the data voltage output by the data signal line D and a threshold voltage of the third transistor T3. A voltage at the second terminal (the second node N2) of the storage capacitor C is Vd−|Vth|, wherein Vd is the data voltage output by the data signal line D, and Vth is the threshold voltage of the third transistor T3. The signal of the second scan signal line S2 is the high-level signal, so that the first transistor T1 and the seventh transistor T7 are turned off. The signal of the emitting signal line E is a high-level signal, so that the fifth transistor T5 and the sixth transistor T6 are turned off.

In a third stage A3, referred to as a light emitting stage, the signals of the emitting signal line E and the third scan signal line are low-level signals, and the signals of the first scan signal line S1 and the second scan signal line S2 are high-level signals. The signal of the emitting signal line E is a low-level signal, so that the fifth transistor T5 and the sixth transistor T6 are turned on, and a power voltage output by the first power supply line VDD provides a drive voltage to the first electrode of the OLED through the turned-on fifth transistor T5, the third transistor T3, and the sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows.

$$I = K*(Vgs - Vth)^2 = K*[(Vdd - Vd + |Vth|) - Vth]^2 = K*[(Vdd - Vd]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

In an exemplary embodiment, the bonding region 200 may include a fanout region 201 connected to the display region 100, a bend region 202, a drive chip region, and a bonding pin region arranged in order in a direction away from the display region. The fanout region 201 includes at least data fanout lines, multiple which are configured to connect data signal lines of the display region in a fanout wiring manner. The bend region 202 is connected to the fanout region 201, and may include a composite insulation layer provided with a groove, and is configured to bend the bonding region to the back of the display region. The drive chip region may include an Integrated Circuit (IC for short) and is configured to be connected with the multiple data fanout lines. The bonding pin region may include Bonding Pads, and is configured to be bonded to an external Flexible Printed Circuit (FPC for short).

With the development of OLED display technologies, consumers have higher requirements for the display effect of display products. Super-narrow bezels have become a new trend in the development of display products. Therefore, bezel narrowing or even a bezel-less design has received more attention in the design of OLED display products. Because the signal lines of integrated circuits and bonding pads in the bonding region need to be fanned out through data fanout lines to be introduced into a wider display region, the fanout region occupies a larger space, resulting in a larger width of the lower bezel. To reduce the width of the lower bezel, a display substrate adopts a structure in which a fanout line is located in a display region (Fanout in AA, FIAA). The fanout region may include multiple lead-out lines parallel to each other, multiple data fanout lines are arranged in the display region, one terminal of the multiple data fanout lines is located in the display region and correspondingly connected with multiple data signal lines in the display region, and the other terminal of the multiple data fanout lines extends to the bonding region and correspondingly connected with the integrated circuit. Since the fanout region does not need to be provided with a slant line of a fan shape, the width of the fanout region is reduced, thereby reducing the width of the lower bezel.

An exemplary embodiment of the present disclosure provides a display substrate. In an exemplary embodiment, the display substrate may include a display region and a bonding region on one side of the display region, the display region at least includes a first wiring region and a second wiring region, wherein the first wiring region is provided with at least one first wiring and at least one light emitting device, the second wiring region is provided with at least one second wiring and at least one light emitting device, and the light emitting device at least includes an anode. A first terminal of the first wiring is connected with a bonding lead line of the bonding region, a second terminal of the first wiring is connected with a first terminal of the second wiring after extending along the second direction, and a second terminal of the second wiring is connected with the data signal line of the display region after extending along the first direction, wherein the first direction crosses the second direction. The first wiring region further includes at least one first compensation line extending along the first direction, an orthographic projection of the at least one anode in the plane of the display substrate overlaps at least partially with an orthographic projection of the first compensation line in the plane of the display substrate, and/or, the second wiring region further includes at least one second compensation line extending along the second direction, and an orthographic projection of the at least one anode in the plane of the display substrate overlaps at least partially with an orthographic projection of the second compensation line in the plane of the display substrate.

In an exemplary embodiment, an orthographic projection of at least one anode in the plane of the display substrate at least partially overlaps an orthographic projection of the first wiring in the plane of the display substrate.

In an exemplary embodiment, in the first wiring region, an orthographic projection of at least one anode in the plane of the display substrate overlaps at least partially with an orthographic projection of A1 first wirings in the plane of the display substrate, in the second wiring region, an orthographic projection of at least one anode in the plane of the display substrate overlaps at least partially with an orthographic projection of A2 second compensation lines in the plane of the display substrate, wherein A1=A2.

In an exemplary embodiment, the second wiring region further includes at least one dummy line extending along the first direction and located between adjacent second wirings, an orthographic projection of the at least one anode in the plane of the display substrate overlaps at least partially with an orthographic projection of the dummy line in the plane of the display substrate.

In an exemplary embodiment, in the first wiring region, an orthographic projection of at least one anode in the plane of the display substrate overlaps at least partially with an orthographic projection of B1 first compensation lines in the plane of the display substrate, in the second wiring region, an orthographic projection of at least one anode in the plane of the display substrate overlaps at least partially with an orthographic projection of B2 second dummy lines in the plane of the display substrate, wherein B1=B2.

Figure 7:
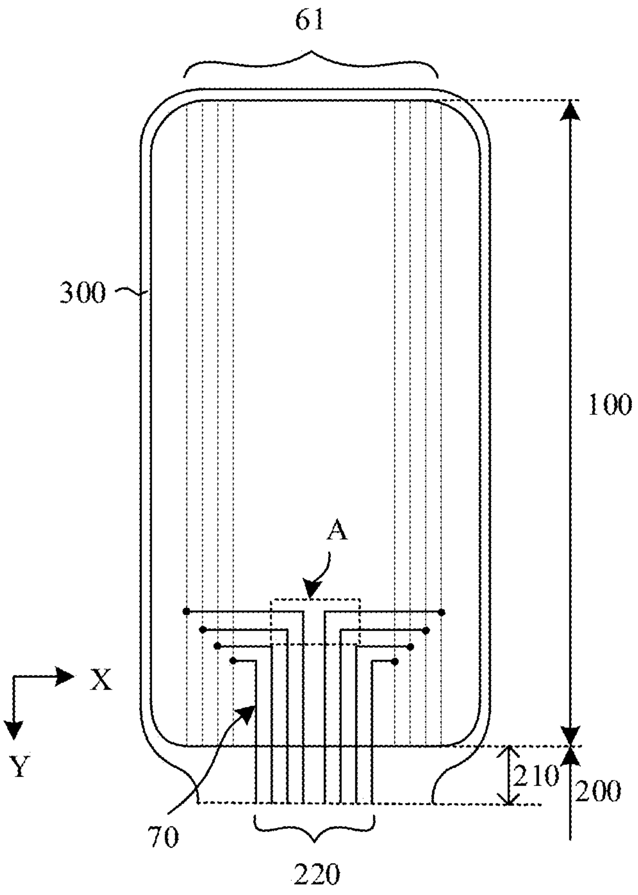
FIG. 7 is a schematic diagram of a structure of data fanout lines according to an exemplary embodiment of the present disclosure.

FIG. 7 is a schematic diagram of a structure of data fanout lines according to an exemplary embodiment of the present disclosure. The data fanout line adopts the FIAA structure. In a plane parallel to the display substrate, the display substrate may include a display region 100, a bonding region 200 on one side of the display region 100, and a bezel region 300 on the other side of the display region 100. The display region 100 may include at least multiple data signal lines 61, multiple data fanout lines 70, and multiple sub-pixels constituting a pixel array, and the bonding region 200 may include at least a lead line region 210, which may include multiple lead lines 220 parallel to each other.

In an exemplary embodiment, multiple sub-pixels of a pixel array may include multiple pixel rows and multiple pixel columns. Each pixel row may include multiple sub-pixels sequentially disposed along a first direction X, the multiple pixel rows may be sequentially disposed along a second direction Y, and each pixel column may include multiple sub-pixels sequentially disposed along a second direction Y, the multiple pixel columns may be sequentially disposed along a first direction X, wherein the first direction X intersecting the second direction Y. In an exemplary embodiment, the first direction X may be the extending direction (horizontal direction) of the scan signal lines, and the second direction Y may be perpendicular to the first direction X.

In an exemplary embodiment, the data signal lines 61 may be in a line shape extending along the second direction Y, and multiple data signal lines 61 are sequentially arranged at set intervals in the first direction X, each of which is connected to all pixel drive circuits in one pixel column. In an exemplary embodiment, multiple data fanout lines 70 may be located in a region of the display region near the bonding region 200 side, the first terminals of the multiple data fanout lines 70 are connected correspondingly to the multiple lead lines 220 of the lead line region 210 in the bonding region 200. After the second terminals of the multiple data fanout lines 70 extend toward the direction of the display region 10, they are correspondingly connected with the multiple data signal lines 61, the multiple data signal lines 61 in the display region 100 are correspondingly connected to the multiple lead lines 220 in the bonding region 200 through the multiple data fanout lines 70 in the display region 100.

In an exemplary embodiment, the quantity of data fanout lines in the display region may be the same as the quantity of data signal lines, each of the data signal line is correspondingly connected with one of the lead lines through one of the data fanout lines. Alternatively, the quantity of data fanout lines in the display region may be smaller than the quantity of data signal lines, and a part of the data signal lines in the display region is connected with the lead lines correspondingly through the data fanout lines, and the other part of the data signal lines is directly connected with the lead lines, which is not limited in the present disclosure.

Figure 8:
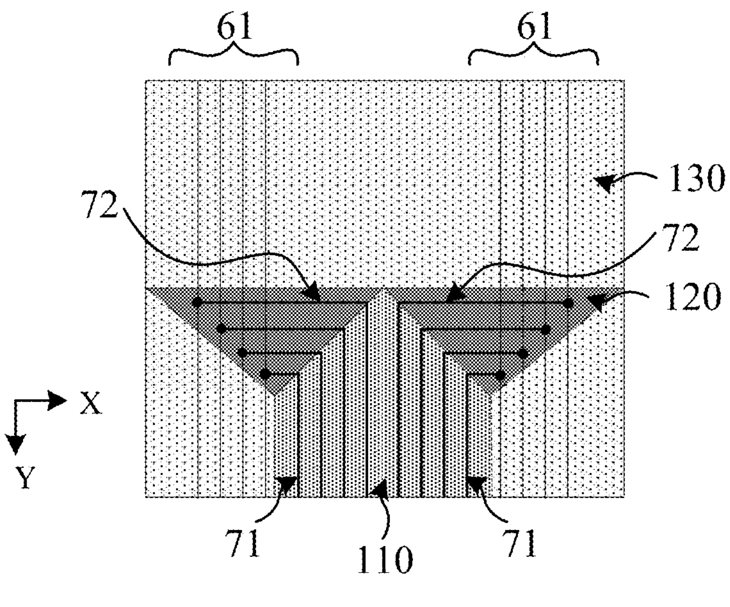
FIG. 8 is a schematic diagram of the wiring region according to an exemplary embodiment of the present disclosure.

FIG. 8 is a schematic diagram of the wiring region according to an exemplary embodiment of the present disclosure, and is an enlarged view of the region where the data fanout line is located in FIG. 7. As shown in FIGS. 7 and 8, in an exemplary embodiment, the data fanout line 70 may include a first wiring 71 which may be a line shape in which the main body part extends along the second direction Y and a second wiring 72 which may be a line shape in which the main body part extends along the first direction X, which are connected to each other. In an exemplary embodiment, the first terminal of the first wiring 71 is connected to a lead line 220 of the lead line region 210, the second terminal of the first wiring 71 extends in the opposite direction of the second direction Y toward the display region 100 and is connected to the first terminal of the second wiring 72. The second terminal of the second wiring 72 extends in the first direction X or in the opposite direction of the first direction X toward the bezel region 300 and is connected to the data signal line 61 through a via hole.

In the present disclosure, A extending in a B direction means that A may include a main part, which is a line, a line segment or a strip-shaped body, and a secondary part connected with the main part, the main part extending in the B direction, and a length of the main part extending in the B direction is greater than a length of the secondary part extending in other directions. In the following description, "A extends in the B direction" means "the main body part of A extends in the B direction". In an exemplary embodiment, the second direction Y may be a direction pointing from the display region to the bonding region, and the opposite direction of the second direction Y may be a direction pointing from the bonding region to the display region.

In an exemplary embodiment, since multiple data fanout lines 70 are set in a part of the display region near the bonding region, therefore, the display region can be divided into a wiring region and a normal region 130 according to whether there is a data fanout line 70 or not. The normal region 130 may be a region where no data fanout lines 70 are provided, and the wiring region may be a region where data fanout lines 70 are provided. In an exemplary embodiment, since the data fanout line 70 includes a first wiring 71 and a second wiring 72 which extend in different directions, thus, the wiring region can be divided into a first wiring region 110 in which the first wiring 71 is provided and a second wiring region 120 in which the second wiring 72 is provided according to the extension direction of the data fanout line. The first wiring region 110 may be a region in which the first wiring 71 is provided and the second wiring region 120 may be a region in which the second wiring 72 is provided.

In an exemplary embodiment, the division of the respective regions in the present disclosure is only an exemplary illustration. Since the first wiring region 110, the second wiring region 120, and the normal region 130 are divided according to whether there is a data fanout line and the extension direction of the data fanout line, therefore, the shapes of the first wiring region 110, the second wiring region 120, and the normal region 130 can be regular polygons or irregular polygons. The display region can be divided into one or more first wiring regions 110, one or more second wiring regions 120 and one or more normal regions 130, which are not limited in this disclosure.

Figure 9A:
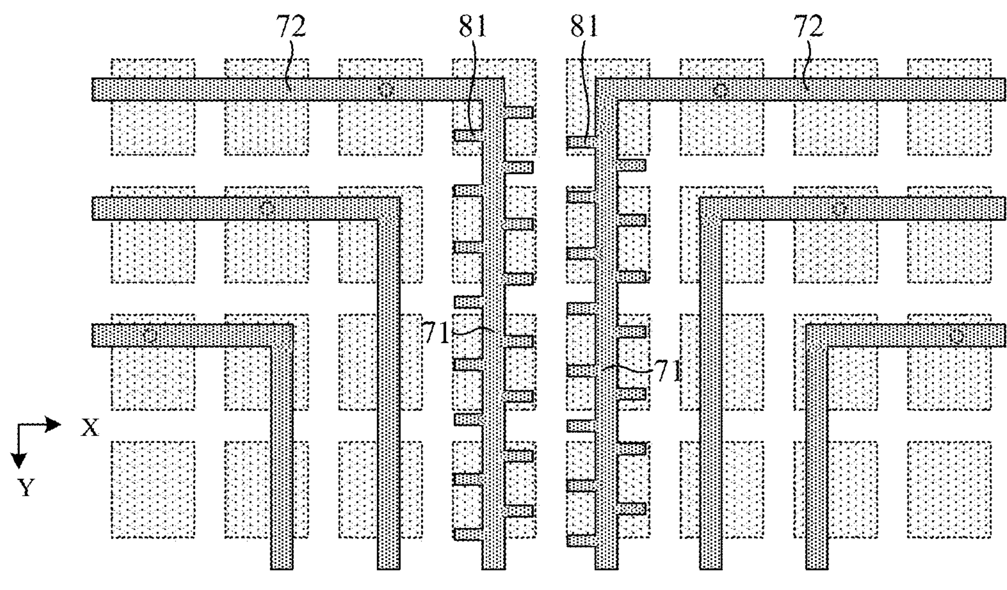
FIG. 9*a* to FIG. 9*c* are schematic diagrams of a compensation line of several types according to exemplary embodiments of the present disclosure.
Figure 9B:
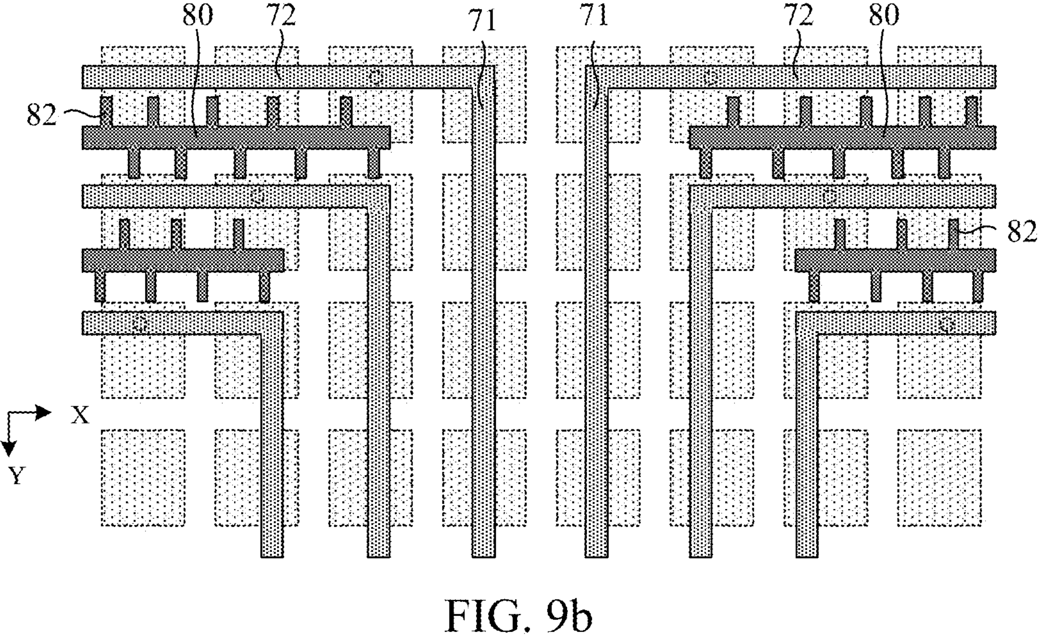
Figure 9C:
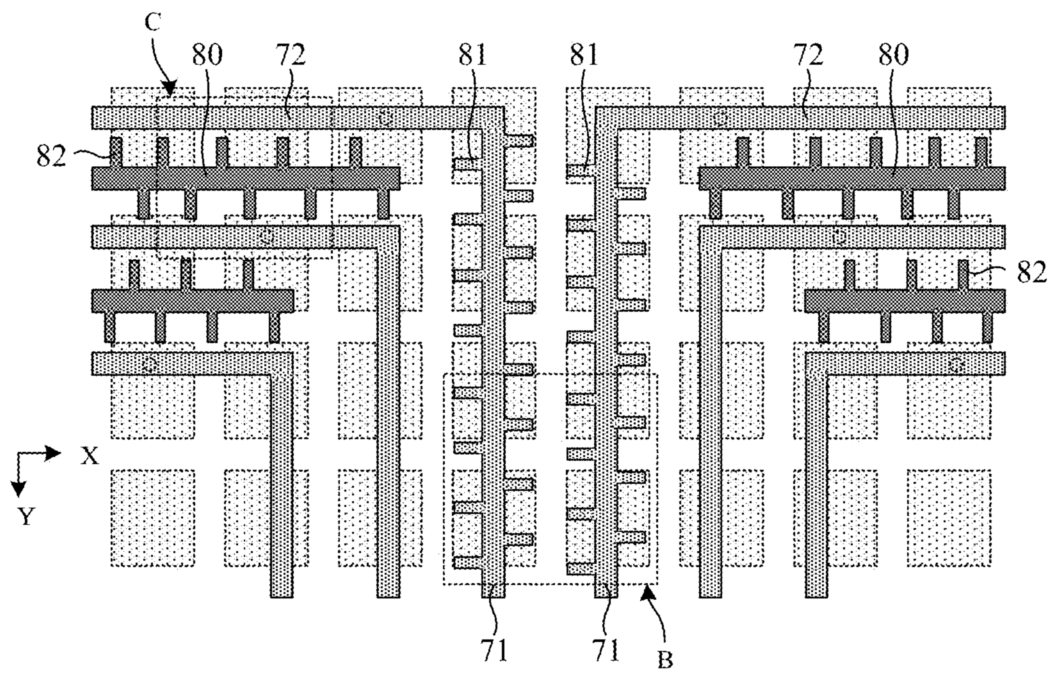

FIG. 9*a* to FIG. 9*c* are schematic diagrams of a compensation line of several types according to exemplary embodiments of the present disclosure, and are enlarged views of Region A in FIG. 7. As shown in FIG. 7, FIG. 8 and FIG. 9*a*, in an exemplary embodiment, the first wiring region 110 of the display substrate may be provided with at least one first compensation line 81, the first compensation line 81 may be in a line shape extending along the first direction X, and may be provided on one side of the first direction X of the first wiring 71, or on the opposite side of the first direction X of the first wiring 71, or both on one side of the first direction X of the first wiring 71 and on the opposite side of the first direction X of the first wiring 71.

In an exemplary embodiment, a first terminal of the first compensation line 81 may be connected to the first wiring 71, and a second terminal of the first compensation line 81 may extend in a direction away from the first wiring 71 in the first direction X or the opposite direction of the first direction X.

In an exemplary embodiment, one first wiring 71 may be connected to multiple first compensation lines 81, which may be sequentially arranged at set intervals in the second direction Y.

As shown in FIGS. 7, 8, and 9*b*, in an exemplary embodiment, the second wiring region 120 of the display substrate may be provided with at least one dummy line 80 configured to improve wiring uniformity and etch uniformity of the display substrate. In an exemplary embodiment, the dummy line 80 may be in the shape of a line extending along the first direction X, and the dummy line 80 may be located between adjacent second wirings 72 in the second direction Y.

In an exemplary embodiment, the second wiring region 120 may be provided with multiple dummy lines 80, which may be sequentially provided at set intervals in the second direction Y.

In an exemplary embodiment, the dummy line 80 may be provided only in the second wiring region 120, or the dummy line 80 may be provided in the second wiring region 120 and the normal region 130, which is not limited herein.

In an exemplary embodiment, the second wiring region 120 of the display substrate may be provided with at least one second compensation line 82, the second compensation line 82 may have a line shape extending along the second direction Y, and may be provided on one side of the second direction Y of the dummy line 80, or on the opposite side of the second direction Y of the dummy line 80, or at the same time on both sides of the second direction Y of the dummy line 80 and the opposite side of the second direction Y of the dummy line 80.

In an exemplary embodiment, the first terminal of the second compensation line 82 may be connected to the dummy line 80, and the second terminal of the second compensation line 82 may extend in a direction away from the dummy line 80 in the second direction Y or the opposite direction of the second direction Y.

In an exemplary embodiment, one dummy line 80 may be connected to multiple second compensation lines 82, and the multiple second compensation lines 82 may be sequentially disposed at set intervals in the first direction X.

As shown in FIG. 7, FIG. 8, and FIG. 9*c*, in an exemplary embodiment, the first wiring region 110 of the display substrate may be provided with at least one first compensation line 81, and the second wiring region 120 of the display substrate may be provided with at least one dummy line 80 and at least one second compensation line 82. In an exemplary embodiment, the dummy line 80 may be in the shape of a line extending along the first direction X, and the dummy line 80 may be located between adjacent second wirings 72 in the second direction Y. The first compensation line 81 may have a line shape extending along the first direction X, may be provided on one side of the first direction X of the first wiring 71, and/or may be provided on the opposite side of the first direction X of the first wiring 71. The second compensation line 82 may have a line shape extending along the second direction Y, may be provided on one side of the dummy line 80 in the second direction Y, and/or may be provided on the opposite side of the dummy line 80 in the second direction Y. The first compensation line 81 may be connected to the first wiring 71, and the second compensation line 82 may be connected to the dummy line 80.

Figure 10A:
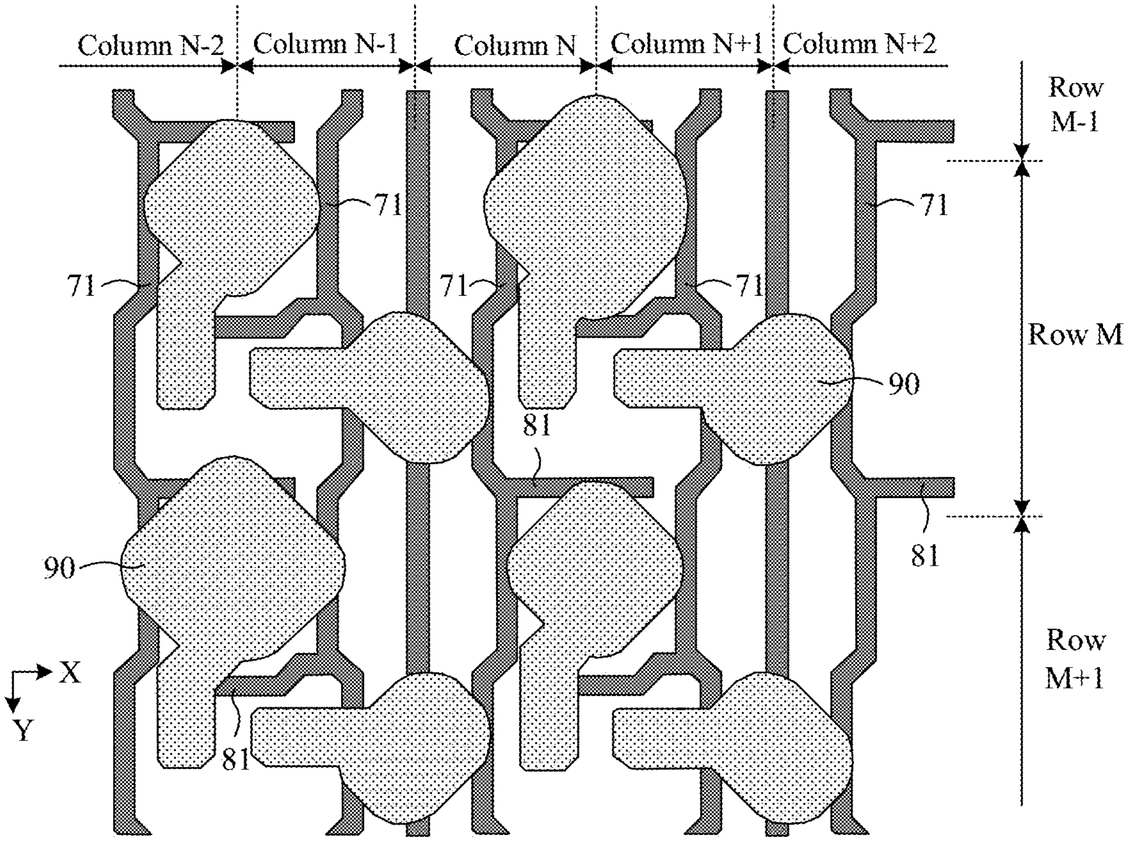
FIG. 10*a* to FIG. 10*b* are schematic diagrams of a structure of a display substrate according to an exemplary embodiment of the present disclosure.
Figure 10B:
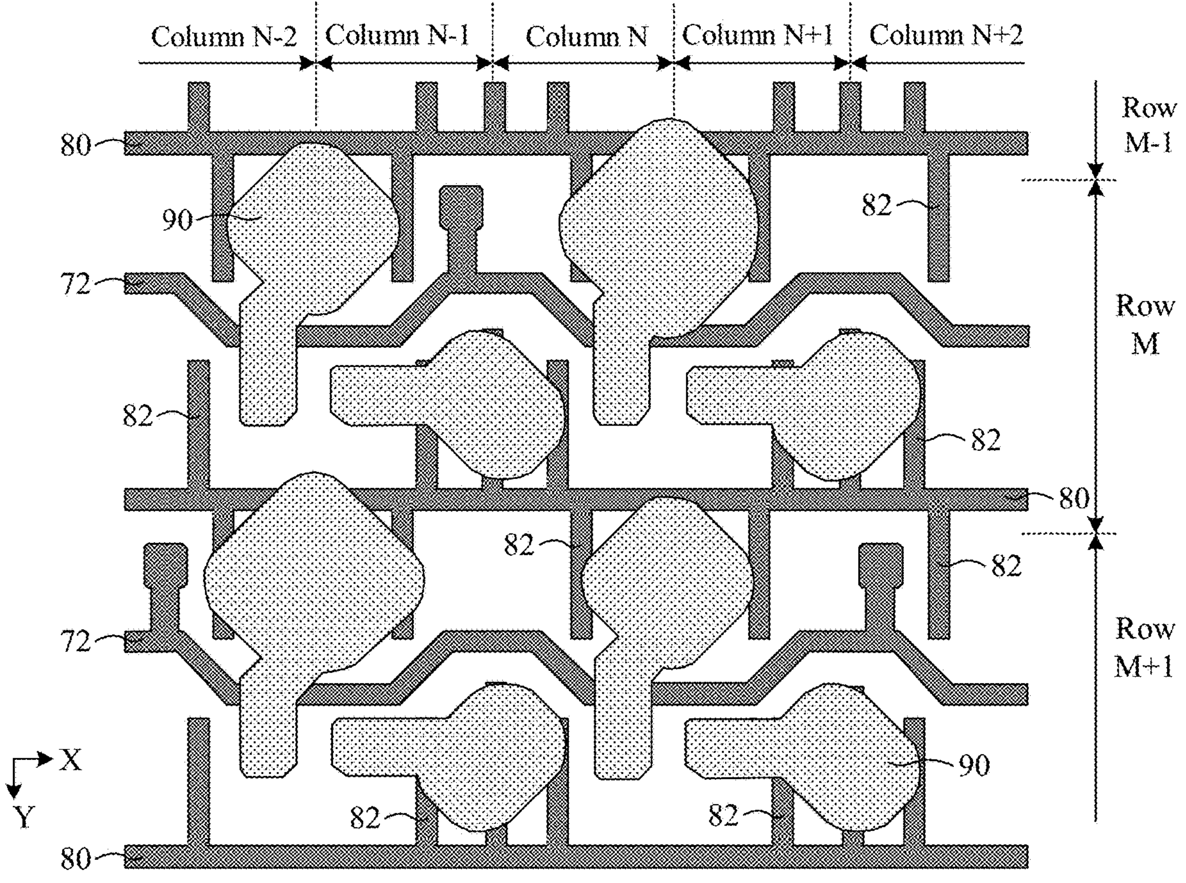

FIGS. 10*a* and 10*b* are structural diagrams of a display substrate according to an exemplary embodiment of the present disclosure. FIG. 10*a* illustrates a planar structure of 10 sub-pixels (2 pixel rows and 5 pixel columns) in the first wiring region, and FIG. 10*b* illustrates a planar structure of 10 sub-pixels (2 pixel rows and 5 pixel columns) in the second wiring region. In an exemplary embodiment, the display substrate may include multiple light emitting devices including an anode, an organic emitting layer and a cathode.

As shown in FIG. 10*a*, the first wiring 71 may be in the shape of a zigzag line extending along the second direction Y, and the first compensation line 81 may be in the shape of a straight line or a zigzag line extending along the first direction X. The first compensation line 81 may be provided on one side of the first direction X of the first wiring 71 or on the opposite side of the first direction X of the first wiring 71 and connected to the first wiring 71.

In an exemplary embodiment, an orthographic projection of at least one anode 90 in the first wiring region in the plane of the display substrate at least partially overlaps an orthographic projection of the first wiring 71 in the plane of the display substrate.

In an exemplary embodiment, an orthographic projection of at least one anode 90 in the first wiring region in the plane of the display substrate at least partially overlaps an orthographic projection of the first compensation line 81 in the plane of the display substrate.

As shown in FIG. 10*b*, the second wiring 72 may be in the shape of a zigzag line extending along the first direction X, the dummy line 80 may be in the shape of a straight line extending along the first direction X, and the second compensation line 82 may be in the shape of a straight line or a zigzag line extending along the second direction Y. The second compensation line 82 may be provided at the same time on one side of the dummy line 80 in the second direction Y and on the opposite side of the dummy line 80 in the second direction Y. In an exemplary embodiment, the second compensation line 82 may be connected to the dummy line 80.

In an exemplary embodiment, an orthographic projection of at least one anode 90 in the second wiring region in the plane of the display substrate overlaps at least partially with an orthographic projection of the dummy line 80 in the plane of the display substrate.

In an exemplary embodiment, an orthographic projection of at least one anode 90 in the second wiring region in the plane of the display substrate at least partially overlaps an orthographic projection of the second compensation line 82 in the plane of the display substrate.

In an exemplary embodiment, in the first wiring region, the orthographic projection of the at least one anode in the plane of the display substrate at least partially overlaps the orthographic projection of the A1 first wirings in the plane of the display substrate. In the second wiring region, the orthographic projection of at least one anode in the plane of the display substrate and the orthographic projection of A2 second compensation lines in the plane of the display substrate at least partially overlap. Where A1=A2=2, or A1=A2=3.

In an exemplary embodiment, in the first wiring region, the orthographic projection of the at least one anode 90 in the plane of the display substrate at least partially overlaps the orthographic projection of the B1 first compensation lines 81 in the plane of the display substrate. In the second wiring region, the orthographic projection of at least one anode 90 in the plane of the display substrate overlaps at least partially the orthographic projection of B2 dummy lines 80 in the plane of the display substrate. Where B1=B2=1, or B1=B2=0.

In an exemplary embodiment, in a plane perpendicular to the display substrate, the display substrate may include a drive circuit layer disposed on a substrate and an emitting structure layer disposed on a side of the drive circuit layer away from the substrate. The drive circuit layer may include multiple conductive layers, the first wiring, the second wiring, and the data signal line may be disposed in different conductive layers, and the second wiring may be connected to the data signal line through a via hole.

In an exemplary embodiment, the first wiring, the second wiring, the first compensation line, and the second compensation line may be arranged on the same layer and formed synchronously by the same one-time patterning process.

In an exemplary embodiment, the multiple conductive layers may include at least a first conductive layer, a second conductive layer, a third conductive layer, a fourth conductive layer, a fifth conductive layer, and a sixth conductive layer. The data signal lines may be arranged in the fifth conductive layer, and the first wiring, the second wiring, the first compensation line and the second compensation line may be arranged in the sixth conductive layer.

In an exemplary embodiment, the display substrate may include multiple insulation layers, which may be respectively disposed between the first conductive layer and the second conductive layer, between the second conductive layer and the third conductive layer, between the third conductive layer and the fourth conductive layer, between the fourth conductive layer and the fifth conductive layer, and between the fifth conductive layer and the sixth conductive layer.

Exemplary description is made below through a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or eight of dry etching and wet etching, which is not limited in present disclosure. A "thin film" refers to a layer of thin film made of a material on a substrate through a process such as deposition, coating, etc. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern". "A and B being disposed on a same layer" mentioned in the present disclosure means that A and B are formed simultaneously through a same patterning process, and a "thickness" of a film layer is a dimension of the film layer in a direction perpendicular to a display substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary embodiment, taking 10 sub-pixels (2 pixel rows and 5 pixel columns) as an example, the preparation process of the display substrate may include the following operations.

(1) A substrate is prepared on a glass carrier plate. In an exemplary embodiment, the substrate may be a flexible substrate, or may be a rigid substrate. The rigid substrate may include, but not limited to, one or more of glass and quartz. The flexible substrate may be made of, but not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary embodiment, the flexible substrate may include a first flexible material layer, a first inorganic material layer, a semiconductor layer, a second flexible material layer and a second inorganic material layer stacked on the glass carrier plate. Materials of the first flexible material layer and second flexible material layer may be polyimide (PI), polyethylene terephthalate (PET), or a polymer soft thin film subjected to surface treatment, etc. Materials of the first inorganic material layer and second inorganic material layer may be silicon nitride (SiNx), silicon oxide (SiOx), or the like, so as to improve water-oxygen resistance capability of the substrate. The first inorganic material layer and second inorganic material layer are also referred to as barrier layers. A material of the semiconductor layer may be amorphous silicon (a-si). In an exemplary embodiment, taking a laminated structure of PI1/Barrier1/a-Si/PI2/Barrier2 as an example, its preparation process may include: firstly, coating a layer of polyimide on the glass carrier plate, curing it into a thin film to form a first flexible (PI1) layer; then, depositing a layer of barrier thin film on the first flexible layer to form a first barrier (Barrier1) layer covering the first flexible layer; then depositing a layer of amorphous silicon thin film on the first barrier layer to form an amorphous silicon (a-Si) layer covering the first barrier layer; after that, coating a layer of polyimide on the amorphous silicon layer, curing it into a thin film to form a second flexible (PI2) layer; then, depositing a layer of barrier thin film on the second flexible layer to form a second barrier (Barrier2) layer covering the second flexible layer, thereby completing preparation of the substrate.

Figure 11:
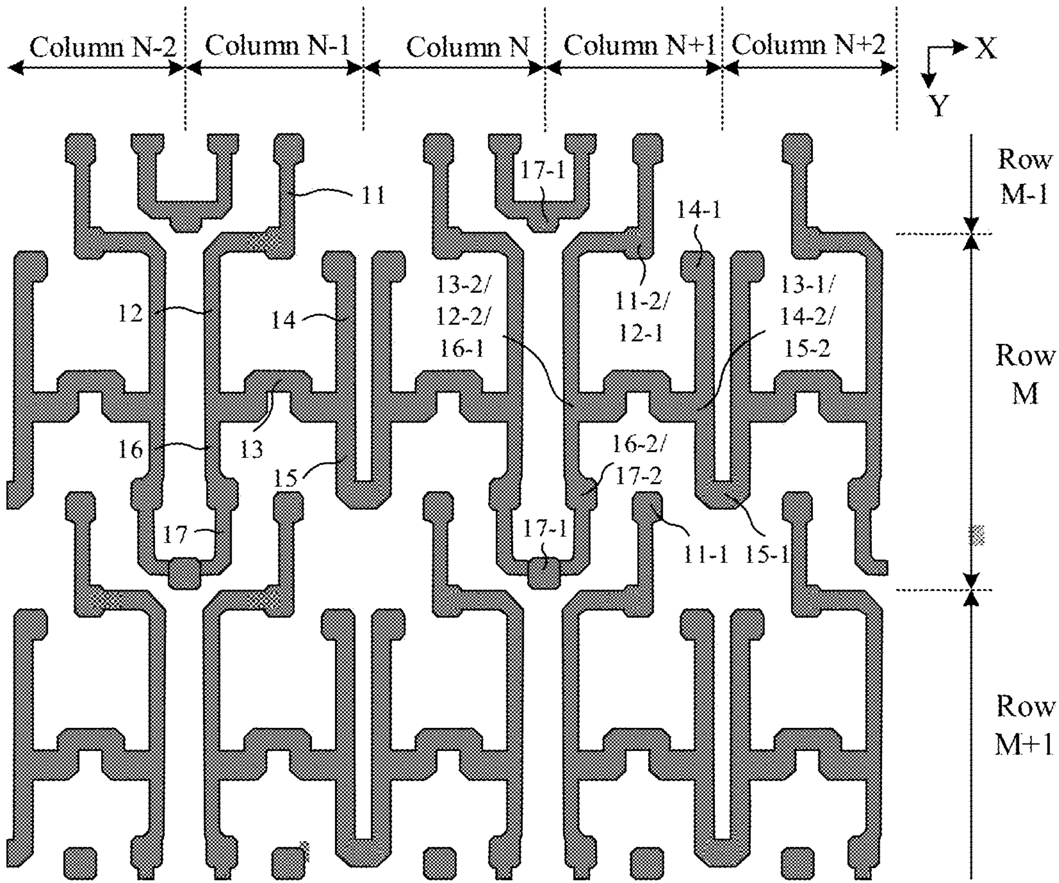
FIG. 11 is a schematic diagram obtained after a pattern of a first semiconductor layer is formed according to an embodiment of the present disclosure.

(2) A pattern of a first semiconductor layer is formed. In an exemplary embodiment, forming a pattern of a first semiconductor layer may include: depositing sequentially a first insulation thin film and a first semiconductor thin film on a substrate, and patterning the first semiconductor thin film through a patterning process to form a first insulation layer overlying the substrate and a pattern of a first semiconductor layer disposed on the first insulation layer, as shown in FIG. 11.

In an exemplary embodiment, the pattern of the first semiconductor layer of each sub-pixel may include at least a first active layer 11 of the first transistor T1 to a seventh active layer 17 of the seventh transistor T7, and the first active layer 11 to the seventh active layer 17 are of an integral structure connected to one another.

In an exemplary embodiment, in the first direction X, the second active layer 12 and the sixth active layer 16 may be located on the same side of the third active layer 13 in the sub-pixel, the fourth active layer 14 and the fifth active layer 15 may be located on the same side of the third active layer 13 in the sub-pixel, and the second active layer 12 and the fourth active layer 14 may be located on different sides of the third active layer 13 of the sub-pixel. In the second direction Y, the second active layer 12 and the fourth active layer 14 in the Mth row of sub-pixels may be located on the side of the third active layer 13 of the sub-pixel away from the M+1th row of sub-pixels. The first active layer 11, the fifth active layer 15, the sixth active layer 16, and the seventh active layer 17 in the Mth row of sub-pixels may be located on the side of the third active layer 13 of the sub-pixel near the M+1th row of sub-pixels.

In an exemplary embodiment, the third active layer 13 may be in a shape of "Ω". The shapes of the first active layer 11 to the second active layer 12 and the fourth active layer 14 to the seventh active layer 17 may be "I" shapes.

In an exemplary embodiment, an active layer of each transistor may include a first region, a second region, and a channel region located between the first region and the second region. In an exemplary embodiment, the second region 11-2 of the first active layer 11 may serve as the first region 12-1 of the second active layer 12, the first region 13-1 of the third active layer 13 can simultaneously serve as the second region 14-2 of the fourth active layer 14 and the second region 15-2 of the fifth active layer 15, the second region 13-2 of the third active layer 13 may simultaneously serve as the second region 12-2 of the second active layer 12 and the first region 16-1 of the sixth active layer 16, the second region 16-2 of the sixth active layer 16 can simultaneously serve as the second region 17-2 of the seventh active layer 17, and the first region 11-1 of the first active layer 11, the first region 14-1 of the fourth active layer 14, the first region 15-1 of the fifth active layer 15 and the first region 17-1 of the seventh active layer 17 may be disposed separately.

In an exemplary embodiment, in one pixel row, the first regions 15-1 of the fifth active layers 15 in two adjacent sub-pixels may be connected to each other. For example, the first region 15-1 of the fifth active layer 15 of the N−1 column and the first region 15-1 of the fifth active layer 15 of the Nth column are connected to each other, and the first region 15-1 of the fifth active layer 15 of the N+1 column and the first region 15-1 of the fifth active layer 15 of the N+2 column are connected to each other. In an exemplary embodiment, since a first region of the fifth active layer in each sub-pixel is configured to be connected to a first power supply line formed subsequently, by forming the first regions of the fifth active layer of adjacent sub-pixels into an integrated structure connected with each other, it is possible to ensure that the first electrodes of the fifth transistor T5 of adjacent sub-pixels have the same potential, which is beneficial to improving the uniformity of the panel, avoiding poor display of the display substrate and ensuring the display effect of the display substrate.

In an exemplary embodiment, the first regions 17-1 of the seventh active layers 17 in two adjacent sub-pixels in a row of pixels may be connected to each other. For example, the first region 17-1 of the seventh active layer 17 in the N−2th column and the first region 17-1 of the seventh active layer 17 in the N−1th column are connected to each other, and the first region 17-1 of the seventh active layer 17 in the Nth column and the first region 17-1 of the seventh active layer 17 in the N+1th column are connected to each other, In an exemplary embodiment, since the first region of the seventh active layer in each sub-pixel is configured to be connected to a second initial signal line formed subsequently, by forming the first region of the seventh active layer of adjacent sub-pixels into an integrated structure connected with each other, the first region of the seventh active layer of adjacent sub-pixels can be guaranteed to have the same potential, which is beneficial to improving the uniformity of the panel, avoiding poor display of the display substrate and ensuring the display effect of the display substrate.

In an exemplary embodiment, the first semiconductor layer may be made of polysilicon (p-Si), that is, the first to the sixth transistors are LTPS thin film transistors. In an exemplary embodiment mode, the patterning the first semiconductor thin film through the patterning process may include: forming an amorphous silicon (a-si) thin film on the first insulation thin film, dehydrogenating the amorphous silicon thin film, and crystallizing the dehydrogenated amorphous silicon thin film to form a poly silicon thin film. Subsequently, the poly silicon thin film is patterned to form the pattern of the first semiconductor layer.

Figure 12A:
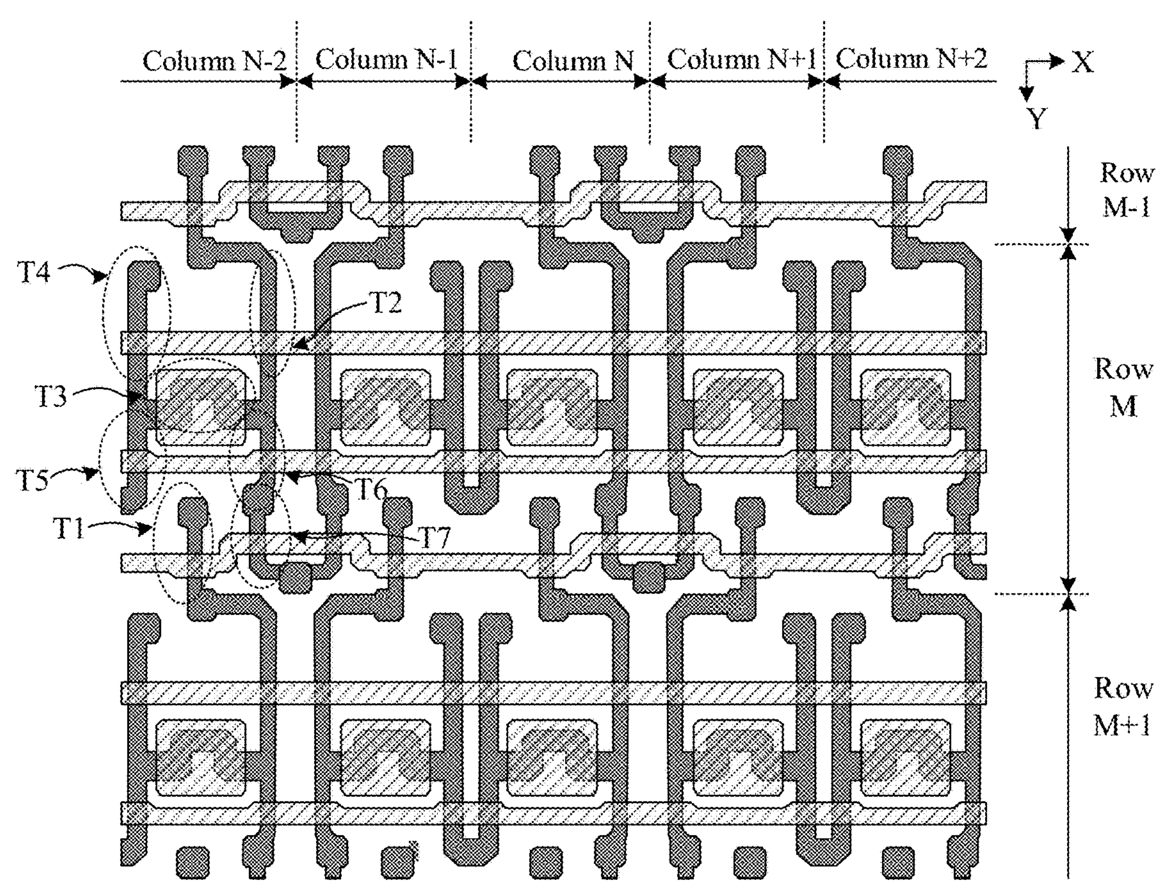
FIG. 12*a* and FIG. 12*b* are schematic diagrams obtained after a pattern of a first conductive layer is formed according to an embodiment of the present disclosure.
Figure 12B:
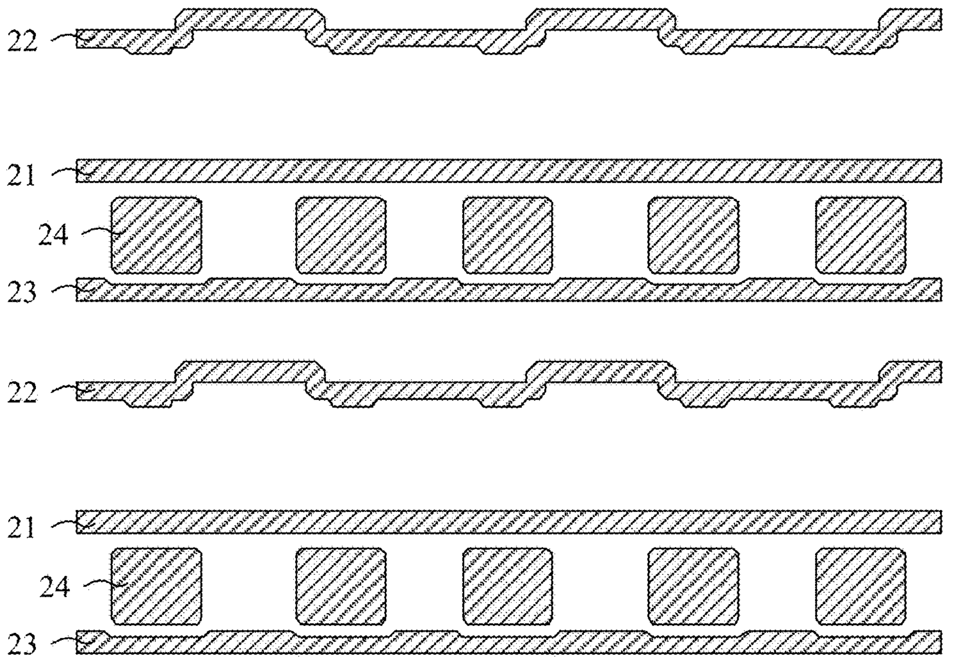

(3) A pattern of a first conductive layer is formed. In an exemplary embodiment, forming a pattern of a first conductive layer may include: sequentially depositing a second insulation thin film and a first conductive thin film on the substrate on which the above-mentioned pattern is formed, and patterning the first conductive thin film through a patterning process to form a second insulation layer that covers a pattern of the first semiconductor layer and a pattern of the first conductive layer disposed on the second insulation layer, as shown in FIG. 12*a* and FIG. 12*b*, and FIG. 12*b* is a planar schematic diagram of the first conductive layer in FIG. 12*a*. In an exemplary embodiment mode, the first conductive layer may be referred to as a first gate metal (GATE1) layer.

In an exemplary embodiment, the pattern of the first conductive layer of each sub-pixel includes at least: a first scan signal line 21, a second scan signal line 22, an emitting control line 23 and a first electrode plate 24 of a storage capacitor.

In an exemplary embodiment, the shape of the first electrode plate 24 may be rectangular, and the corners of the rectangle may be chamfered. An orthographic projection of the first electrode plate 24 on the substrate at least partially overlaps an orthographic projection of the third active layer of the third transistor T3 on the substrate. In an exemplary embodiment, the first electrode plate 24 may simultaneously serve as an electrode plate of the storage capacitor and a gate electrode of the third transistor T3.

In an exemplary embodiment, the shape of the first scan signal line 21 may be a line shape in which the main body part extends along the first direction X, the first scan signal line 21 in the Mth row of sub-pixels may be located on the side of the first electrode plate 24 of the sub-pixel away from the M+1 row of sub-pixels. A region where the first scan signal line 21 overlaps the second active layer of the sub-pixel serves as a gate electrode of the second transistor T2, and a region where the first scan signal line 21 overlaps the fourth active layer of the sub-pixel serves as a gate electrode of the fourth transistor T4.

In an exemplary embodiment, the shape of the second scan signal line 22 may be a line shape in which the main body part extends along the first direction X, the second scan signal line 22 in the Mth row of sub-pixels may be located on the side of the first electrode plate 24 of the sub-pixel near the M+1 row of sub-pixels. A region where the second scan signal line 22 overlaps the first active layer of the sub-pixel serves as a gate electrode of the first transistor T1, and a region where the second scan signal line 22 overlaps the seventh active layer of the sub-pixel serves as a gate electrode of the seventh transistor T7.

In an exemplary embodiment, the shape of the emitting control line 23 may be a line shape in which the main body part extends along the first direction X, the emitting control line 23 may be located between the first electrode plate 24 and the second scan signal line 22. A region where the emitting control line 23 overlaps the fifth active layer of the sub-pixel serves as a gate electrode of the fifth transistor T5, and a region where the emitting control line 23 overlaps the sixth active layer of the sub-pixel serves as a gate electrode of the sixth transistor T6.

In an exemplary embodiment, the first scan signal line 21, the second scan signal line 22, and the emitting control line 23 may be of equal width design, or may be of non-equal width design, may be straight lines, or may be zigzag lines, which may not only facilitate the layout of the pixel structure, but also reduce the parasitic capacitance between the signal lines, and the present disclosure is not limited herein.

In an exemplary embodiment, after the pattern of the first conductive layer is formed, the first semiconductor layer may be subjected to a conductive treatment by using the first conductive layer as a shield. A region of the first semiconductor layer, which is shielded by the first conductive layer, forms channel regions of the first transistor T1 to the seventh transistor T7, and a region of the first semiconductor layer, which is not shielded by the first conductive layer, is made to be conductive, that is, first regions and second regions of the first transistor T1 to the seventh active layer are all made to be conductive.

Figure 13A:
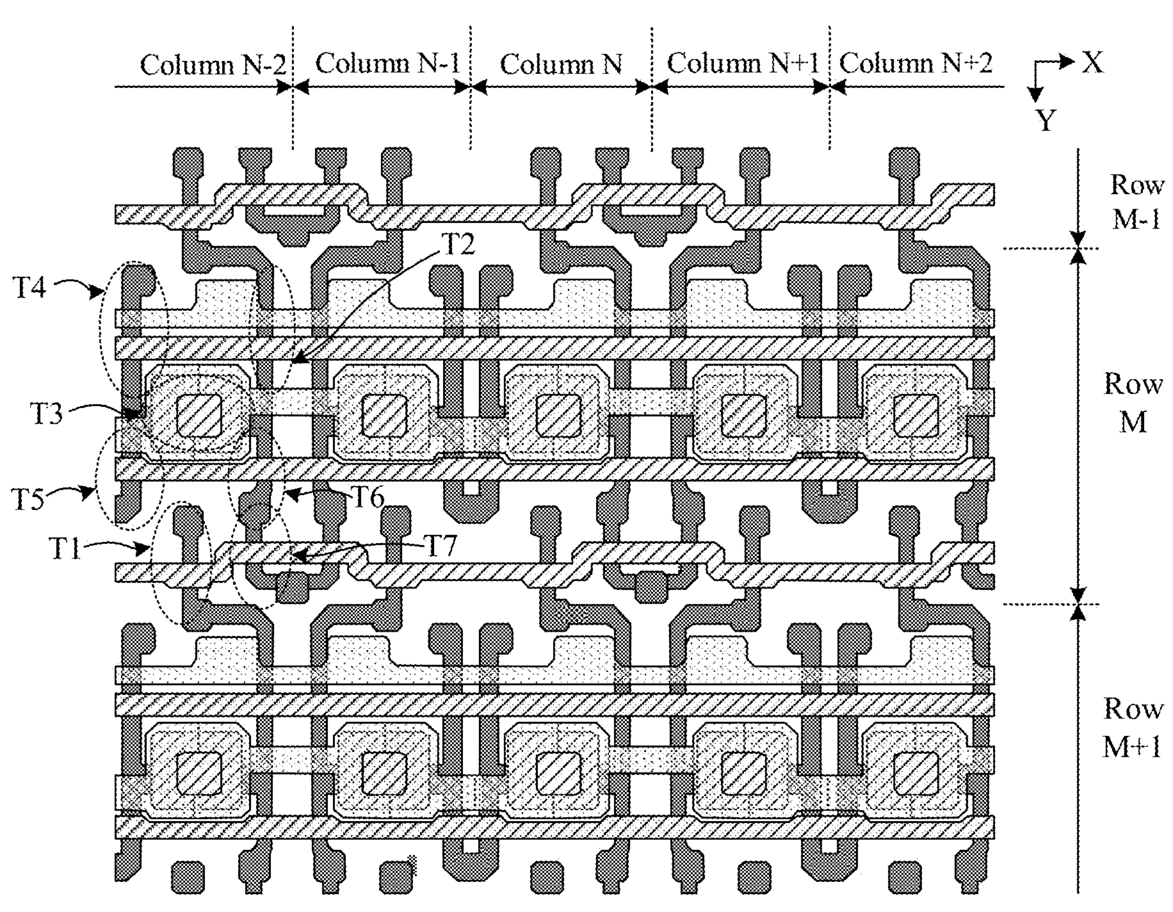
FIG. 13*a* and FIG. 13*b* are schematic diagrams obtained after a pattern of a second conductive layer is formed according to an embodiment of the present disclosure.
Figure 13B:
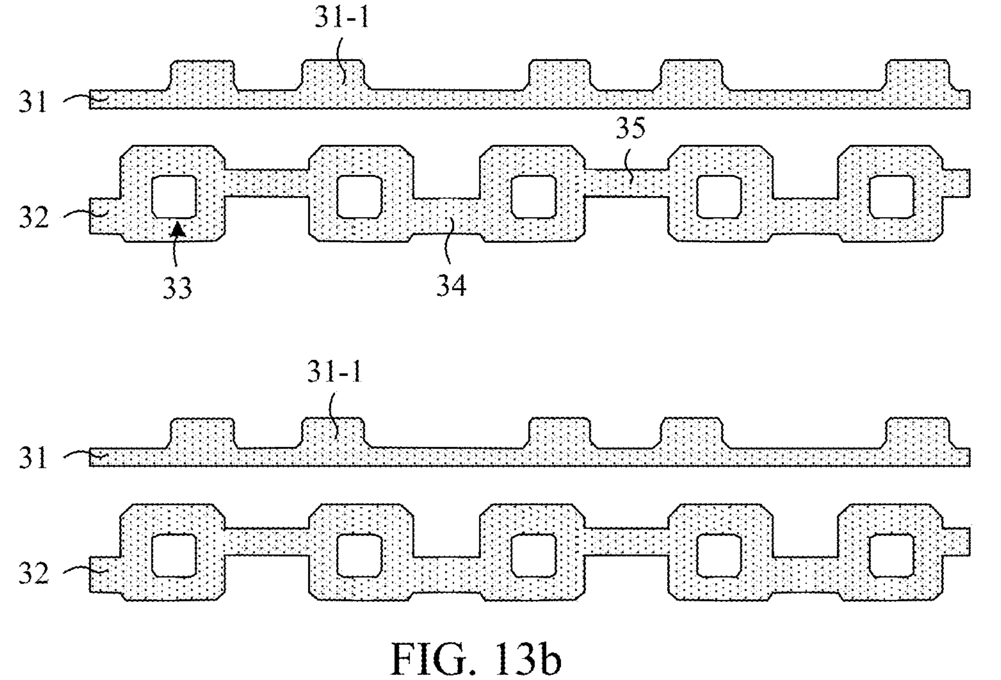

(4) A pattern of a second conductive layer is formed. In an exemplary embodiment, forming the pattern of the second conductive layer may include: On the substrate on which the aforementioned patterns are formed, sequentially depositing a third insulation thin film and a second conductive thin film, and patterning the second conductive thin film by a patterning process to form a third insulation layer covering the first conductive layer, and a pattern of the second conductive layer disposed on the third insulation layer, as shown in FIGS. 13*a* and 13*b*, wherein FIG. 13*b* is a schematic plan view of the second conductive layer in FIG. 13*a*. In an exemplary embodiment, the second conductive layer may be referred to as a second gate metal (GATE2) layer.

In an exemplary embodiment, the pattern of the second conductive layer of each sub-pixel includes at least a gate signal line 31 and a second electrode plate 32 of a storage capacitor.

In an exemplary embodiment, a profile of second electrode plate 32 may be in the shape of a rectangle, corners of which in shape of the rectangle may be provided with a chamfer. The orthographic projection of the second electrode plate 32 on the substrate overlaps at least partially the orthographic projection of the first electrode plate 24 on the substrate. The second electrode plate 32 can be used as another electrode plate of the storage capacitor, and the first electrode plate 24 and the second electrode plate 32 constitute the storage capacitor of the pixel drive circuit. The second electrode plate 32 is provided with an opening 33, which may be rectangular in shape and may be located in the middle of the second electrode plate 32, so that the second electrode plate 32 forms an annular structure. The opening 33 exposes the third insulation layer covering the first electrode plate 24, and the orthographic projection of the first electrode plate 24 on the substrate contains an orthographic projection of the opening 33 on the substrate. In an exemplary embodiment, the opening 33 is configured to accommodate a first via hole subsequently formed, which is located in the opening 33 and exposes the first electrode plate 24, so that a second electrode of the first transistor T1 subsequently formed is connected with the first electrode plate 24.

In an exemplary embodiment, the second electrode plates 32 in two adjacent sub-pixels in a pixel row may be connected to each other. For example, the second electrode plates 32 of the N−1 column and the second electrode plates 32 of the Nth column may be connected to each other by a first connection strip 34. As another example, the second electrode plate 32 of the Nth column and the second electrode plate 32 of the N+1 column are connected to each other by a second connection strip 35. In an exemplary embodiment, since the second electrode plate 32 in each sub-pixel is connected to the subsequently formed first power supply line, by forming the second electrode plate 32 of adjacent sub-pixels into an integral structure connected to each other, the second electrode plates in the integrated structure may be reused as power supply signal lines, thus ensuring that multiple second electrode plates in a sub-pixel row have a same potential, which is beneficial to improving uniformity of the panel, avoiding a poor display of the display substrate and ensuring a display effect of the display substrate.

In an exemplary embodiment, the first and second connection strips 34 and 35 may be dislocated in a second direction.

In an exemplary embodiment, the shape of the gate signal line 31 may be a line shape in which the main body part extends along the first direction X, the gate signal line 31 in the Mth row of sub-pixels may be located on the side of the second electrode plate 32 of the sub-pixel away from the M+1 row of sub-pixels. A lower gate electrode 31-1 is provided on the gate signal line 31 of each sub-pixel, the lower gate electrode 31-1 may be located on the side of the gate signal line 31 away from the second electrode plate 32, and is configured as a lower gate electrode of the eighth transistor T8 and also as a shield layer of the eighth transistor T8 to shield the channel region of the eighth transistor T8 and ensure the electrical performance of the oxide eighth transistor T8.

Figure 14A:
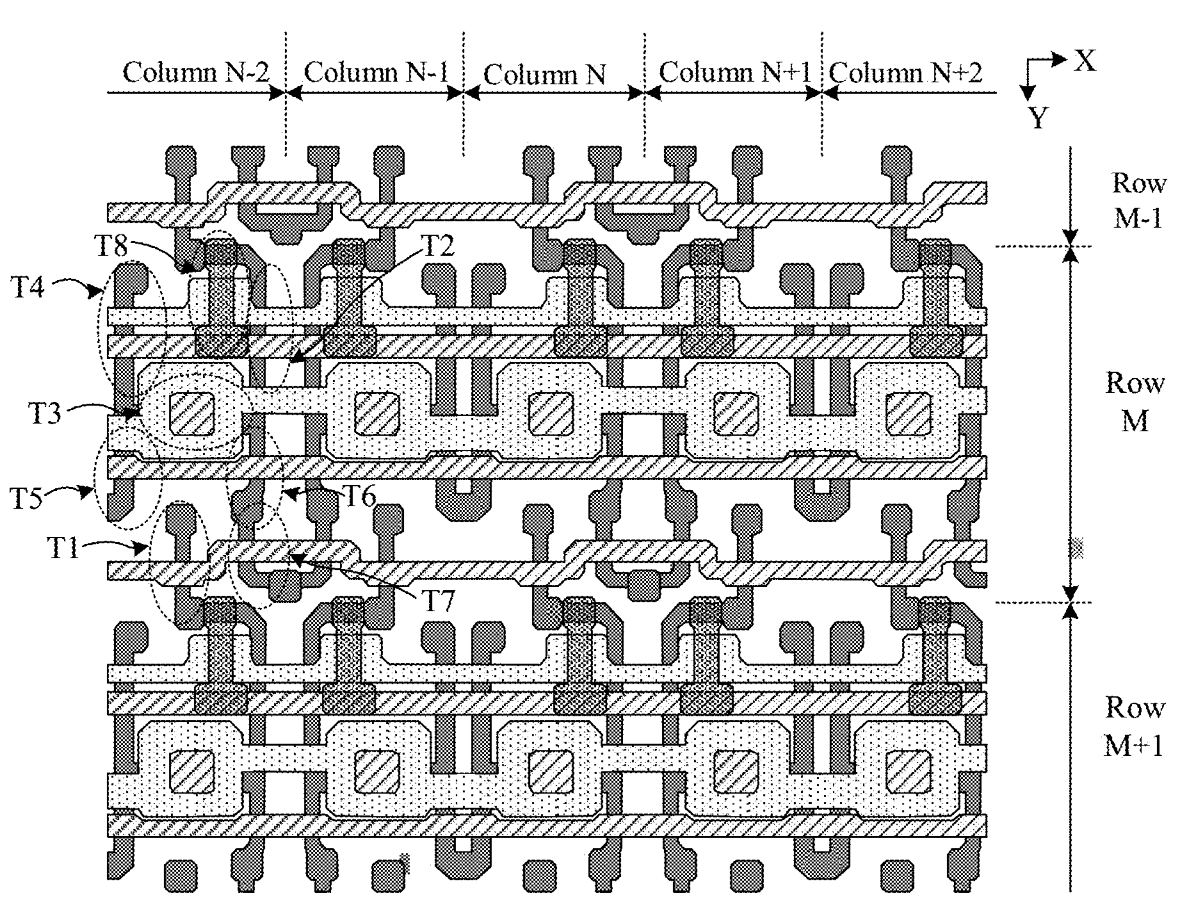
FIG. 14*a* and FIG. 14*b* are schematic diagrams obtained after a pattern of a second semiconductor layer is formed according to an embodiment of the present disclosure.
Figure 14B:
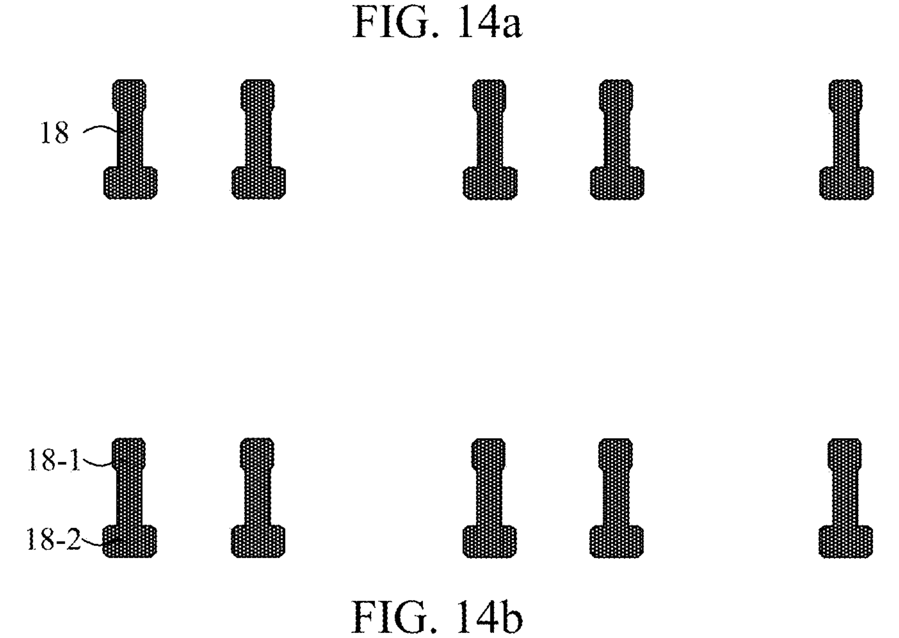

(5) A pattern of a second semiconductor layer is formed. In an exemplary embodiment, the operation that the pattern of the second semiconductor layer is formed may include: a fourth insulation thin film and a second semiconductor thin film are sequentially deposited on the substrate on which the foregoing patterns are formed, the second semiconductor thin film is patterned through a patterning process to form a fourth insulation layer that covers the substrate and form a pattern of the second semiconductor layer arranged on the fourth insulation layer, as shown in FIG. 14*a* and FIG. 14*b*, and FIG. 14*b* is a schematic plan view of the second semiconductor layer in FIG. 14*a*.

In an exemplary embodiment, the pattern of the second semiconductor layer of each sub-pixel includes at least: the eighth active layer 18 of the eighth transistor T8.

In an exemplary embodiment, the shape of the eighth active layer 18 may be an "I" shape, and the orthographic projection of the eighth active layer 18 on the substrate overlaps at least partially the orthographic projection of the lower gate electrode 31-1 on the substrate.

In an exemplary embodiment, the first region 18-1 of the eighth active layer 18 may be located on one side of the lower gate electrode 31-1 away from the second electrode plate 32, and the second region 12-2 of the eighth active layer 18 may be located on one side of the lower gate electrode 31-1 close to the second electrode plate 32.

In an exemplary embodiment, oxide may be used for the second semiconductor layer, that is, the eighth transistor T8 is an oxide transistor. In a possible embodiment, the second semiconductor thin film may be made of indium gallium zinc oxide (IGZO), wherein the indium gallium zinc oxide (IGZO) has higher electron mobility than amorphous silicon.

Figure 15A:
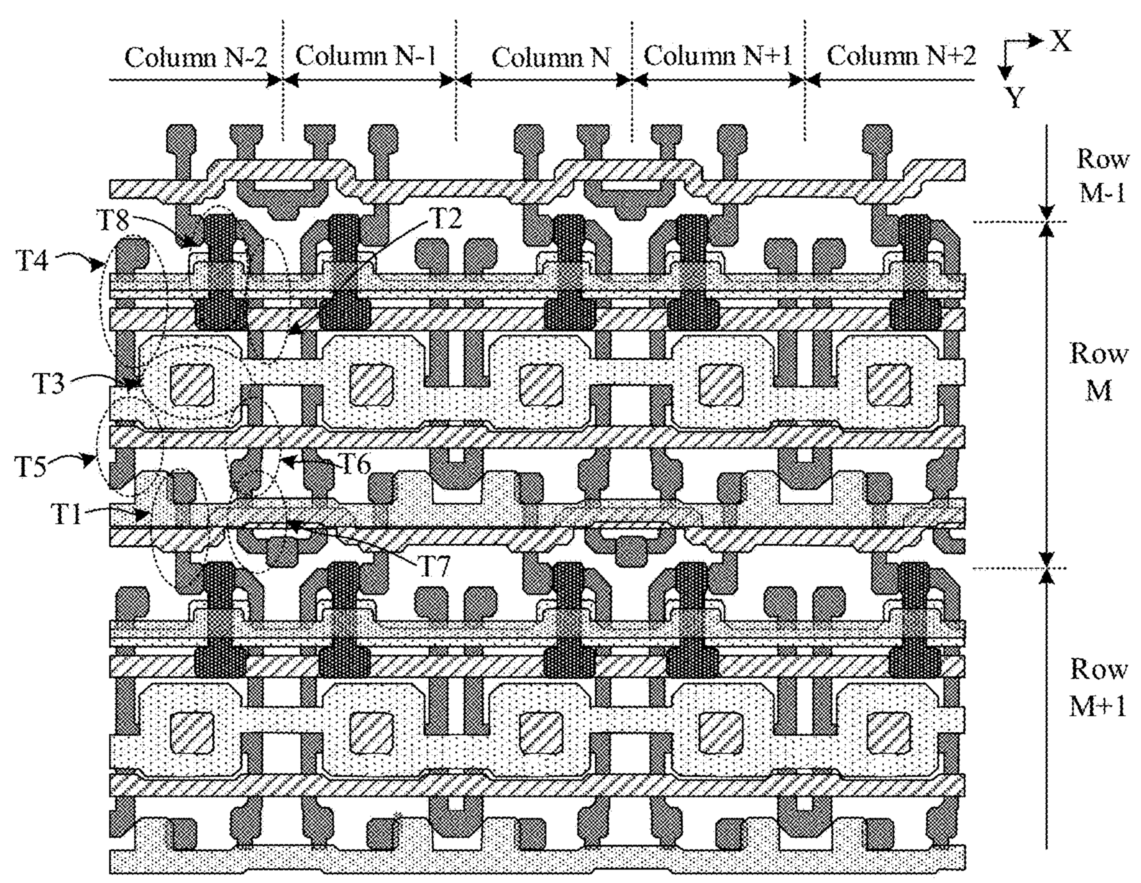
FIG. 15*a* and FIG. 15*b* are schematic diagrams obtained after a pattern of a third conductive layer is formed according to an embodiment of the present disclosure.
Figure 15B:
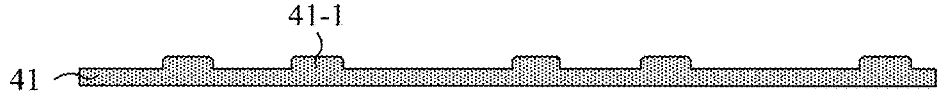
Figure 15B:
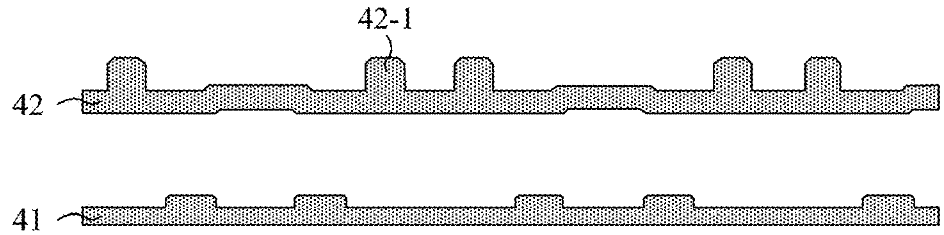
Figure 15B:
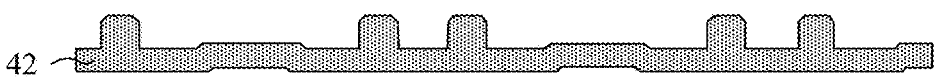

(6) A pattern of a third conductive layer is formed. In an exemplary embodiment, forming a pattern of a third conductive layer may include: sequentially depositing a fifth insulation thin film and a third conductive thin film on the substrate on which the above-mentioned pattern is formed, and patterning the third conductive thin film through a patterning process to form a fifth insulation layer that covers the second semiconductor layer and form a pattern of the third conductive layer disposed on the fifth insulation layer, as shown in FIG. 15*a* and FIG. 15*b*, and FIG. 15*b* is a planar schematic diagram of the third conductive layer in FIG. 15*a*. In an exemplary embodiment, a third conductive layer may be referred to as a third gate metal (GATE3) layer.

In an exemplary embodiment, the pattern of the third conductive layer of each sub-pixel includes at least a third scan signal line 41 and a first initial signal line 42.

In an exemplary embodiment, the shape of the third scan signal line 41 may be a line shape in which the main body part extends along the first direction X, the third scan signal line 41 in the Mth row sub-pixel may be located on the side of the first scan signal line 21 of the local sub-pixel away from the M+1 row sub-pixel, the third scan signal line 41 of each sub-pixel is provided with an upper gate electrode 41-1, which may be located on a side of the third scan signal line 41 away from the first scan signal line 21. The upper gate electrode 41-1 overlaps at least partially with the eighth active layer of the sub-pixel, and is configured as an upper gate electrode of the eighth transistor T8.

In an exemplary embodiment, the shape of the first initial signal line 42 may be a line shape in which the main body part extends along the first direction X, the first initial signal line 42 in the Mth row of sub-pixels may be located on the side of the emitting control line 23 of the sub-pixel near the M+1 row of sub-pixels, the third scan signal line 41 of each sub-pixel is provided with a connection block 42-1, which may be located on one side of the emitting control line 23 of the first initial signal line 42. The connection block 42-1 is configured to be connected to a first region of the first active layer through a first electrode of the first transistor T1 which is subsequently formed.

Figure 16:
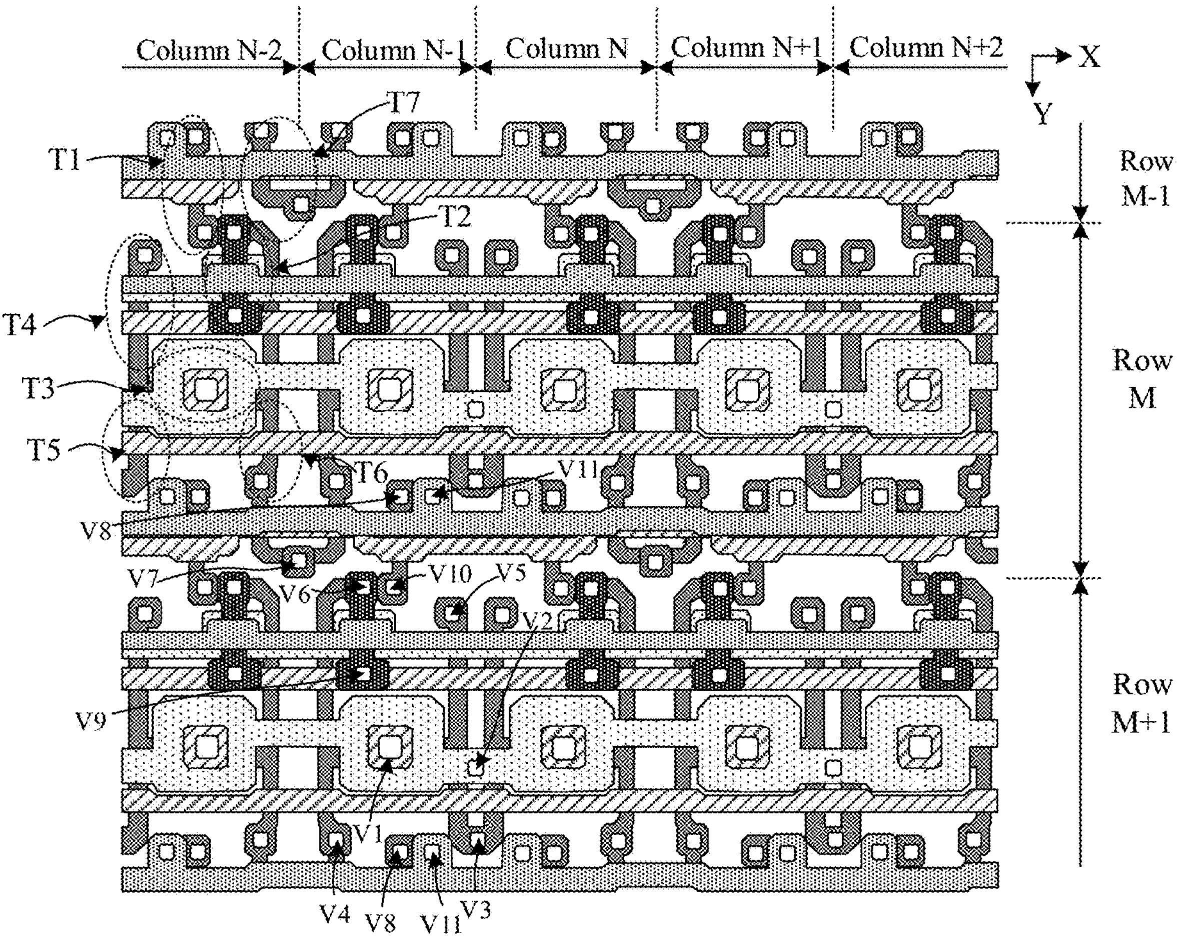
FIG. 16 is a schematic diagram after formation of a pattern of a sixth insulation layer according to an embodiment of the present disclosure.

(7) A pattern of a sixth insulation layer is formed. In an exemplary embodiment, forming a pattern of a sixth insulation layer may include: depositing a sixth insulation thin film on the substrate on which the aforementioned patterns are formed, and patterning the sixth insulation thin film through a patterning process to form a sixth insulation layer covering the third conductive layer. Multiple via holes are provided on the sixth insulation layer, as shown in FIG. 16.

In an exemplary embodiment, the multiple via holes of each sub-pixel includes at least a first via hole V1, a second via hole V2, a third via hole V3, a fourth via hole V4, a fifth via hole V5, a sixth via hole V6, a seventh via hole V7, an eighth via hole V8, a ninth via hole V9, a tenth via hole V10, and an eleventh via hole V11.

In an exemplary embodiment, an orthographic projection of the first via hole V1 on the substrate is located within a range of the orthographic projection of the opening 33 on the substrate. The sixth insulation layer, the fifth insulation layer, the fourth insulation layer, and the third insulation layer in the first via hole V1 are etched off to expose a surface of the first electrode plate 24. The first via hole V1 is configured to allow a second electrode of a subsequently formed eighth transistor T8 to be connected with the first electrode plate 24 through the via hole V1.

In an exemplary embodiment, the second via hole V2 is located within the range of the orthographic projection of the first connection strip 34 connecting the adjacent second electrode plates 32 on the substrate. The sixth insulation layer, the fifth insulation layer and the fourth insulation layer in the second via hole V2 are etched away, exposing the surface of the first connection strip 34. The second via hole V2 is configured to connect the first electrode of the subsequently formed fifth transistor T5 to the first connection strip 34 through the via hole.

In an exemplary embodiment, the orthographic projection of the third via hole V3 on the substrate is within the range of the orthographic projection of the first region of the fifth active layer on the substrate. The sixth insulation layer, the fifth insulation layer, the fourth insulation layer, the third insulation layer and the second insulation layer in the third via hole V3 are etched away, exposing the surface of the first region of the fifth active layer, The third via hole V3 is configured to connect the first electrode of the subsequently formed fifth transistor T5 to the first region of the fifth active layer through the via hole.

In an exemplary embodiment, the orthographic projection of the fourth via hole V4 on the substrate is within the range of the orthographic projection of the second region of the sixth active layer on the substrate, the sixth insulation layer, the fifth insulation layer, the fourth insulation layer, the third insulation layer and the second insulation layer in the fourth via hole V4 are etched away, exposing a surface of a second region of the sixth active layer (which is also a second region of the seventh active layer). The fourth via hole V4 is configured to connect the second electrode of the subsequently formed sixth transistor T6 to the second region of the sixth active layer through the via hole V4, and to connect the second electrode of the subsequently formed seventh transistor T7 to the second region of the seventh active layer through the via hole V4.

In an exemplary embodiment, the orthographic projection of the fifth via hole V5 on the substrate is within the range of the orthographic projection of the first region of the fourth active layer on the substrate. The sixth insulation layer, the fifth insulation layer, the fourth insulation layer, the third insulation layer and the second insulation layer in the fifth via hole V5 are etched away, exposing the surface of the first region of the fourth active layer. The fifth via hole V5 is configured to connect a first electrode of the fourth transistor T4 subsequently formed to the first region of the fourth active layer through the via hole V5.

In an exemplary embodiment, the orthographic projection of the sixth via hole V6 on the substrate is within the range of the orthographic projection of the first region of the eighth active layer on the substrate. The sixth insulation layer and the fifth insulation layer in the sixth via hole V6 are etched away, exposing the surface of the first region of the eighth active layer. The sixth via hole V6 is configured to connect the first electrode of the subsequently formed eighth transistor T8 to the first region of the eighth active layer through the via hole.

In an exemplary embodiment, the orthographic projection of the seventh via hole V7 on the substrate is within the range of the orthographic projection of the first region of the seventh active layer on the substrate. The sixth insulation layer, the fifth insulation layer, the fourth insulation layer, the third insulation layer and the second insulation layer in the seventh via hole V7 are etched away, exposing the surface of the first region of the seventh active layer. The seventh via hole V7 is configured to connect the first electrode of the subsequently formed seventh transistor T7 to the first region of the seventh active layer through the via hole.

In an exemplary embodiment, the orthographic projection of the eighth via hole V8 on the substrate is within the range of the orthographic projection of the first region of the first active layer on the substrate. The sixth insulation layer, the fifth insulation layer, the fourth insulation layer, the third insulation layer and the second insulation layer in the eighth via hole V8 are etched away, exposing the surface of the first region of the first active layer. The eighth via hole V8 is configured to connect the first electrode of the subsequently formed first transistor T1 to the first region of the first active layer through the via hole.

In an exemplary embodiment, the orthographic projection of the ninth via hole V9 on the substrate is within the range of the orthographic projection of the second region of the eighth active layer on the substrate. The sixth insulation layer and the fifth insulation layer in the ninth via hole V9 are etched away, exposing the surface of the second region of the eighth active layer. The ninth via hole V9 is configured to connect the second electrode of the subsequently formed eighth transistor T8 to the second region of the eighth active layer through the via hole.

In an exemplary embodiment, the orthographic projection of the tenth via hole V10 on the substrate is within the range of the orthographic projection of the second region of the first active layer on the substrate. The sixth insulation layer, the fifth insulation layer, the fourth insulation layer, the third insulation layer and the second insulation layer in the tenth via hole V10 are etched away, exposing the surface of the second region of the first active layer (also the first region of the second active layer). The tenth via hole V10 is configured to connect the second electrode of the subsequently formed first transistor T1 (also the first electrode of the second transistor T2) to the second region of the first active layer through the via hole.

In an exemplary embodiment, the orthographic projection of the eleventh via hole V11 on the substrate is within the range of the orthographic projection of the connection block 42-1 on the first initial signal line 42 on the substrate. The sixth insulation layer in the eleventh via V11 is etched away, exposing the surface of the connection electrode 42-1. The eleventh via hole V11 is configured to connect a first electrode of the first transistor T1 subsequently formed to the first initial signal line 42 through the via hole.

Figure 17A:
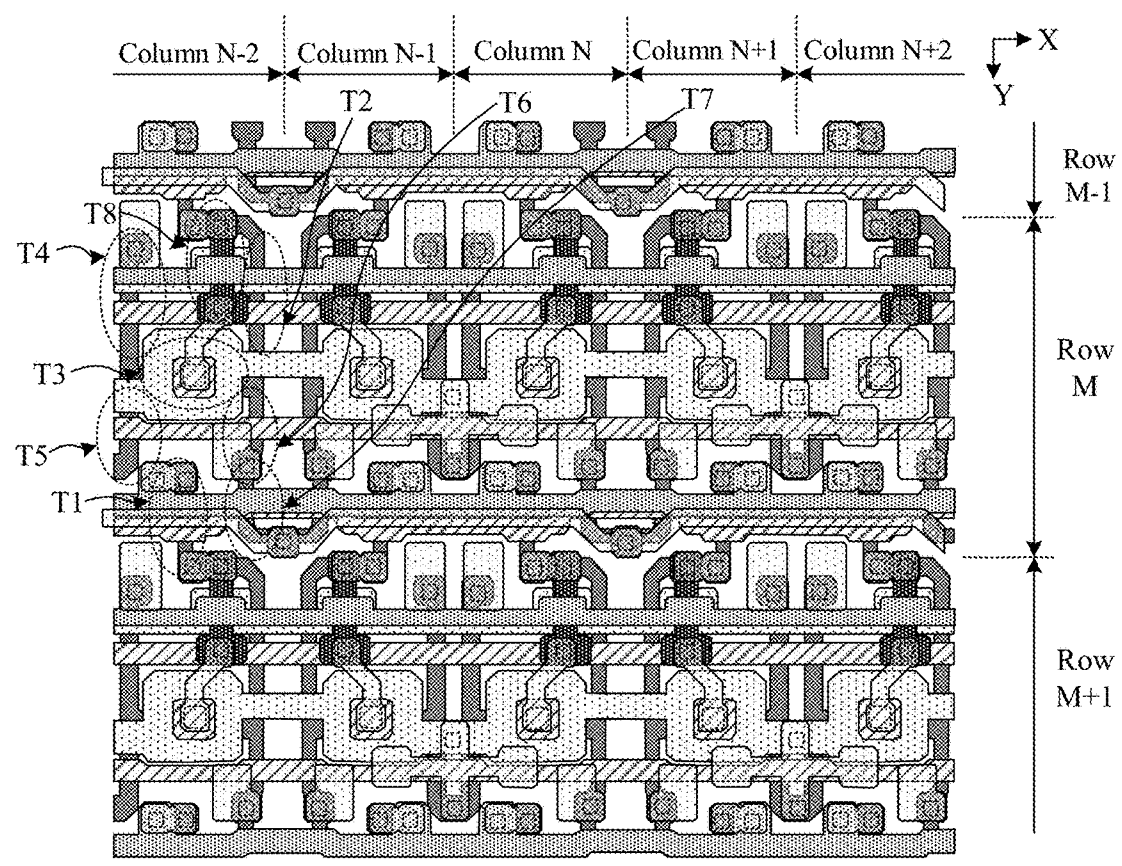
FIG. 17*a* and FIG. 17*b* are schematic diagrams obtained after a pattern of a fourth conductive layer is formed according to an embodiment of the present disclosure.
Figure 17B:
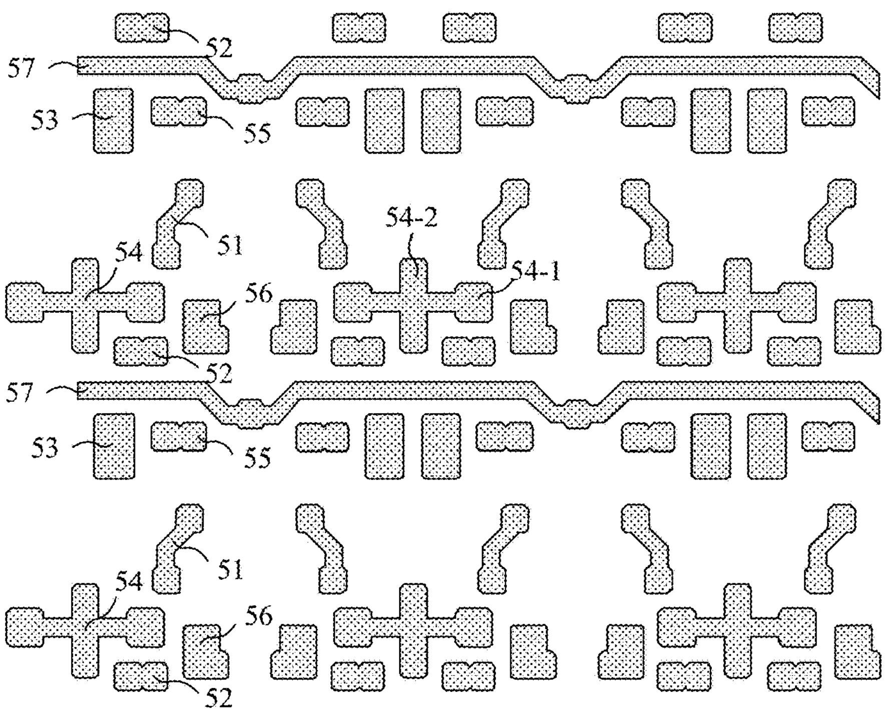

(8) A pattern of a fourth conductive layer is formed. In an exemplary embodiment, forming a fourth conductive layer may include: depositing a fourth conductive thin film on the substrate on which the aforementioned patterns are formed, and patterning the fourth conductive thin film through a patterning process to form a fourth conductive layer disposed on the sixth insulation layer, as shown in FIG. 17*a* and FIG. 17*b*, FIG. 17*b* is a schematic plan view of the fourth conductive layer in FIG. 17*a*. In an exemplary embodiment, the fourth conductive layer may be referred to as a first source drain metal (SD1) layer.

In an exemplary embodiment, the fourth conductive layer of each sub-pixel includes at least: a first connection electrode 51, a second connection electrode 52, a third connection electrode 53, a fourth connection electrode 54, a fifth connection electrode 55, a sixth connection electrode 56 and a second initial signal line 57.

In an exemplary embodiment, the shape of the first connection electrode 51 may be a zigzag shape in which the main body part extends in the second direction Y, the first terminal of the first connection electrode 51 is connected to the first electrode plate 24 through a first via hole V1, and the second terminal of the first connection electrode 51 is connected to the second region of the eighth active layer through a ninth via hole V9, so that the first electrode plate 24 and the second electrode of the eighth transistor T8 have the same potential. In an exemplary embodiment, the first connection electrode 51 may serve as the second electrode of the eighth transistor T8.

In an exemplary embodiment, the shape of the second connection electrode 52 may be rectangular, the first terminal of the second connection electrode 52 is connected to the first initial signal line 42 through an eleventh via hole V11, and the second terminal of the second connection electrode 52 is connected to the first region of the first active layer through an eighth via hole V8, so that a first initial voltage transmitted by the first initial signal line 42 is written into the first transistor T1. In an exemplary embodiment, the second connection electrode 52 may serve as the first electrode of the first transistor T1.

In an exemplary embodiment, the shape of the third connection electrode 53 may be rectangular, and the third connection electrode 53 is connected to the first region of the fourth active layer through the fifth via hole V5. In an exemplary embodiment, the third connection electrode 53 may serve as the first electrode of the fourth transistor T4 and is configured to be connected to a subsequently formed data signal line.

In an exemplary embodiment, the fourth connection electrode 54 may have a "T" shape that includes a first sub-electrode 54-1 and a second sub-electrode 54-2. The first sub-electrode 54-1 may be in a strip shape extending along the first direction X, and the second sub-electrode 54-2 may be in a strip shape extending along the second direction Y. The first terminal of the first sub-electrode 54-1 is connected to the middle part of the second sub-electrode 54-2, and the second terminal of the first sub-electrode 54-1 extends in a direction away from the second sub-electrode 54-2. Among the fourth connection electrodes 54, the first terminal of the second sub-electrode 54-2 is connected to the first connection strip 34 through a second via hole V2, and the second terminal of the second sub-electrode 54-2 is connected to the first region of the fifth active layer through a third via hole V3. In an exemplary embodiment, the fourth connection electrode 54 can serve as the first electrode of the fifth transistor T5, and the first sub-electrode 54-1 of the fourth connection electrode 54 is configured to be connected to the first power supply line formed subsequently. Since the first connection strip 34 connects the adjacent second electrode plate 32, it is achieved that the first electrode of the fifth transistor T5 and the second electrode plate 32 of the storage capacitor in the sub-pixel have the same potential.

In an exemplary embodiment, in each pixel row, the fourth connection electrode 54 of the N−1 column and the fourth connection electrode 54 of the Nth column may be an integrated structure connected to each other, and the fourth connection electrode 54 of the N+1 column and the fourth connection electrode 54 of the N+2 column may be an integrated structure connected to each other. In an exemplary embodiment, since the fourth connection electrode 54 in each sub-pixel is connected to the first power supply line formed subsequently, by forming the fourth connection electrodes 54 of adjacent sub-pixels into an integral structure connected to each other, the fourth connection electrodes 54 of adjacent sub-pixels can be guaranteed to have the same potential. Therefore, the first electrodes of the fifth transistor T5 in the adjacent sub-pixels has the same potential, and the second electrodes 32 in the storage capacitors in the adjacent sub-pixels have the same potential, which is beneficial to improving the uniformity of the panel, avoiding poor display of the display substrate and ensuring the display effect of the display substrate.

In an exemplary embodiment, the shape of the fifth connection electrode 55 may be rectangular, the first terminal of the fifth connection electrode 55 is connected to the second region of the first active layer through a tenth via hole V10, and the second terminal of the fifth connection electrode 55 is connected to the first region of the eighth active layer through a sixth via hole V6. In an exemplary embodiment, the fifth connection electrode 55 can serve as the second electrode of the first transistor T1, the first electrode of the second transistor T2 and the first electrode of the eighth transistor T8 at the same time.

In an exemplary embodiment, the shape of the sixth connection electrode 56 may be rectangular, and the sixth connection electrode 56 is connected to the second region of the sixth active layer (also the second region of the seventh active layer) through the fourth via hole V4. In an exemplary embodiment, the sixth connection electrode 56 may serve as a second electrode of the sixth transistor T6 and a second electrode of the seventh transistor T7 at the same time, and the sixth connection electrode 56 is configured to be connected with the eleventh connection electrode formed subsequently.

In an exemplary embodiment, the second initial signal line 57 may be a zigzag shape in which the main body part extends along the first direction X, the second initial signal line 57 is connected to a first region of multiple seventh active layers through multiple seventh via holes V7 in a pixel row, and an initial voltage is written to multiple seventh transistors T7 in a pixel row. In an exemplary embodiment, since the second initial signal line 57 is connected to the first regions of all the seventh active layers in a pixel row, the first electrodes of all the seventh transistors T7 in a pixel row can be guaranteed to have the same potential, which is beneficial to improving the uniformity of the panel, avoiding poor display of the display substrate and ensuring the display effect of the display substrate.

Figure 18:
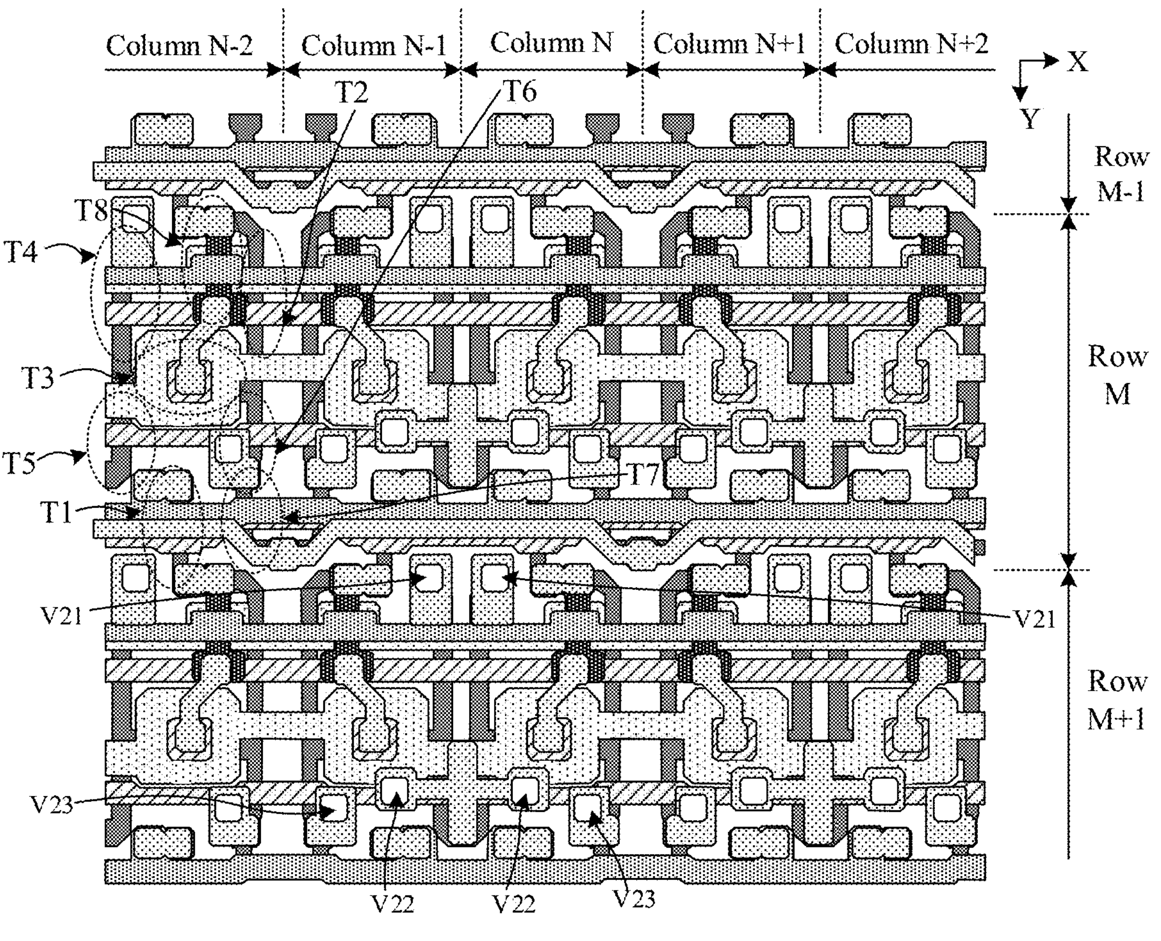
FIG. 18 is a schematic diagram after a pattern of a first planarization layer is formed according to an embodiment of the present disclosure.

(9) A pattern of a first planarization layer is formed. In an exemplary embodiment, forming a pattern of a first planarization layer may include: first depositing the seventh insulation thin film on the substrate on which the aforementioned patterns are formed, and then coating the first planarization thin film, patterning the first planarization thin film and the seventh insulation thin film through a patterning process to form a seventh insulation layer covering the pattern of the fourth conductive layer and a first planarization layer disposed on the seventh insulation layer. Multiple via holes are provided on the first planarization layer, as shown in FIG. 18.

In an exemplary embodiment, the multiple via holes in each sub-pixel include at least a twenty-first via hole V21, a twenty-second via hole V22, and a twenty-third via hole V23.

In an exemplary embodiment, an orthographic projection of the twenty-first via hole V21 on the substrate is located within the range of the orthographic projection of a third connection electrode 53, the first planarization layer and the seventh insulation layer in the twenty-first via hole V21 are etched away to expose a surface of the third connection electrode 53, and the twenty-first via hole V21 is configured such that a data signal line formed subsequently is connected to the third connection electrode 53 through the twenty-first via hole V21.

In an exemplary embodiment, the orthographic projection of the twenty-second via hole V22 on the substrate is within the range of the orthographic projection of the first sub-electrode 54-1 of the fourth connection electrode 54 on the substrate. The first planarization layer and the seventh insulation layer in the twenty-second via hole V22 are etched away, exposing the surface of the first sub-electrode 54-1. The twenty-second via hole V22 is configured to connect the subsequently formed first power supply line to the fourth connection electrode 54.

In an exemplary embodiment, the orthographic projection of the twenty-third via hole V23 on the substrate is within the range of the orthographic projection of the sixth connection electrode 56 on the substrate. The first planarization layer and the seventh insulation layer in the twenty-third via hole V23 are etched away, exposing the surface of the sixth connection electrode 56. The twenty-third via hole V232 is configured to connect the subsequently formed eleventh connection electrode to the sixth connection electrode 56.

Figure 19A:
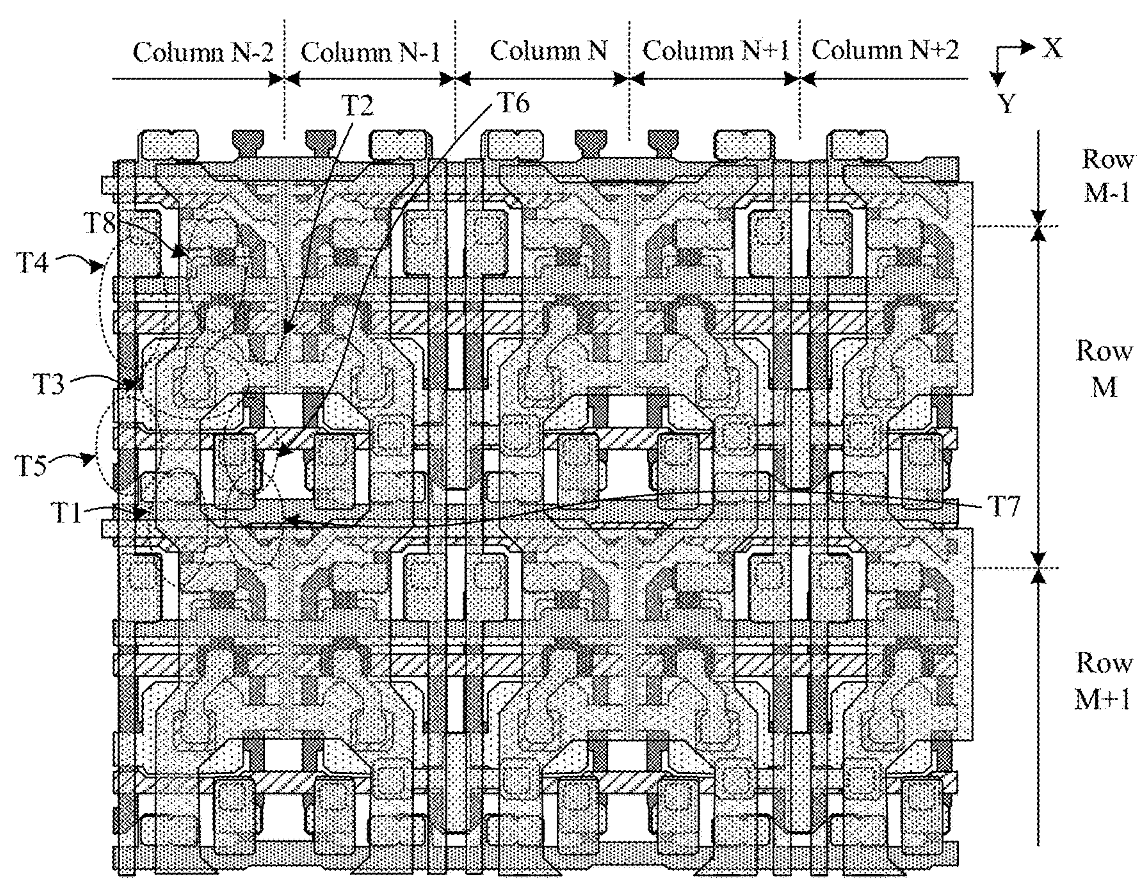
FIG. 19*a* and FIG. 19*b* are schematic diagrams obtained after a pattern of a fifth conductive layer is formed according to an embodiment of the present disclosure.
Figure 19B:
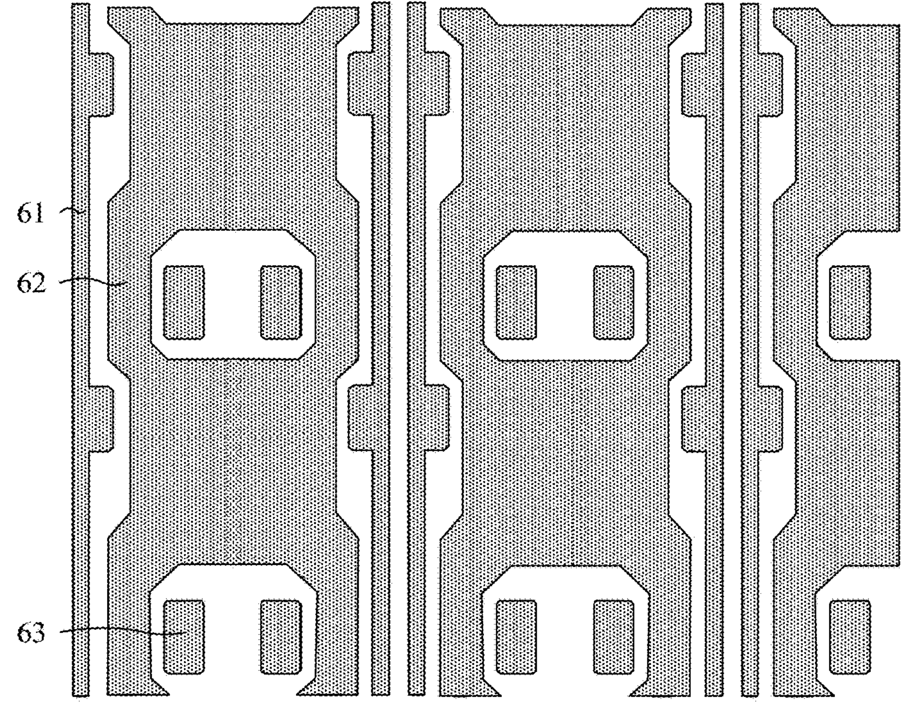

(10) A pattern of a fifth conductive layer is formed. In an exemplary embodiment, forming the fifth conductive layer may include: depositing a fifth conductive thin film on the substrate on which the aforementioned patterns are formed, and patterning the fifth conductive thin film through a patterning process to form a fifth conductive layer disposed on the first planarization layer, as shown in FIG. 19*a* and FIG. 19*b*, and FIG. 19*b* is a schematic plan view of the fifth conductive layer in FIG. 19*a*. In an exemplary embodiment, the fifth conductive layer may be referred to as a second source drain metal (SD2) layer.

In an exemplary embodiment, the fifth conductive layer of each sub-pixel includes at least a data signal line 61, a first power supply line 62, and an eleventh connection electrode 63.

In the exemplary embodiment, the shape of the data signal line 61 may be a linear shape in which the main body part extends in the second direction Y, and the data signal line 61 is connected to the third connection electrode 53 through the twenty-first via hole V21. Since the third connection electrode 53 is connected to the first region of the fourth active layer through the via hole, the connection between the data signal line 61 and the first electrode of the fourth transistor T4 is achieved, and the data signal is written into the fourth transistor T4.

In an exemplary embodiment, the shape of the first power supply line 62 may be a zigzag shape in which the main body part extends along the second direction Y, and the first power supply line 62 is connected to the first sub-electrode 54-1 of the fourth connection electrode 54 through the twenty-second via hole V22. Since the fourth connection electrode 54 is connected to the second electrode plate 32 and the first region of the fifth active layer through a via hole, respectively, the first power supply line 62 is connected to the second electrode plate 32 and the first electrode of the fifth transistor T5, and a power supply signal is written to the fifth transistor T5.

In an exemplary embodiment, the first power supply lines 62 in two adjacent sub-pixels in one pixel row may be an integral structure connected to each other. For example, the first power supply line 62 of the N−2 column and the first power supply line 62 of the N−1 column are connected to each other, and the first power supply line 62 of the N+1 column and the first power supply line 62 of the N+1 column are connected to each other. In an exemplary embodiment, by forming the first power supply lines 62 of adjacent sub-pixels into an integral structure connected to each other, it can be ensured that the first power supply lines 62 of adjacent sub-pixels have the same potential. It is beneficial to improve the uniformity of the panel, avoid display defects of the display substrate, and ensure the display effect of the display substrate.

In an exemplary embodiment, the first power supply line 62 may be a zigzag line with unequal width, which not only facilitates the layout of the pixel structure, but also reduces the parasitic capacitance between the first power supply line and the data signal line.

In an exemplary embodiment, an orthographic projection of the first power supply line 62 on the substrate may at least partially overlap an orthographic projection of the first connection electrode 51 on the substrate, an orthographic projection of the first power supply line 62 on the substrate may at least partially overlap an orthographic projection of the second connection electrode 52 on the substrate, and an orthographic projection of the first power supply line 62 on the substrate may at least partially overlap an orthographic projection of the fifth connection electrode 55 on the substrate, so that the first power supply line 62 can be used as a shield electrode, which can effectively shield the influence of data voltage jump on key nodes in the pixel drive circuit, avoid the influence of data voltage jump on the potential of key nodes in the pixel drive circuit, and improve the display effect.

In an exemplary embodiment, the shape of the eleventh connection electrode 63 may be rectangular. The eleventh connection electrode 63 is connected to the sixth connection electrode 56 through the twenty-third via hole V23, and the eleventh connection electrode 63 is configured to be connected to the subsequently formed twenty-first connection electrode.

Figure 20A:
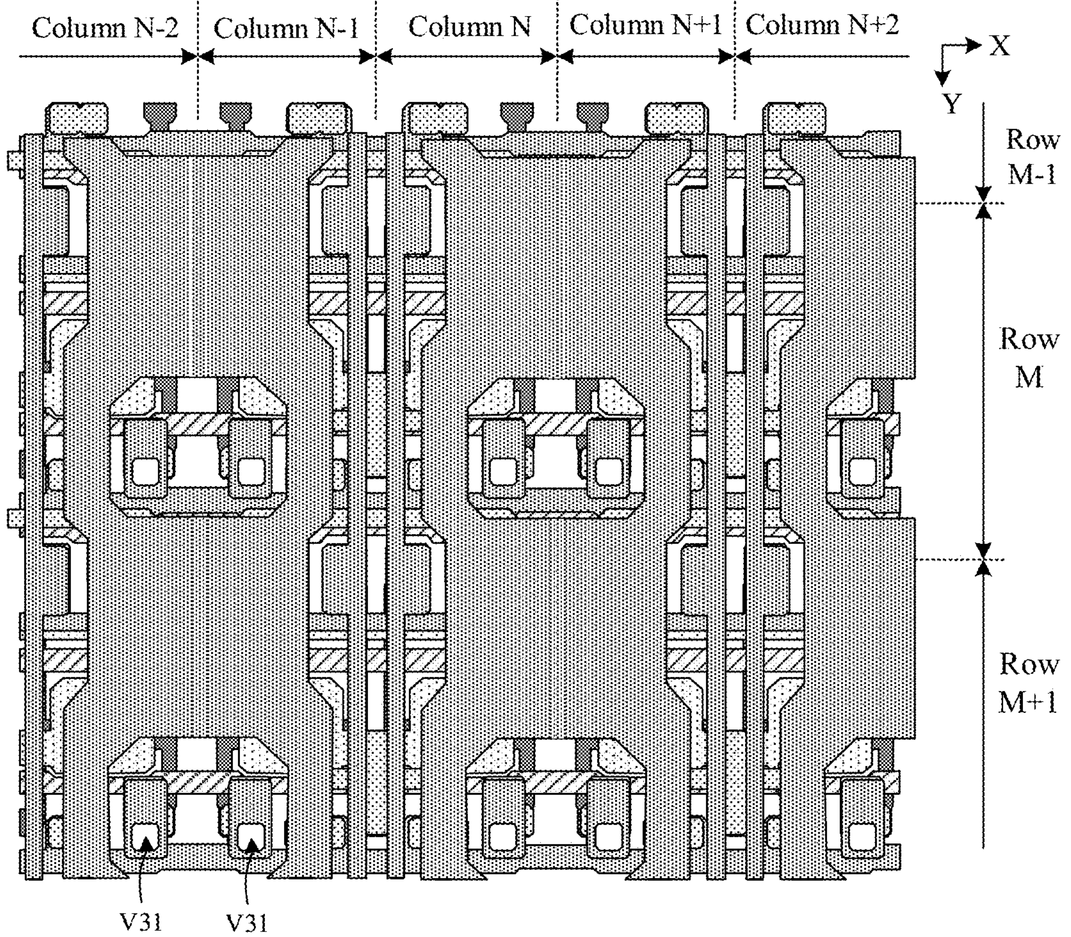
FIGS. 20*a* and 20*b* are schematic diagrams after a pattern of a second planarization layer is formed according to an embodiment of the present disclosure.
Figure 20B:
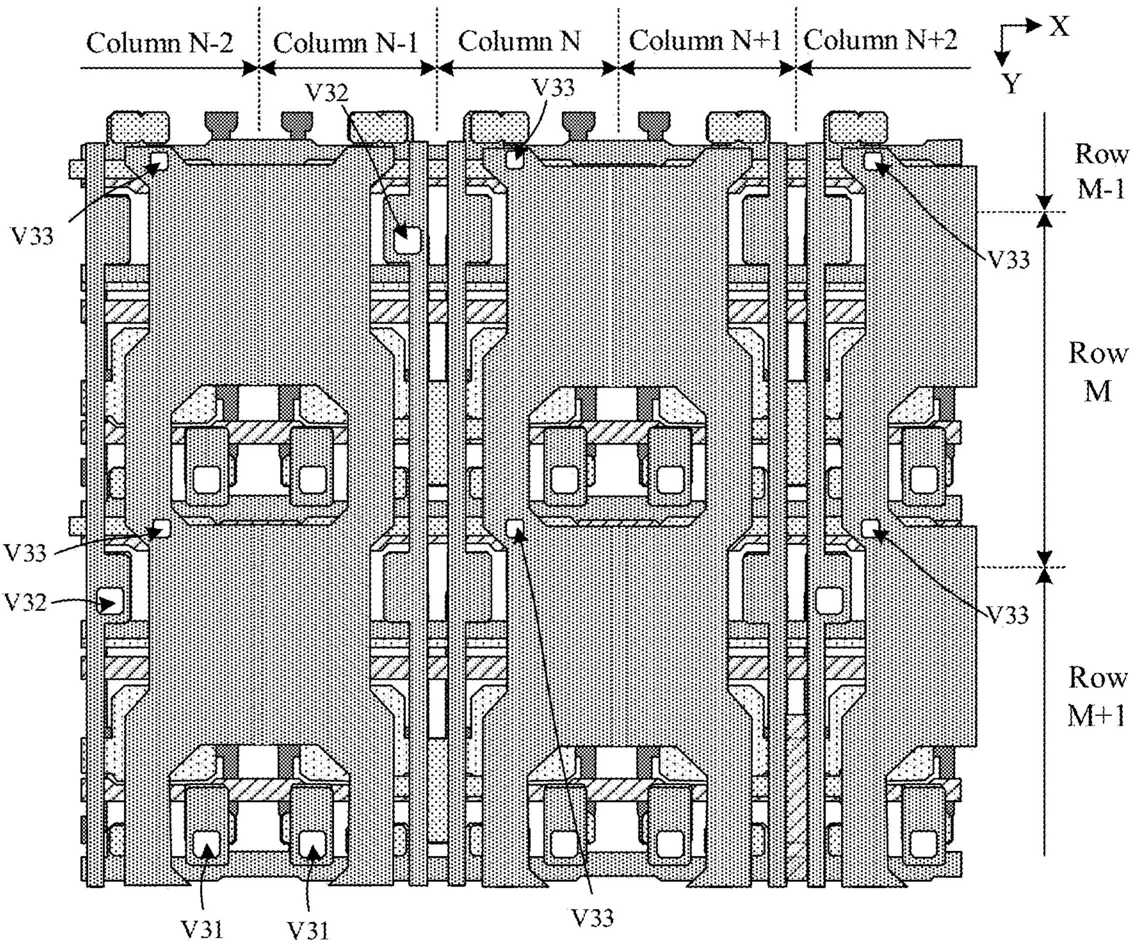

(11) A pattern of a second planarization layer is formed. In an exemplary embodiment, forming of the pattern of the second planarization layer may include: coating a second planarization thin film on the substrate on which the aforementioned patterns are formed, and patterning the second planarization thin film through a patterning process to form the second planarization layer covering the pattern of the fifth conductive layer. The second planarization layer is provided with multiple via holes, as shown in FIG. 20*a* and FIG. 20*b*. FIG. 20*a* is a schematic plan view of B region in FIG. 9*c*, and FIG. 20*b* is a schematic plan view of C region in FIG. 9*c*.

In an exemplary embodiment, the via hole of each sub-pixel in the B region and the C region includes at least a thirty-first via hole V31.

In an exemplary embodiment, the orthographic projection of the thirty-first via hole V31 on the substrate is within the range of the orthographic projection of the eleventh connection electrode 63 on the substrate. The second planarization layer in the thirty-first via hole V31 is removed, exposing the surface of the eleventh connection electrode 63. The thirty-first via hole V31 is configured to connect the subsequently formed twenty-first connection electrode to the eleventh connection electrode 63 through the via hole.

In an exemplary embodiment, a thirty-second via hole V32 is also included in the C region.

In an exemplary embodiment, the orthographic projection of the thirty-second via hole V32 on the substrate is within the range of the orthographic projection of the data signal line 61 on the substrate. The second planarization layer in the thirty-second via hole V32 is removed, exposing the surface of the data signal line 61. The thirty-second via hole V32 is configured to connect the subsequently formed data fanout line to the data signal line 61 through the via hole.

In an exemplary embodiment, the thirty-second via hole V32 may be provided in part of the sub-pixels. For example, in the Mth row sub-pixel, the thirty-second via hole V32 is provided in the N−1 row sub-pixel. In another example, in the M+1 row sub-pixels, the thirty-second via holes V32 are provided in the N−2 column sub-pixels and the N+2 column sub-pixels.

In an exemplary embodiment, a thirty-third via hole V33 may also be included in the B region.

In an exemplary embodiment, the orthographic projection of the thirty-third via hole V33 on the substrate is within the range of the orthographic projection of the first power supply line 62 on the substrate. The second planarization layer in the thirty-third via hole V33 is removed, exposing the surface of the first power supply line 62. The thirty-third via hole V33 is configured to connect a subsequently formed dummy line to the first power supply line 62 through the via hole.

In an exemplary embodiment, the orthographic projection of the thirty-third via hole V33 on the substrate and the orthographic projection of the anode formed subsequently on the substrate do not overlap, so that the thirty-third via hole V33 connecting the dummy line and the first power supply line does not affect the flatness of the anode formed subsequently.

In an exemplary embodiment, the thirty-third via hole V33 may be provided in each sub-pixel or may be provided in part of the sub-pixels, and the present disclosure is not limited herein.

Figure 21A:
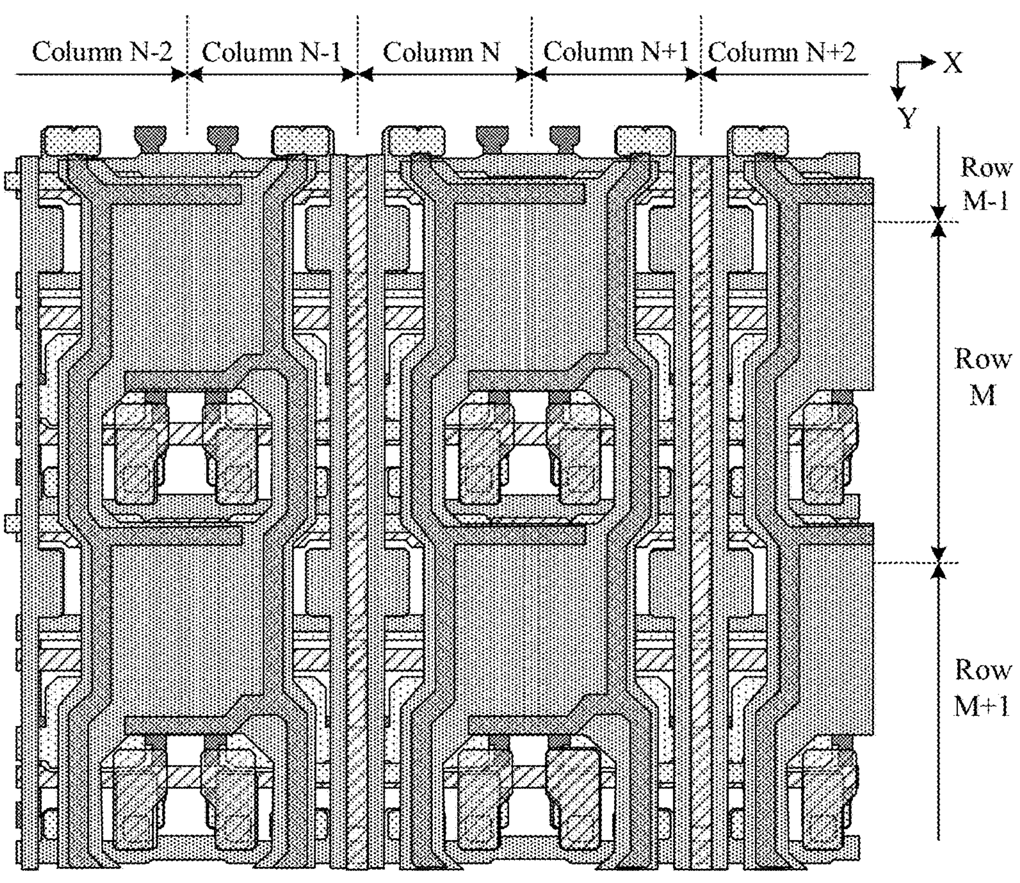
FIGS. 21*a* and 21*b* are schematic diagrams after a pattern of a sixth conductive layer is formed in the first lead region of the present disclosure.
Figure 21B:
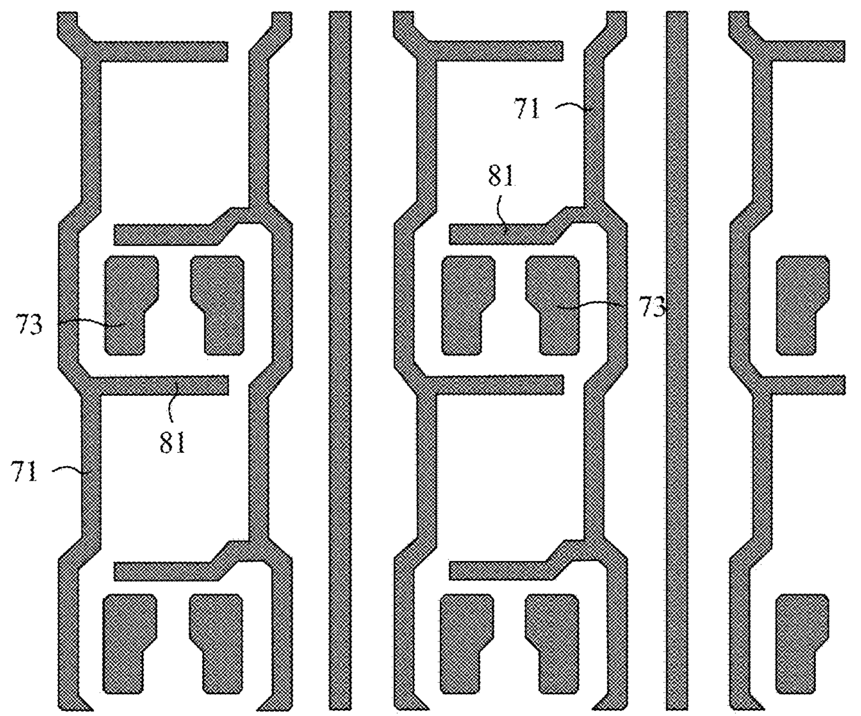
Figures 22A, 22B:
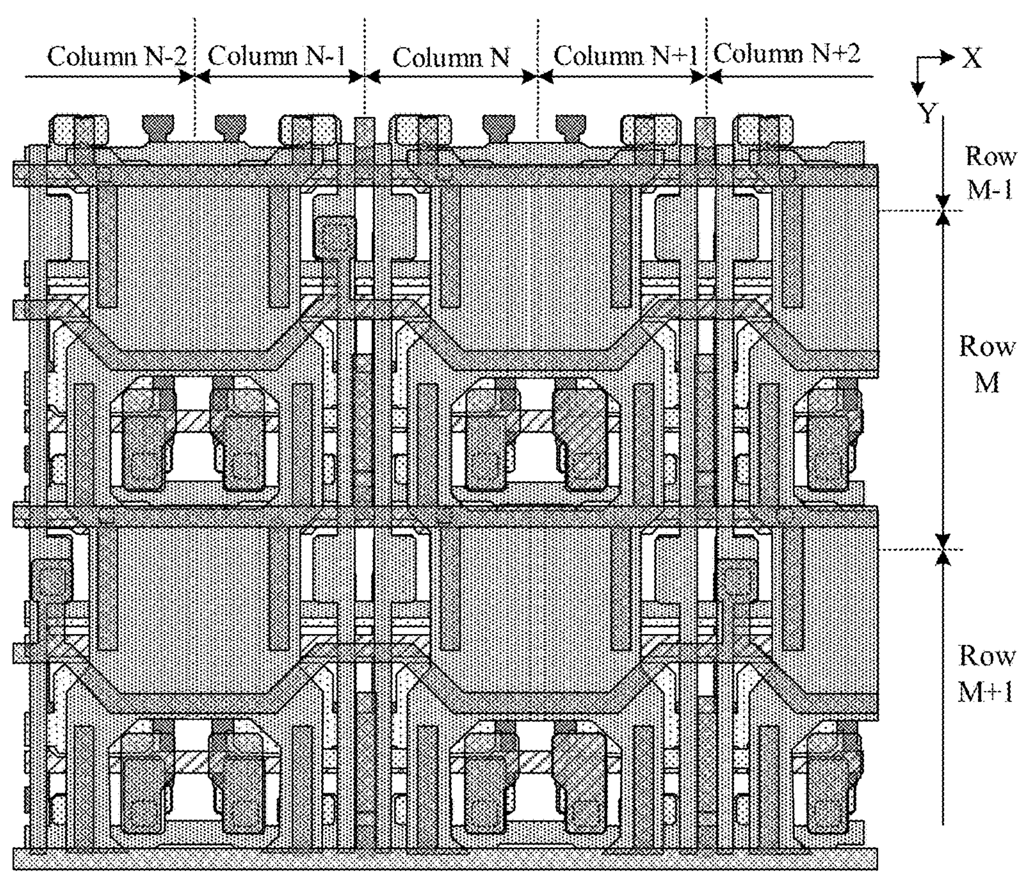
FIG. 22*a* and FIG. 22*b* are schematic diagrams after a pattern of a sixth conductive layer is formed in the second lead region of the present disclosure.

(12) A pattern of a sixth conductive layer is formed. In an exemplary embodiment, forming the sixth conductive layer may include: depositing a sixth conductive thin film on the substrate on which the aforementioned patterns are formed, patterning the sixth conductive thin film through a patterning process to form a sixth conductive layer disposed on the second planarization layer, as shown in FIGS. 21*a*, 21*b*, 22*a* and 22*b*, wherein FIG. 21*a* is an enlarged view of the B region in FIG. 9*c*, FIG. 21*b* is a planar diagram of the sixth conductive layer in FIG. 21*a*, FIG. 22*a* is an enlarged view of the C region in FIG. 9*c*, and FIG. 22*b* is a planar diagram of the sixth conductive layer in FIG. 22*a*. In an exemplary embodiment, the fifth conductive layer may be referred to as a third source drain metal (SD3) layer.

In an exemplary embodiment, the sixth conductive layer of each sub-pixel in the B region and the C region includes at least the twenty-first connection electrode 73.

In an exemplary embodiment, the shape of the twenty-first connection electrode 73 may be rectangular. The twenty-first connection electrode 73 is connected to the eleventh connection electrode 63 through the thirty-first via hole V31, and the twenty-first connection electrode 73 is configured to connect the subsequently formed anode. Since the twenty-first connection electrode 73 is connected to the eleventh connection electrode 63 through a via hole, the eleventh connection electrode 63 is connected to the sixth connection electrode 56 through a via hole, and the sixth connection electrode 56 is connected to the second region of the sixth active layer (also the second region of the seventh active layer) through the via hole, the anode formed subsequently can be connected to the second electrode of the sixth transistor T6 and the second electrode of the seventh transistor T7. In an exemplary embodiment, the twenty-first connection electrode 73 may be referred to as an anode connection electrode and the thirty-first via hole V31 may be referred to as an anode via hole.

In an exemplary embodiment, the sixth conductive layer of each sub-pixel in the B region may further include a first wiring 71 and a first compensation line 81.

In an exemplary embodiment, the shape of the first wiring 71 in the data fanout line may be a straight line shape or a zigzag line shape in which the main body part extends in the second direction Y. The first terminal of the first wiring 71 is connected to a bonding lead line of the bonding region, and the second terminal of the first wiring 71 is connected to the first terminal of the second wiring 72 of the data fanout lines after extending in the opposite direction of the second direction Y toward the display region.

In an exemplary embodiment, the shape of the first compensation line 81 may be a straight line or a zigzag line in which the main body part extends along the first direction X, the first terminal of the first compensation line 81 is connected to the first wiring 71, and the second terminal of the first compensation line 81 extends in a direction away from the first compensation line 81 along the first direction X or the opposite direction of the first direction X.

In an exemplary embodiment, the sixth conductive layer of each sub-pixel in the C region further includes a second wiring 72, a dummy line 80, and a second compensation line 82.

In an exemplary embodiment, the second wiring 72 in the data fanout line may include a wiring main body part 72-1 and an adapter part 72-2. The wiring main body part 72-1 may have a straight line shape or a zigzag line shape in which the main body part extends along the first direction X, a first terminal of the wiring main body part 72-1 is connected to the second terminal of the first wiring 71, and the second terminal of the wiring main body part 72-1 extends along the first direction X or the opposite direction of the first direction X. The shape of the adapter part 72-2 may be a straight line in which the main body part extends in the second direction Y, the first terminal of the adapter part 72-2 is connected to the wiring main body part 72-1, and the second terminal of the adapter part 72-2 is connected to the data signal line 61 through the thirty-second via hole V32, so that the data signal line 61 of the display region is connected to the bonding lead line of the bonding region through the first wiring 71 and the second wiring 72. In an exemplary embodiment, the thirty-second via V32 may be referred to as a lead via hole.

In an exemplary embodiment, the adapter part 72-2 may be located on a side of the sub-pixel near an adjacent sub-pixel, so that the orthographic projection of the adapter part 72-2 on the substrate does not overlap with the orthographic projection of the anode formed subsequently on the substrate, so that the adapter part 72-2 does not affect the flatness of the anode formed subsequently. For example, in the Mth row, the adapter part 72-2 may be located on the side near the Nth column sub-pixels in the N−1 column sub-pixels. For another example, the adapter part 72-2 may be located on the side of the N+2 column sub-pixels near the N+1 column sub-pixels.

In the exemplary embodiment, the adapter part 72-2 may be located on the opposite side of the second direction Y of the wiring main body part 72-1, and the twenty-first connection electrode 73 may be located on the side of the second direction Y of the wiring main body part 72-1, that is, the adapter part 72-2 and the twenty-first connection electrode 73 may be located on both sides of the second direction Y of the wiring main body part 72-1, respectively.

In an exemplary embodiment, the lead via hole may be located on the opposite side of the second direction Y of the wiring main body part 72-1, and the anode via hole may be located on a side of the second direction Y of the wiring main body part 72-1, i.e., the lead via hole and the anode via hole are located on both sides of the second direction Y of the wiring main body part 72-1, respectively.

In an exemplary embodiment, the shape of the dummy line 80 may be a straight line or a zigzag line in which the main body part extends along the first direction X, the dummy line 80 may be located between adjacent second wirings 72 in the second direction Y, and the dummy line 80 may be connected to the first power supply lines 62 of multiple sub-pixels through multiple thirty-third via holes V33. For example, the dummy line 80 in the Mth row of sub-pixels may be connected to the first power supply line 62 of the multiple sub-pixels in the Mth row of sub-pixels through the multiple thirty-third via holes V33 in the Mth row of sub-pixels. The dummy line 80 can be used as a power supply connection line to ensure that multiple first power supply lines 62 in the Mth row sub-pixel row output the same power supply signal, which is beneficial to improving the uniformity of the panel, avoiding poor display on the display substrate and ensuring the display effect on the display substrate. In an exemplary embodiment, the thirty-third via hole V33 may be referred to as a power supply via hole.

In an exemplary embodiment, the shape of the second compensation line 82 may be a straight line or a zigzag line in which the main body part extends along the second direction Y, the first terminal of the second compensation line 82 is connected to the dummy line 80, and the second terminal of the second compensation line 82 extends along the second direction Y in a direction away from the dummy line 80.

In an exemplary embodiment, the second compensation line 82 may be disposed on one side of the second direction Y of the dummy line 80, or the second compensation line 82 may be disposed on the opposite side of the second direction Y of the dummy line 80, or the second compensation line 82 may be disposed on both sides of the second direction Y of the dummy line 80 and the opposite side of the second direction Y of the dummy line 80.

In an exemplary embodiment, the number of second compensation lines disposed on both sides of the dummy line in the second direction Y may be the same or may be different. For example, there may be two second compensation lines at least partially overlapping the subsequently formed first anode and second anode, which are located on one side of the second direction Y of the dummy line. As another example, there may be three second compensation lines at least partially overlapping with the subsequently formed third anode and fourth anode, which are located on the opposite side of the second direction Y of the dummy line.

In an exemplary embodiment, the adapter part 72-2 may be located between a second compensation line at least partially overlapping the first anode and a second compensation line at least partially overlapping the second anode, i.e., the adapter part 72-2 may be located between adjacent second compensation lines.

In an exemplary embodiment, a second compensation line 82 is provided on one or both sides of the dummy line 80, so that an irregular shape is formed that a mura can be prevented.

In an exemplary embodiment, multiple dummy lines 80 may be connected to each other to form a power supply connection line of a parallel structure, thereby reducing the resistance of the power supply connection line.

In an exemplary embodiment, since the first wiring 71 is connected to the second wiring 72, the second wiring 72 is connected to the data signal line 61 through a via hole, the second compensation line 82 is connected to the dummy line 80, and the dummy line 80 is connected to the first power supply line 62 through a via hole, both the first wiring 71 and the second compensation line 82 have different potentials.

In an exemplary embodiment, the sixth conductive layer may further include a power supply connection line extending along the first direction X, and the present disclosure is not limited herein.

Figure 23A:
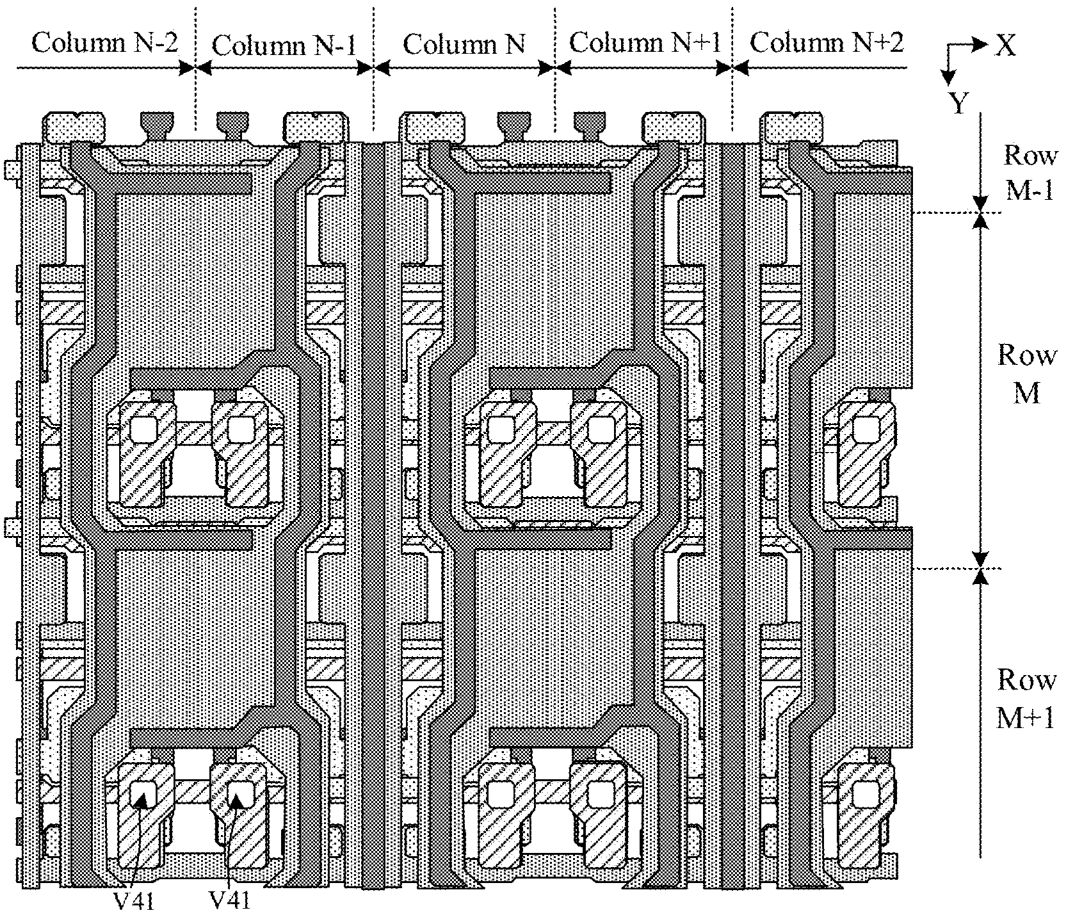
FIGS. 23*a* and 23*b* are schematic diagrams after a pattern of a third planarization layer is formed according to an embodiment of the present disclosure.
Figure 23B:
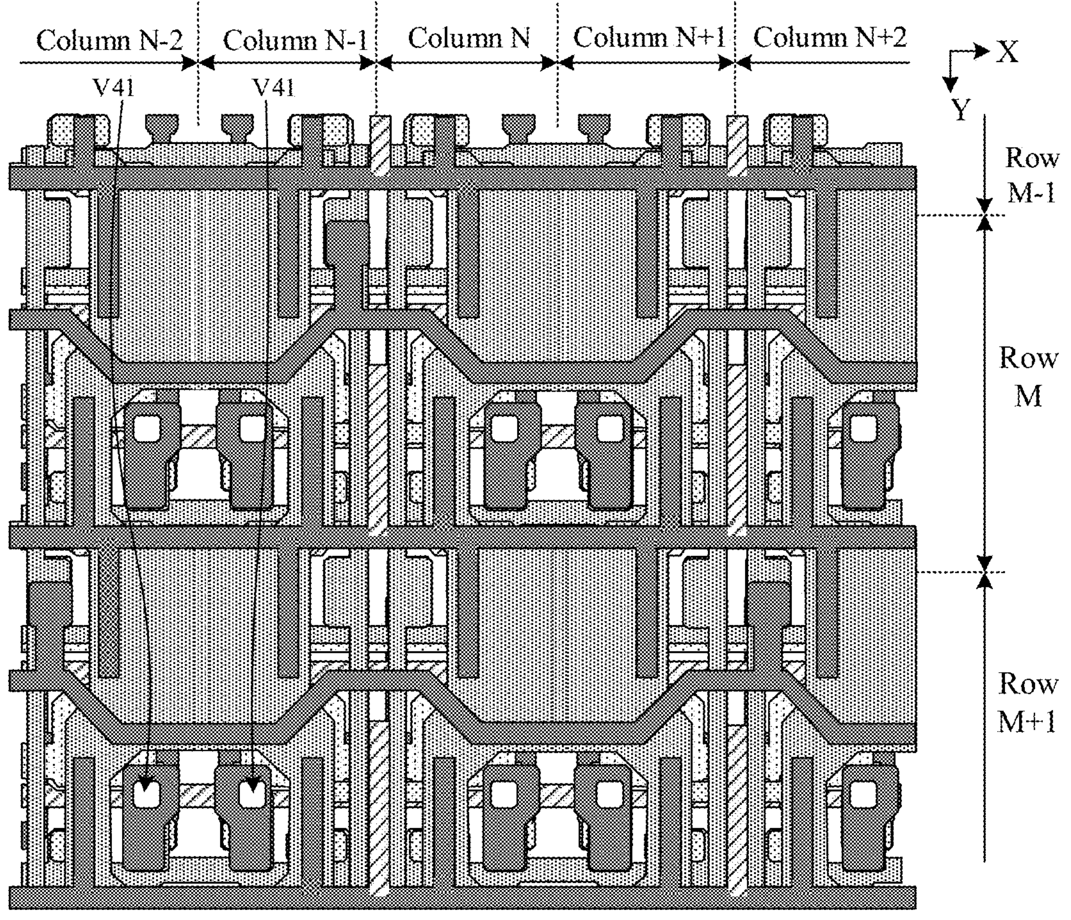

(13) A pattern of a third planarization layer is formed. In an exemplary embodiment, forming of the pattern of the third planarization layer may include: coating a third planarization thin film on the substrate on which the aforementioned patterns are formed, and patterning the third planarization thin film through a patterning process to form the third planarization layer covering the pattern of the sixth conductive layer. The third planarization layer is provided with multiple via holes, as shown in FIG. 23*a* and FIG. 23*b*. FIG. 23*a* is a schematic plan view of B region in FIG. 9*c*, and FIG. 23*b* is a schematic plan view of C region in FIG. 9*c*.

In an exemplary embodiment, the via hole of each sub-pixel in the B region and the C region includes at least a forty-first via hole V41.

In an exemplary embodiment, the orthographic projection of the forty-first via hole V41 on the substrate is within the range of the orthographic projection of the twenty-first connection electrode 73 on the substrate. The third planarization layer in the forty-first via hole V41 is removed, exposing the surface of the twenty-first connection electrode 73. The forty-first via hole V41 is configured to connect the subsequently formed anode to the twenty-first connection electrode 73 through the via hole.

In the exemplary embodiment, for the sub-pixel provided with the forty-first via hole V41 and the adapter part 72-2, in the first direction X, the forty-first via hole V41 may be located on one side of the sub-pixel, and the adapter part 72-2 may be located on the other side of the sub-pixel. For example, for the sub-pixels in the Mth row and the N−1th column, the forty-first via hole V41 may be located on the left side of the sub-pixel (the side near the sub-pixels in the Mth row and the N−2th column), and the adapter part 72-2 may be located on the right side of the sub-pixel (the side near the Mth row and the Nth column). For another example, for the sub-pixels in the M+1th row and the N+2th column, the forty-first via hole V41 may be located on the right side of the sub-pixel (the side near the sub-pixels in the M+1th row and the N+3th column), and the adapter part 72-2 may be located on the left side of the sub-pixel (the side near the M+1th row and the N+1th column).

In the exemplary embodiment, in the second direction Y, the forty-first via hole V41 may be located on one side of the second direction Y of the wiring main body part 72-1, and the adapter part 72-2 may be located on the opposite side of the second direction Y of the wiring main body part 72-1, that is, the adapter part 72-2 and the forty-first via hole V41 may be located on both sides of the second direction Y of the wiring main body part 72-1, respectively.

Hereto, the drive circuit layer pattern is prepared on the substrate. In a plane parallel to the display substrate, the drive circuit layer may include multiple sub-pixels, each of the sub-pixels may include a pixel drive circuit, and a first scan signal line, a second scan signal line, a third scan signal line, en emitting control line, a data signal line, a first power supply line, a first initial signal line, and a second initial signal line connected with the pixel drive circuit. In a plane perpendicular to the display substrate, the drive circuit layer may include: a first insulation layer, a first semiconductor layer, a second insulation layer, a first conductive layer, a third insulation layer, a second conductive layer, a fourth insulation layer, a second semiconductor layer, a fifth insulation layer, a third conductive layer, a sixth insulation layer, a fourth conductive layer, a seventh insulation layer, a first planarization layer, a fifth conductive layer, a second planarization layer, a sixth conductive layer and a third planarization layer, which are arranged in sequence on the substrate. The first semiconductor layer includes at least the active layers of the first transistor to the seventh transistor, the first conductive layer includes at least gate electrodes of the first transistor to the seventh transistor and a first electrode plate of the storage capacitor, the second conductive layer includes at least a second electrode plate of the storage capacitor and a lower gate electrode of the eighth transistor, the second semiconductor layer includes at least an active layer of the eighth transistor, the third conductive layer includes at least an upper gate electrode of the eighth transistor, the fourth conductive layer includes at least the first electrodes and the second electrodes of multiple transistors, the fifth conductive layer includes at least a data signal line and a first power supply line, and the sixth conductive layer includes at least a data fanout line, a dummy line and a compensation line.

In an exemplary embodiment, the first conductive layer, the second conductive layer, the third conductive layer, the fourth conductive layer, the fifth conductive layer, and the sixth conductive layer may be made of metal materials, such as any one or more of silver (Ag), copper (Cu), aluminum (Al) and molybdenum (Mo), or alloy materials of the above metals, such as an aluminum neodymium alloy (AlNd) or a molybdenum niobium alloy (MoNb), and may be a single-layer structure or a multi-layer composite structure, such as Mo/Cu/Mo, etc. The first insulation layer, the second insulation layer, the third insulation layer, the fourth insulation layer, the fifth insulation layer, the sixth insulation layer, and the seventh insulation layer may be made of any one or more of silicon oxide (SiOx), silicon nitride (SiNx), and silicon oxynitride (SiON), and may be single layers, multiple layers, or composite layers. The first insulation layer may be referred to as a buffer layer to improve the water and oxygen resistance capability of the substrate, the second insulation layer, the third insulation layer, the forth insulation later and the fifth insulation layer may be referred to as gate insulation (GI) layers, the sixth insulation layer may be referred to as an interlayer insulation (ILD) layer, and the seventh insulation layer is referred to as a passivation (PVX) layer. The first planarization layer, the second planarization layer, and the third planarization layer may be made of an organic material such as a resin or the like.

In an exemplary embodiment, pixel drive circuits in two adjacent sub-pixels in a row of pixels may be substantially mirror-symmetrical with respect to a first center line, which is a straight line located between two adjacent sub-pixels and extending along a second direction Y. For example, the pixel drive circuit of the N−1 column and the pixel drive circuit of the Nth column may be mirror-symmetrical with respect to the first center line. As another example, the pixel drive circuit of the Nth column and the pixel drive circuit of the N+1 column may be mirror-symmetrical with respect to the first center line.

In an exemplary embodiment, pixel drive circuits in two adjacent sub-pixels may be substantially mirror-symmetrical with respect to the first center line and may include any one or more of the following: a first semiconductor layer in two adjacent sub-pixels in a row of pixels may be mirror-symmetrical with respect to a first centerline, a first conductive layer in two adjacent sub-pixels in a row of pixels may be mirror-symmetrical with respect to a first centerline, a second conductive layer in two adjacent sub-pixels in a row of pixels may be mirror-symmetrical with respect to a first centerline, a second semiconductor layer in two adjacent sub-pixels in a row of pixels may be mirror-symmetrical with respect to a first centerline, a third conductive layer in two adjacent sub-pixels in a row of pixels may be mirror-symmetrical with respect to the first centerline, a fourth conductive layer in two adjacent sub-pixels in a row of pixels may be mirror-symmetrical with respect to the first center line, and a fifth conductive layer in two adjacent sub-pixels in a row of pixels may be mirror-symmetrical with respect to the first center line.

In an exemplary embodiment, after the drive circuit layer is prepared, an emitting structure layer is prepared on the drive circuit layer, and the preparation process of the emitting structure layer may include the following acts.

Figure 24A:
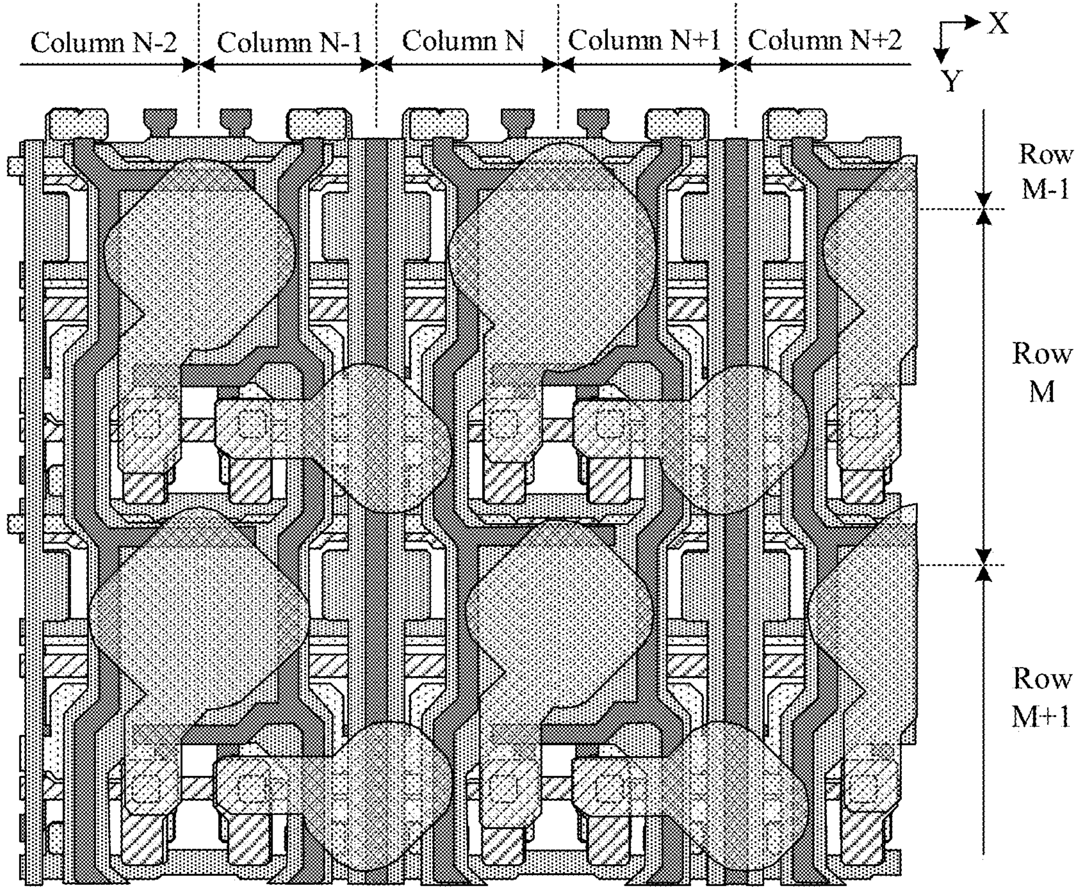
FIGS. 24*a* to 24*c* are schematic diagrams after a pattern of an anode conductive layer is formed according to the present disclosure.
Figure 24B:
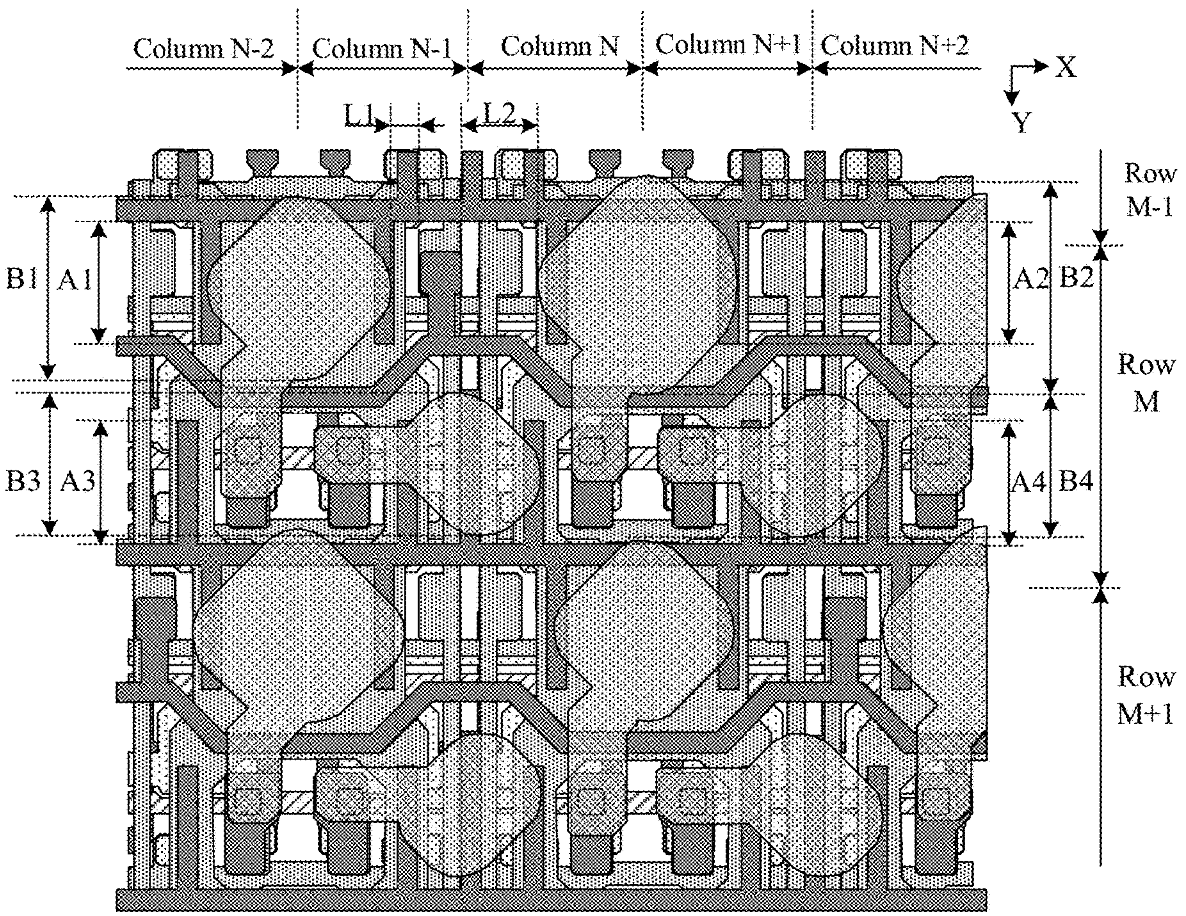
Figure 24C:
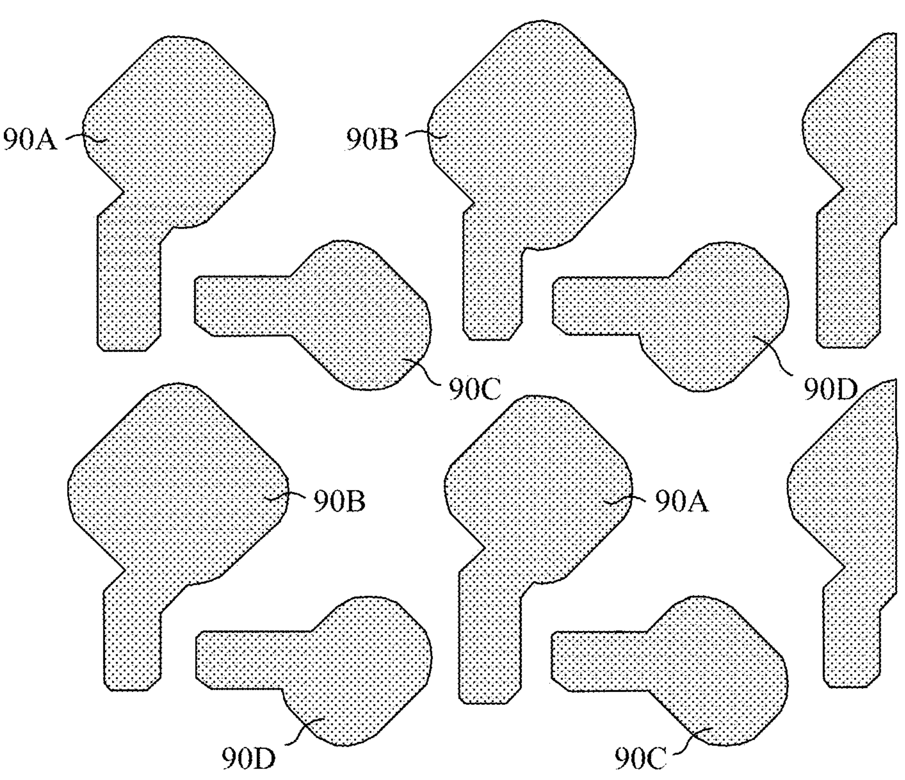

(14) A pattern of an anode conductive layer is formed. In an exemplary embodiment, forming the pattern of the anode conductive layer may include: depositing an anode conductive thin film on the substrate on which the aforementioned patterns are formed, patterning the anode conductive thin film through a patterning process to form an anode conductive layer disposed on the third planarization layer, and the anode conductive layer includes at least multiple anode patterns, as shown in FIGS. 24*a*, 24*b* and 24*c*, wherein FIG. 24*a* is an enlarged view of the B region in FIG. 9*c*, FIG. 24*b* is an enlarged view of the C region in FIG. 9*c*, and FIG. 24*c* is a planar schematic diagram of the anode conductive layer in FIGS. 24*a* and 24*b*.

In an exemplary embodiment, the anode conductive layer adopts a single-layer structure, such as indium tin oxide ITO or indium zinc oxide IZO, or can adopt a multilayer composite structure, such as ITO/Ag/ITO and the like.

In an exemplary embodiment, the multiple anode patterns may include a first anode 90A of a red light emitting device, a second anode 90B of a blue light emitting device, a third anode 90C of a first green light emitting device, and a fourth anode 90D of a second green light emitting device. The first anode 90A may be located in the red sub-pixel that emits red light, the second anode 90B may be located in the blue sub-pixel that emits blue light, the third anode 90C may be located in the first green sub-pixel emitting green light, and the fourth anode 90D may be located in the second green sub-pixel emitting green light.

In an exemplary embodiment, the first and second anodes 90A and 90B may be sequentially disposed along the second direction Y, the third and fourth anodes 90C and 90D may be sequentially disposed along the second direction Y, and the third and fourth anodes 90C and 90D may be disposed on the side of the first direction X of the first and second anodes 90A and 90B. Alternatively, the first anode 90A and the second anode 90B may be sequentially disposed along the first direction X, the third anode 90C and the fourth anode 90D may be sequentially disposed along the first direction X, and the third anode 90C and the fourth anode 90D may be disposed on the side of the second direction Y of the first anode 90A and the second anode 90B.

In an exemplary embodiment, the first anode 90A, the second anode 90B, the third anode 90C, and the fourth anode 90D may be respectively connected to the twenty-first connection electrode 73 of the sub-pixels in which they are located through the forty-first via hole V41, and the shapes and areas of the anodes in the four sub-pixels in one pixel unit may be the same or may be different.

In an exemplary embodiment, the orthographic projections of the first anode 90A, the second anode 90B, the third anode 90C, and the fourth anode 90D on the substrate do not overlap the orthographic projection of the adapter part 72-2 of the second wiring 72 on the substrate, so that the adapter part 72-2 does not affect the flatness of the anode.

In an exemplary embodiment, the adapter part 72-2 may be located between the first anode 90A and the second anode 90B.

In an exemplary embodiment, there is a first distance L1 between the edge of the adapter part 72-2 on the side near the first anode 90A and the edge of the first anode 90A on the side near the adapter part 72-2, and there is a second distance L2 between the edge of the adapter part 72-2 on the side near the second anode 90B and the edge of the second anode 90B on the side near the adapter part 72-2, and the second distance L2 may be greater than the first distance L1.

In an exemplary embodiment, at least one of the first anode 90A, the second anode 90B, the third anode 90C, and the fourth anode 90D may include an anode body part and an anode connection part connected to each other, and the anode connection part is connected to the twenty-first connection electrode 73 through the forty-first via hole V41. In the second direction Y, the second compensation line 82 has an extension length A, and the anode body part has an anode extension length B, wherein the extension length A may be greater than or equal to 0.5*the anode extension length B.

In an exemplary embodiment, the first anode 90A may include a first anode body part and a first anode connection part connected to each other, the first anode body part may have a rectangular shape, the corner part of the rectangular shape may be provided with an arc-shaped chamfer, the first anode connection part may have a strip shape extending in the second direction Y, and the first anode connection part is connected to the twenty-first connection electrode 73 through the forty-first via hole V41.

In an exemplary embodiment, in the B region, the orthographic projection of the first anode body part on the substrate at least partially overlaps the orthographic projection of at least one first wiring 71 on the substrate, and the orthographic projection of the first anode body part on the substrate at least partially overlaps the orthographic projection of at least one first compensation line 81 on the substrate.

In an exemplary embodiment, in the C region, the orthographic projection of the first anode body part on the substrate at least partially overlaps the orthographic projection of at least one dummy line 80 on the substrate, and the orthographic projection of the first anode body part on the substrate at least partially overlaps the orthographic projection of at least one second compensation line 82 on the substrate.

In an exemplary embodiment, there are a1 first wirings overlapping the first anode in the B region and a2 second compensation lines overlapping the first anode in the C region, a1=a2=2.

In an exemplary embodiment, there are b1 first compensation lines overlapping the first anode in the B region and b2 dummy lines overlapping the first anode in the C region, b1=b2=1.

In an exemplary embodiment, as can be seen from comparing the orthographic projection of the first anode 90A on the substrate in the B and C regions, the first anode 90A in the B region overlaps one horizontal line (first compensation line 81 extending in the first direction Y) and two vertical lines (first wirings 71 extending in the second direction Y). The first anode 90A in the C region overlaps one horizontal line (dummy line 80 extending in the first direction Y) and two vertical lines (second compensation line 82 extending in the second direction Y). Thus, the horizontal metal lines and the vertical metal lines below the first anode 90A in the B region and the C region are substantially identical, thereby ensuring that the flatness of the first anode 90A in the B region is substantially identical to that of the first anode 90A in the C region, and that the luminescence performance of the red light emitting devices in the two regions is substantially identical.

In an exemplary embodiment, in the second direction Y, the second compensation line 82 at least partially overlapping the first anode body part has a first extension length A1, the first anode body part has a first anode extension length B1, wherein the first extension length A1 may be greater than or equal to 0.5*the first anode extension length B1.

In an exemplary embodiment, the second anode 90B may include a second anode body part and a second anode connection part connected to each other, the second anode body part may have a rectangular shape, the corner part of the rectangular shape may be provided with an arc-shaped chamfer, the second anode connection part may have a strip shape extending in the second direction Y, and the second anode connection part is connected to the twenty-first connection electrode 73 through the forty-first via hole V41.

In an exemplary embodiment, in the B region, the orthographic projection of the second anode body part on the substrate at least partially overlaps the orthographic projection of at least one first wiring 71 on the substrate, and the orthographic projection of the second anode body part on the substrate at least partially overlaps the orthographic projection of at least one first compensation line 81 on the substrate.

In an exemplary embodiment, in the C region, the orthographic projection of the second anode body part on the substrate at least partially overlaps the orthographic projection of at least one dummy line 80 on the substrate, and the orthographic projection of the second anode body part on the substrate at least partially overlaps the orthographic projection of at least one second compensation line 82 on the substrate.

In an exemplary embodiment, there are c1 first wirings overlapping the second anode in the B region and c2 second compensation lines overlapping the second anode in the C region, c1=c2=2.

In an exemplary embodiment, there are d1 first compensation lines overlapping the second anode in the B region and d2 dummy lines overlapping the second anode in the C region, d1=d2=1.

In an exemplary embodiment, as can be seen from comparing the orthographic projection of the second anode 90B on the substrate in the B and C regions, the second anode 90B in the B region overlaps one horizontal line (first compensation line 81 extending in the first direction Y) and two vertical lines (first wirings 71 extending in the second direction Y). The second anode 90B in the C region overlaps one horizontal line (dummy line 80 extending in the first direction Y) and two vertical lines (second compensation line 82 extending in the second direction Y). Thus, the horizontal metal lines and the vertical metal lines below the second anode 90B in the B region and the C region are substantially identical, thereby ensuring that the flatness of the second anode 90B in the B region is substantially identical to that of the second anode 90B in the C region, and that the luminescence performance of the blue light emitting devices in the two regions is substantially identical.

In an exemplary embodiment, in the second direction Y, the second compensation line 82 at least partially overlapping the second anode body part has a second extension length A2, the second anode body part has a second anode extension length B2, wherein the second extension length A2 may be greater than or equal to 0.5*the second anode extension length B2.

In an exemplary embodiment, the third anode 90C may include a third anode body part and a third anode connection part connected to each other, the third anode body part may have a rectangular shape, the corner part of the rectangular shape may be provided with an arc-shaped chamfer, and the third anode connection part may have a strip shape extending along the first direction X, and the third anode connection part is connected to the twenty-first connection electrode 73 through the forty-first via hole V41.

In an exemplary embodiment, in the B region, the orthographic projection of the third anode body part on the substrate overlaps at least partially the orthographic projection of at least one first wiring 71 on the substrate.

In an exemplary embodiment, in the C region, the orthographic projection of the third anode body part on the substrate overlaps at least partially with the orthographic projection of the at least one second compensation line 82 on the substrate.

In an exemplary embodiment, there are e1 first wirings overlapping the third anode in the B region and e2 second compensation lines overlapping the third anode in the C region, e1=e2=3.

In an exemplary embodiment, there are 0 first compensation lines overlapping the third anode in the B region and 0 dummy lines overlapping the third anode in the C region.

In an exemplary embodiment, as can be seen from comparing the orthographic projection of the third anode 90C on the substrate in the B and C regions, the third anode 90C in the B region overlaps three vertical lines (first wirings 71 extending in the second direction Y). The third anode 90C in the C region overlaps three vertical lines (second compensation lines 82 extending in the second direction Y). Thus, the vertical metal line beneath the third anode 90C in the B and C regions are substantially identical, thereby ensuring the flatness of the third anode 90C in the B region and the C region to be substantially consistent, so that the luminescence performance of the first green light emitting device in the two regions can be ensured to be substantially the same, and defects such as screen extinguishing mura caused by the height difference of the third anodes in the two regions can be avoided.

In an exemplary embodiment, in the second direction Y, the second compensation line 82 at least partially overlapping the third anode body part has a third extension length A3, the third anode body part has a third anode extension length B3, wherein the third extension length A3 may be greater than or equal to 0.5*the third anode extension length B3.

In an exemplary embodiment, the fourth anode 90D may include a fourth anode body part and a fourth anode connection part connected to each other, the fourth anode body part may have a rectangular shape, the corner part of the rectangular shape may be provided with an arc-shaped chamfer, the fourth anode connection part may have a strip shape extending in the first direction X, and the fourth anode connection part is connected to the twenty-first connection electrode 73 through the forty-first via hole V41.

In an exemplary embodiment, in the B region, the orthographic projection of the fourth anode body part on the substrate overlaps at least partially the orthographic projection of at least one first wiring 71 on the substrate.

In an exemplary embodiment, in the C region, the orthographic projection of the fourth anode body part on the substrate overlaps at least partially with the orthographic projection of the at least one second compensation line 82 on the substrate.

In an exemplary embodiment, there are f1 first wirings overlapping the fourth anode in the B region and f2 second compensation lines overlapping the fourth anode in the C region, f1=f2=3.

In an exemplary embodiment, there are 0 first compensation lines overlapping the fourth anode in the B region and 0 dummy lines overlapping the fourth anode in the C region.

In an exemplary embodiment, as can be seen from comparing the orthographic projection of the fourth anode 90D on the substrate in the B and C regions, the fourth anode 90D in the B region overlaps three vertical lines (first wirings 71 extending in the second direction Y). The fourth anode 90D in the C region overlaps three vertical lines (second compensation lines 82 extending in the second direction Y). Thus, the vertical metal line beneath the fourth anode 90D in the B and C regions are substantially identical, thereby ensuring the flatness of the fourth anode 90D in the B region and the C region to be substantially consistent, so that the luminescence performance of the first green light emitting device in the two regions can be ensured to be substantially the same, and defects such as screen extinguishing mura caused by the height difference of the fourth anodes in the two regions can be avoided.

In an exemplary embodiment, in the second direction Y, the second compensation line 82 at least partially overlapping the fourth anode body part has a fourth extension length A4, the fourth anode body part has a fourth anode extension length B4, wherein the fourth extension length A4 may be greater than or equal to 0.5*the fourth anode extension length B4.

In an exemplary embodiment, a subsequent preparation process may include: first, a pattern of a pixel define layer is formed, then, an organic emitting layer is formed using an evaporation or ink-jet printing process, and a cathode is formed on the organic light emitting layer. Then, an encapsulation structure layer is formed. The encapsulation structure layer may include a first encapsulation layer, a second encapsulation layer, and a third encapsulation layer that are stacked. The first encapsulation layer and the third encapsulation layer may be made of an inorganic material. The second encapsulation layer may be made of an organic material. The second encapsulation layer is disposed between the first encapsulation layer and the third encapsulation layer, so that it may be ensured that external water vapor cannot enter a light emitting structure layer.

As can be seen from the structure and preparation process of the display substrate described above, according to the display substrate provided in the present disclosure, a first compensation line is arranged in a first lead region where a first wiring line is located and/or a second compensation line is arranged in a second lead region where a second wiring line is located, so that the horizontal metal lines and the vertical metal lines under the anodes in the two regions are basically the same. It can ensure that the flatness of the anodes in the two regions is basically the same, not only can ensure that the luminous performance of the light emitting devices in the two regions is basically the same, but also can avoid the defects such as screen extinguishing mura caused by the height difference of the anodes in the two regions, thus improving the quality of the display substrate. The preparation process in the present disclosure may be compatible well with an existing preparation process, which is simple in process implementation, easy to implement, high in production efficiency and yield, and low in production cost.

The structure shown and mentioned above in the present disclosure and the preparation process thereof are merely an exemplary description. In an exemplary embodiment, the corresponding structures may be altered and the patterning processes may be added or reduced according to actual needs. For example, the first compensation line may not be connected to the first wiring, and the second compensation line may not be connected to the dummy line. As another example, the dummy line may not be provided in the second lead region, and the second compensation line may be provided on the second wiring. For another example, the shapes of the first compensation line and the second compensation line may be zigzag lines, including line segments extending in the first direction and line segments extending in the second direction connected to each other, or the shapes of the first compensation line and the second compensation line may be arc lines or the like, and the present disclosure is not limited herein.

In an exemplary embodiment, the display substrate of the present disclosure may be applied to other display apparatuses having pixel drive circuits such as quantum dot displays and the like, and the present disclosure is not limited herein.

Figure 25:
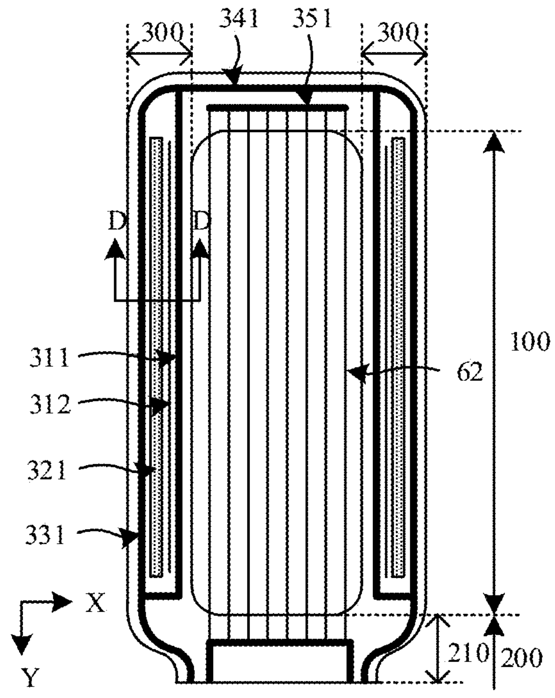
FIG. 25 is a schematic diagram of a planar structure of a bezel region according to an exemplary embodiment of the present disclosure.
Figure 26:
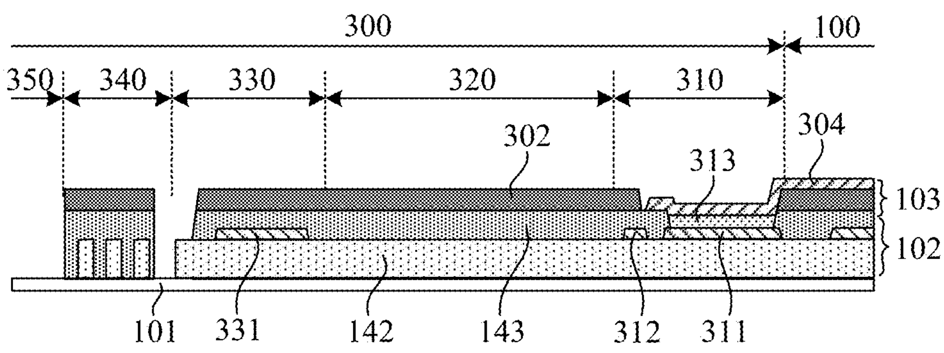
FIG. 26 is a schematic diagram of a cross-sectional structure of a bezel region according to an exemplary embodiment of the present disclosure.

FIG. 25 is a schematic diagram of a planar structure of a bezel region according to an exemplary embodiment of the present disclosure. FIG. 26 is a schematic diagram of a cross-sectional structure of a bezel region according to an exemplary embodiment of the present disclosure, and it is a sectional view taken along D-D direction in FIG. 25. In a plane parallel to the display substrate, the display substrate may include a display region 100, a bonding region 200 located on the second direction Y side of the display region 100, and a bezel region 300 located on the other side of the display region 100. The bezel region 300 may include an end bezel located on the opposite side of the second direction Y of the display region 100 and side bezels located on both sides of the first direction X of the display region 100.

As shown in FIGS. 25 and 26, in an exemplary embodiment, the side bezel may include a first bezel region 310, a circuit region 320, a second bezel region 330, a crack dam region 340, and a cutting region 350 that are sequentially disposed in a direction away from the display region 100. The first bezel region 310 may include a first low-voltage power supply line 311 and an initial signal line 312, the circuit region 320 may include a gate drive circuit (GOA) 321, the second bezel region 330 may include a second low-voltage power supply line 331, the crack dam region 340 may include multiple crack dams, and the cutting region 350 may include at least one cutting groove.

In an exemplary embodiment, a first low-voltage power supply line 311 provided in the first bezel region 310 is configured to output a low-level signal to multiple pixel drive circuits in the display region, and an initial signal line 312 is configured to output an initial signal to multiple pixel drive circuits in the display region. A first terminal of the first low-voltage power supply line 311 is connected to a second low-voltage power supply line 331. A second terminal of the first low-voltage power supply line 311 extends in the direction of the end bezel along the side bezel, and is connected to a low-voltage power supply line 341 of the end bezel.

In an exemplary embodiment, the gate drive circuit is configured to output a drive signal to the display region. The gate drive circuit may include multiple cascaded shift registers, the multiple shift registers may be sequentially disposed along the second direction Y, the output signal lines of the shift registers are connected to a scan signal line and en emitting control line in the display region, and the scan signal and the emitting control signal are output to multiple pixel drive circuits in the display region.

In an exemplary embodiment, the second low-voltage power supply line 331 disposed in the second bezel region 330 may be disposed on the same layer as the first low-voltage power supply line 311 and formed synchronously by the same one-time patterning process. A first terminal of the second low-voltage power supply line 331 is connected to a low-voltage power supply line (VSS) of the bonding region, and a second terminal of the first low-voltage power supply line 311 extends in the direction of the end bezel along the side bezel and is connected to a low-voltage power supply connection line 340 of the end bezel. In an exemplary embodiment, the second bezel region 330 may also include at least one isolation dam configured to block the organic material layer in the encapsulation structure layer and to block water vapor from entering the display region.

In an exemplary embodiment, the multiple cracks arranged in the crack dam region 340 are configured to reduce the stress on the display region during the cutting process, intercept the transmission of the cracks to the direction of the display region, and avoid affecting the film layer structure of the display region. The cutting grooves provided in the cutting region 350 are configured such that after all the film layers of the display substrate are prepared, the cutting device cuts along the cutting grooves.

In an exemplary embodiment, the display region 100 may include at least multiple first power supply lines 62, a first terminal of the first power supply line 62 is connected to a high-voltage power supply line (VDD) of the bonding region, and a second terminal of the first power supply line 62 extends in the direction of the end bezel, and is connected to a high-voltage power connection line 351 of the end bezel.

In an exemplary embodiment, in a plane perpendicular to the display substrate, the display substrate may include a drive circuit layer 102 disposed on the substrate 101 and an emitting structure layer 103 disposed on a side of the drive circuit layer 102 away from the substrate 101.

In an exemplary embodiment, the drive circuit layer 102 may include at least a second planarization layer 142, a sixth conductive layer disposed on the second planarization layer, and a third planarization layer 143 covering the sixth conductive layer. The sixth conductive layer may include a first low-voltage power supply line 311, an initial signal line 312, and a second low-voltage power supply line 331. The third planarization layer 143 is provided with a first via hole exposing the first low-voltage power supply line 311.

In an exemplary embodiment, the emitting structure layer 103 may include at least a cathode connection electrode 313, a pixel define layer 302, and a cathode 304. The cathode connection electrode 313 is connected to the first low-voltage power supply line 311 through a first via hole, a second via hole exposing the cathode connection electrode 313 is provided in the pixel define layer 302, and the cathode 304 is connected to the cathode connection electrode 313 through the second via hole, thereby achieving the connection of the cathode 304 to the first low-voltage power supply line 311 through the cathode connection electrode 313.

In an exemplary embodiment, the first power supply line 62 may be disposed in the fifth conductive layer (SD2), and the first low-voltage power supply line 311, the initial signal line 312, and the second low-voltage power supply line 331 may be disposed in the sixth conductive layer (SD3), arranged in the same layer as the data fanout lines of the display region, and formed synchronously by the same one-time patterning process.

In an exemplary embodiment, the cathode connection electrode 313 may be disposed in the anode conductive layer, disposed in the same layer as the first anode, the second anode, the third anode, and the fourth anode of the display region, and formed synchronously by the same one-time patterning process.

In a display substrate, the low voltage required by the pixel drive circuit in the display region is introduced from the bonding pad of the bonding region. After passing through the bonding region, it enters the side bezel, and is supplied to each pixel drive circuit through the second low-voltage power supply line of the side bezel. Since there is a certain impedance in the second low-voltage power supply line, there is a voltage drop in the voltage signal transmission, so the voltage of the power supply line farther away from the bonding region will be lower than the voltage of the power supply line closer to the bonding region, and the display brightness uniformity of the display region is reduced. In the present disclosure, by adding a first low-voltage power supply line to the side bezel and connecting the first low-voltage power supply line to the second low-voltage power supply line, a parallel structure of dual low-voltage power supply lines is achieved, which effectively reduces the resistance of the side bezel power supply line. A voltage drop of a voltage signal is minimized to a maximum extent, and uniformity of display brightness in the display region is improved, and display quality is improved. By arranging a first low voltage power supply line between a gate drive circuit of a circuit region and a display region, the first low-voltage power supply line can be used as a shield line, thereby effectively eliminating the mutual interference between the pixel drive circuit in the display region and the gate drive circuit in the circuit region, and improving the working reliability of the pixel drive circuit and the gate drive circuit.

In a display substrate, a cathode in a display region extends to a side bezel and is connected to a second low-voltage power supply line through a cathode connection electrode hole. The invention discloses a first low-voltage power supply line arranged between a gate drive circuit in a circuit region and a display region, so that a cathode in the display region can be connected with the first low-voltage power supply line through a cathode connection electrode. Because the connection position between the cathode and the low voltage power supply line is close to the display region, it not only simplifies the preparation process and improves the connection reliability, but also further improves the uniformity of the display brightness in the display region and improves the display quality.

Figure 27:
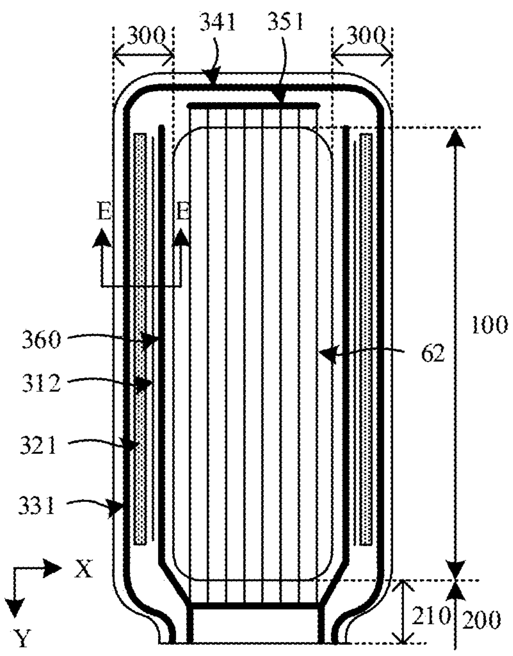
FIG. 27 is a schematic diagram of a planar structure of another bezel region according to an exemplary embodiment of the present disclosure.
Figure 28:
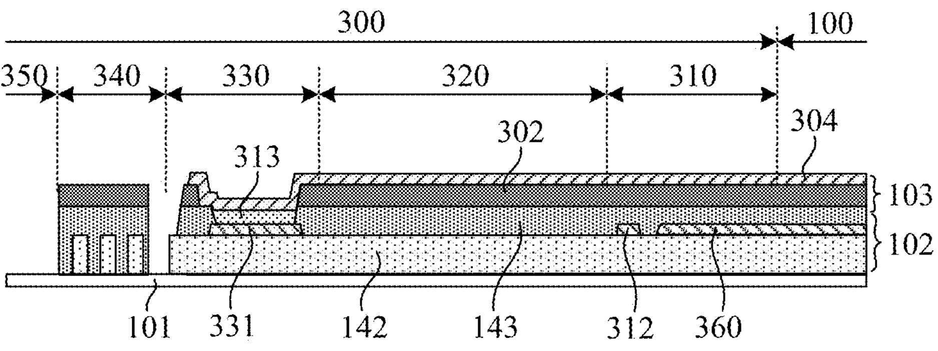
FIG. 28 is a schematic diagram of a planar structure of another bezel region according to an exemplary embodiment of the present disclosure.

FIG. 27 is a schematic diagram of a planar structure of another bezel region according to an exemplary embodiment of the present disclosure. FIG. 28 is a schematic diagram of a cross-sectional structure of another bezel region according to an exemplary embodiment of the present disclosure, and it is a sectional view taken along E-E direction in FIG. 27. The structure of the bezel region of the present exemplary embodiment is substantially similar to that of the bezel region of the foregoing embodiment, except that the side bezel of the bezel region 300 is provided with a high voltage power supply lead 360.

As shown in FIGS. 27 and 28, in an exemplary embodiment, the first bezel region 310 may include a high-voltage power supply lead 360 and an initial signal line 312. The high-voltage power supply lead 360 is connected to a high-voltage power supply line (VDD) of the bonding region, and the high-voltage power supply lead 360 is configured to connect to multiple dummy lines of the display region.

In an exemplary embodiment, the high-voltage power supply lead may be arranged in the same layer as the dummy line of the display region and formed synchronously by the same one-time patterning process, i.e., the high-voltage power supply lead is arranged in the sixth conductive layer (SD3).

In an exemplary embodiment, the drive circuit layer 102 may include at least a second planarization layer 142, a sixth conductive layer disposed on the second planarization layer, and a third planarization layer 143 covering the sixth conductive layer. The sixth conductive layer may include at least a high-voltage power supply lead 360, an initial signal line 312, and a second low-voltage power supply line 331. The high-voltage power supply lead 360 is connected with multiple dummy lines in the display region, and a first via hole exposing the second low-voltage power supply line 331 is provided in the third planarization layer 143.

In an exemplary embodiment, the cathode connection electrode 313 in the emitting structure layer 103 may be provided in the anode conductive layer. The cathode connection electrode 313 is connected to the second low-voltage power supply line 331 through a first via hole, a second via hole exposing the cathode connection electrode 313 is provided in the pixel define layer 302, and the cathode 304 is connected to the cathode connection electrode 313 through the second via hole, thereby achieving the connection of the cathode 304 to the second low-voltage power supply line 331 through the cathode connection electrode 313.

In an exemplary embodiment, the fourth conductive layer (SD1) of the side bezel in the bezel region 300 may also be provided with an auxiliary high-voltage power supply lead, and the high-voltage power supply lead 360 may be overlapped with the auxiliary high-voltage power supply lead through a via hole to form a high-voltage power supply lead of an SD1-SD3 parallel structure to reduce the resistance of the high-voltage power supply lead.

In an exemplary embodiment, since multiple dummy lines of the display region are connected to the high-voltage power supply leads of the bezel region, the display region may not be provided with a thirty-third via hole, i.e., the dummy lines are not connected to the first power supply lines in the display region.

The present disclosure further provides a preparation method for a display substrate, for preparing the display substrate according to the foregoing embodiments. In an exemplary embodiment, the display substrate includes a display region and a bonding region on one side of the display region, the display region at least includes a first wiring region and a second wiring region, wherein the first wiring region is provided with at least one first wiring and at least one light emitting device, the second wiring region is provided with at least one second wiring and at least one light emitting device, and the light emitting device at least includes an anode. A first terminal of the first wiring is connected with a bonding lead line of the bonding region, a second terminal of the first wiring is connected with a first terminal of the second wiring after extending along a second direction, and a second terminal of the second wiring is connected with the data signal line of the display region after extending along a first direction, wherein the first direction crosses the second direction; the preparation method may include:

forming at least one first compensation line extending along the first direction in the first wiring region, and/or, forming at least one second compensation line extending along the second direction in the second wiring region; and forming the anode in the first wiring region and the second wiring region, an orthographic projection of at least one anode in the plane of the display substrate at least partially overlaps with an orthographic projection of the first compensation line in the plane of the display substrate, and/or, an orthographic projection of at least one anode in the plane of the display substrate at least partially overlaps with an orthographic projection of the second compensation line in the plane of the display substrate.

The present disclosure further provides a display apparatus which includes the aforementioned display substrate. The display apparatus may be any product or component with a display function, such as a mobile phone, a tablet computer, a television, a display, a laptop computer, a digital photo bezel, or a navigator, and the embodiments of the present invention are not limited thereto.

Although the implementations disclosed in the present disclosure are described as above, the described contents are only implementations which are used for facilitating the understanding of the present disclosure, and are not intended to limit the present invention. Any skilled person in the art to which the present disclosure pertains may make any modifications and variations in forms and details of implementation without departing from the spirit and scope of the present disclosure. However, the patent protection scope of the present invention should be subject to the scope defined by the appended claims.

The invention claimed is:

1. A display substrate, which comprises a display region having at least one data signal line and at least one anode, and a bonding region located on one side of the display region; wherein the display region at least comprises a first wiring region and a second wiring region;

the first wiring region comprises at least one first wiring;

the second wiring region comprises at least one second wiring;

the at least one first wiring and the at least one second wiring are connected to the at least one data signal line, a first terminal of the at least one first wiring is connected with a bonding lead line of the bonding region, a second terminal of the at least one first wiring is connected with a first terminal of the at least one second wiring after extending along a second direction, and a second terminal of the at least one second wiring is connected with the at least one data signal line after extending along a first direction; and in the first wiring region, an orthographic projection of the at least one first wiring in a plane of the display substrate at least partially overlaps an orthographic projection of the at least one anode in the plane of the display substrate.

2. The display substrate according to claim 1, wherein the at least one first wiring and the at least one second wiring are arranged at a same layer.

3. The display substrate according to claim 1, wherein the display substrate comprises a pixel drive circuit in which active layers of at least two transistors are of different materials.

4. The display substrate according to claim 3, wherein the pixel drive circuit comprises eight transistors and one storage capacitor, and the eight transistors comprise a low temperature polysilicon transistor.

5. The display substrate according to claim 3, wherein the pixel drive circuit comprises a first transistor, a second transistor, a third transistor, a fourth transistor, and a first node, and a first electrode of the third transistor is connected with the fourth transistor through the first node.

6. The display substrate according to claim 1, wherein the at least two transistors comprise a low temperature polysilicon transistor and a metal oxide transistor.

7. The display substrate according to claim 1, wherein the at least one anode comprises a green-pixel anode.

8. The display substrate according to claim 7, wherein the first wiring region comprises three adjacent first wirings among which two first wirings on both sides are symmetrical with respect to a middle first wiring, and an orthographic projection of the middle first wiring in the plane of the display substrate at least partially overlaps an orthographic projection of the green-pixel anode in the plane of the display substrate.

9. The display substrate according to claim 8, wherein the display region further comprises a first power supply line;

among the three adjacent first wirings, an orthographic projection of the two first wirings on both sides in the plane of the display substrate at least partially overlaps an orthographic projection of the first power supply line in the plane of the display substrate; and the two first wirings and the first power supply line are arranged at different layers.

10. The display substrate according to claim 9, wherein the first power supply line is a polyline with unequal width.

11. The display substrate according to claim 7, wherein the first wiring region comprises at least one first compensation line, and an orthographic projection of the at least one first compensation line in the plane of the display substrate does not overlap an orthographic projection of the green-pixel anode in the plane of the display substrate.

12. The display substrate according to claim 11, wherein the second wiring region comprises at least one second compensation line, and potentials of the at least one first wiring and the at least one second compensation line are different.

13. The display substrate according to claim 12, wherein the second wiring region comprises at least one dummy line, the at least one dummy line is provided on the at least one second compensation line and connected to the at least one second compensation line, the at least one dummy line is vertical, and the orthographic projection of the at least one anode in the plane of the display substrate overlaps at least partially with an orthographic projection of the at least one dummy line in the plane of the display substrate.

14. The display substrate according to claim 13, wherein the first direction crosses the second direction; and the at least one first compensation line extends along the first direction, and the at least one second compensation line extends along the second direction.

15. The display substrate according to claim 14, wherein in the first wiring region, the orthographic projection of the at least one anode in the plane of the display substrate overlaps at least partially with an orthographic projection of a1 first wirings in the plane of the display substrate, in the second wiring region, the orthographic projection of the at least one anode in the plane of the display substrate overlaps at least partially with an orthographic projection of a2 second compensation lines in the plane of the display substrate, wherein a1=a2, a1 is a number of the first wirings, a2 is a number of the second compensation lines.

16. The display substrate according to claim 14, wherein the at least one dummy line extends along the first direction and located between adjacent second wirings.

17. The display substrate according to claim 16, wherein in the first wiring region, the orthographic projection of the at least one anode in the plane of the display substrate overlaps at least partially with an orthographic projection of b1 first compensation lines in the plane of the display substrate, in the second wiring region, the orthographic projection of the at least one anode in the plane of the display substrate overlaps at least partially with an orthographic projection of b2 second dummy lines in the plane of the display substrate, wherein b1=b2, b1 is a number of the first compensation lines, b2 is a number of the second dummy lines.

18. The display substrate according to claim 7, wherein the at least one first wiring whose orthographic projection in the plane of the display substrate overlaps an orthographic projection of the green-pixel anode in the plane of the display substrate passes through an anode body part of the green-pixel anode which is a light-emitting part.

19. The display substrate according to claim 1, wherein the first wiring region comprises at least one first compensation line, the at least one anode comprises a blue-pixel anode, the at least one first compensation line comprises two first compensation line transversely connected to the at least one first wiring, and in the first wiring region, an orthographic projection of the blue-pixel anode in the plane of the display substrate at least partially overlaps an orthographic projection of the two first compensation line in the plane of the display substrate.

20. A display apparatus, comprising the display substrate according to claim 1.

* * * * *